(12) United States Patent
Takahashi et al.

(10) Patent No.: US 9,614,258 B2
(45) Date of Patent: Apr. 4, 2017

(54) POWER STORAGE DEVICE AND POWER STORAGE SYSTEM

(71) Applicant: SEMICONDUCTOR ENERGY LABORATORY CO., LTD., Atsugi-shi, Kanagawa-ken (JP)

(72) Inventors: Minoru Takahashi, Nagano (JP); Kei Takahashi, Kanagawa (JP); Jun Koyama, Kanagawa (JP); Junpei Momo, Kanagawa (JP); Tamae Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 440 days.

(21) Appl. No.: 14/107,347

(22) Filed: Dec. 16, 2013

(65) Prior Publication Data

US 2014/0184165 A1  Jul. 3, 2014

(30) Foreign Application Priority Data

Dec. 28, 2012  (JP) ................................. 2012-288513

(51) Int. Cl.
  *H02J 7/00*  (2006.01)
  *H01M 10/48*  (2006.01)
  *G01R 31/36*  (2006.01)

(52) U.S. Cl.
  CPC ......... *H01M 10/48* (2013.01); *H01M 10/486* (2013.01); *G01R 31/3606* (2013.01)

(58) Field of Classification Search
  CPC .. G01R 31/3606; H01M 10/48; H01M 10/486
  (Continued)

(56) References Cited

U.S. PATENT DOCUMENTS

| | | | |
|---|---|---|---|
| 5,701,068 A | | 12/1997 | Baer et al. |
| 6,274,950 B1 * | | 8/2001 | Gottlieb ............. G01R 31/3648 307/66 |

(Continued)

FOREIGN PATENT DOCUMENTS

| | | | |
|---|---|---|---|
| JP | 2003-017138 A | | 1/2003 |
| JP | 2003-297437 A | | 10/2003 |
| JP | 2009-295514 A | | 12/2009 |

OTHER PUBLICATIONS

International Search Report (Application No. PCT/JP2013/085019) Dated Feb. 4, 2014.

(Continued)

*Primary Examiner* — Nathaniel Pelton
(74) *Attorney, Agent, or Firm* — Nixon Peabody LLP; Jeffrey L. Costellia

(57) ABSTRACT

To provide a power storage device, an operation condition of which is easily analyzed. A secondary battery includes a sensor that is a measurement unit, a microcontroller unit that is a determination unit, and a memory that is a memory unit. With the sensor, conditions of the secondary battery such as the remaining battery power, the voltage, the current, and the temperature are measured. The microcontroller unit performs arithmetic processing of the measurement results and determines the operation condition of the secondary battery. Further, the microcontroller unit stores the measurement result in the memory in accordance with the operation condition of the secondary battery.

8 Claims, 24 Drawing Sheets

(58) Field of Classification Search
USPC .................................... 320/134; 429/90, 91
See application file for complete search history.

(56) References Cited

U.S. PATENT DOCUMENTS

| | | | |
|---|---|---|---|
| 6,948,078 B2 | 9/2005 | Odaohhara | |
| 7,299,373 B2* | 11/2007 | Wulff | G06F 1/1613 320/112 |
| 8,492,758 B2 | 7/2013 | Yamazaki et al. | |
| 2004/0263117 A1* | 12/2004 | Kogan | G06F 1/1613 320/114 |
| 2011/0101351 A1 | 5/2011 | Yamazaki | |
| 2011/0216569 A1* | 9/2011 | Akiyama | G11C 15/00 365/49.17 |
| 2012/0314513 A1* | 12/2012 | Kurokawa | G11C 7/1006 365/189.07 |
| 2013/0295419 A1 | 11/2013 | Kwon et al. | |
| 2013/0299827 A1 | 11/2013 | Yamazaki et al. | |
| 2013/0335035 A1* | 12/2013 | Thompson | H02J 7/042 320/162 |

OTHER PUBLICATIONS

Written Opinion (Application No. PCT/JP2013/085019) Dated Feb. 4, 2014.
Taiwanese Office Action (Application No. 102146660) Dated Feb. 10, 2017.

* cited by examiner

POWER STORAGE DEVICE AND POWER STORAGE SYSTEM

TECHNICAL FIELD

One embodiment of the present invention relates to an object (a product including a machine, a manufacture, and a composition of matter) and a method (a process including a simple method and a production method). In particular, one embodiment of the present invention relates to a power storage system, a power storage device, a semiconductor device, or other electric devices and a driving method thereof or a manufacturing method thereof.

Note that the power storage device indicates all elements and devices which have a function of storing power. In this specification, a semiconductor device means all types of devices that can function by utilizing semiconductor characteristics, and a transistor, a semiconductor circuit, a memory device, an imaging device, a display device, an electro-optical device, an electronic device, and the like are all semiconductor devices. Further, a power storage device can also function as a semiconductor device.

BACKGROUND ART

In recent years, the development of power storage devices such as a lithium-ion secondary battery and a lithium-ion capacitor has been conducted.

With the development of power storage devices, as a positive electrode active material of lithium-ion secondary batteries, a material which can supply lithium stably has been developed.

For example, as a lithium supply source, a compound containing lithium (Li) and cobalt (Co), such as lithium cobalt oxide ($LiCoO_2$), is known (see Patent Document 1).

REFERENCE

[Patent Document 1] Japanese Published Patent Application No. 2009-295514

DISCLOSURE OF INVENTION

For power storage devices, improvement in battery performance such as high capacity, long lifetime, or high reliability is required. In order to improve the battery performance, analysis of a usage environment and an operating condition of the power storage device is needed.

For example, when a power storage device is provided for an electronic device such as a mobile computer or a portable information terminal and supplies power thereto, an operating condition of the power storage device is stored, in some cases, in a memory unit included in the electronic device. In such a case, when the electronic device is broken or detached from the power storage device, there arises a problem in that information (data) of a usage environment and an operating condition which have been stored cannot be obtained with the power storage device alone.

An object of one embodiment of the present invention is to provide a power storage device or the like, an operating condition of which is easily analyzed.

Another object of one embodiment of the present invention is to provide a novel power storage device or the like.

Another object of one embodiment of the present invention is to provide a power storage device or the like, which hardly explodes.

Another object of one embodiment of the present invention is to provide a power storage device or the like, which hardly ignites.

Another object of one embodiment of the present invention is to provide a power storage device or the like, which hardly deteriorates.

Another object of one embodiment of the present invention is to provide a power storage system or the like, an operating condition of which is easily analyzed.

Another object of one embodiment of the present invention is to provide a novel power storage system or the like.

In particular, one embodiment of the present invention can achieve at least one of the objects set forth above, in some cases. Note that in one embodiment of the present invention, there is no need to achieve all the objects. Objects other than the above objects will be apparent from and can be derived from the description of the specification, the drawings, the claims, and the like.

A secondary battery is provided with a sensor which is a measurement unit, a microcontroller unit (hereinafter, referred to as MCU (micro controller unit)) which is a determination unit, and a memory which is a memory unit. With the sensor, conditions of the secondary battery, such as the remaining battery power, voltage, current, and temperature, are measured. The MCU performs arithmetic processing of the measurement results and determines an operating condition (hereinafter, referred to as operation mode) of the secondary battery. The MCU stores the measurement results in the memory in accordance with the operating condition of the secondary battery. Examples of the sensors include a temperature sensor which measures the temperature of the secondary battery, a voltage sensor which measures the voltage of the secondary battery, and a coulomb counter which measures the amount of accumulated charge of the secondary battery.

Further, the MCU performs arithmetic processing of information (data) obtained from the sensor every predetermined period and determines an operation mode where the secondary battery operates. The memory includes a plurality of memory regions corresponding to operation modes and stores data obtained from the sensor in the memory region corresponding to an operation mode which is determined by the MCU. Note that there is a case where data is not stored depending on the operation mode.

As the memory, a memory which can hold data even when power is not supplied (hereinafter, the memory is referred to as nonvolatile memory) is preferably used. With use of the nonvolatile memory, the stored data can be read even when the secondary battery cannot operate normally. In addition, the nonvolatile memory preferably includes a memory element using an oxide semiconductor. A memory element using an oxide semiconductor can hold the stored data even under an environment at 100° C. to 200° C.

The MCU includes a volatile memory unit and a nonvolatile memory unit. A volatile memory unit includes one or more of volatile memory elements. A nonvolatile memory unit includes one or more of nonvolatile memory elements. The nonvolatile memory element has a longer data retention time than at least the volatile memory element to which power is not supplied. With use of the MCU including the nonvolatile memory unit, an intermittent operation in which operation and suspension are repeatedly performed at regular intervals can be easily achieved. Further, the nonvolatile memory unit preferably includes a memory element using an oxide semiconductor. When the memory element using an oxide semiconductor is used for the nonvolatile memory unit, power consumption of the MCU can be reduced. Note that at least part of the nonvolatile memory unit of the MCU can be used as the memory.

One embodiment of the present invention includes a secondary battery, a sensor, an MCU, and a memory including an oxide semiconductor. The MCU is connected to the secondary battery via the sensor, and the memory is connected to the MCU.

One embodiment of the present invention includes a secondary battery, a sensor, and an MCU, the MCU is connected to the secondary battery via the sensor, and the MCU includes a memory using an oxide semiconductor.

One embodiment of the present invention includes a secondary battery having a plurality of operation conditions, a measurement unit configured to measure a remaining battery power, voltage, and current of the secondary battery, a determination unit configured to determine an operation condition of the secondary battery, and a memory unit including a memory region corresponding to the operation condition of the secondary battery; and the data can be stored in the memory region corresponding to the operation condition.

One embodiment of the present invention includes a secondary battery having a plurality of operation conditions, a measurement unit configured to measure a condition of the secondary battery, a determination unit configured to determine an operation condition of the secondary battery, and a memory unit including a memory region corresponding to the operation condition. The determination unit determines the operation condition on the basis of data from the measurement unit, and data of start time of the operation condition and data of ending time of the operation condition are stored in the memory region corresponding to the operation condition.

According to one embodiment of the present invention, a power storage device an operation condition of which is easily analyzed can be provided.

According to one embodiment of the present invention, a novel power storage device can be provided.

BEST MODE FOR CARRYING OUT THE INVENTION

Figure 1A:
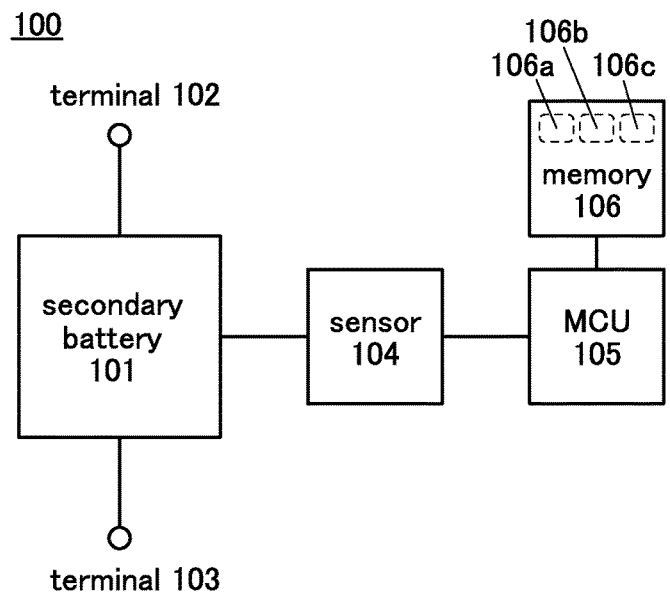
FIGS. 1A and 1B are each a block diagram illustrating an example of a structure of a power storage device.

Hereinafter, embodiments of the present invention will be described with reference to the accompanying drawings. However, the present invention is not limited to the description below, and it is easily understood by those skilled in the art that modes and details disclosed herein can be modified in various ways without departing from the spirit and the scope of the present invention. Therefore, one embodiment of the present invention is not interpreted as being limited to the description of the embodiments described below.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that ordinal numbers such as "first" and "second" in this specification and the like are used for convenience and do not denote the order of steps or the stacking order of layers. In addition, the ordinal numbers in this specification do not denote particular names which specify the present invention.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that an explicit description "X and Y are connected" indicates the case where X and Y are electrically connected, the case where X and Y are connected in terms of the function, the case where X and Y are directly connected, or the like. Here, each of X and Y denotes an object (e.g., a device, an element, a circuit, a wiring, an electrode, a terminal, a conductive layer, or an insulating layer). Accordingly, a connection relation other than connection relations illustrated in drawings and texts is also included, without limitation to a predetermined connection relation, for example, the connection relations illustrated in the drawings and the texts Note that a connection in this specification and the like includes an electrical connection, a functional connection, and a direct connection. A connection relation of components shown in one embodiment is not limited to the connection relation illustrated in the drawings and the specification.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, even when such portions are not specified, one aspect of the present invention can be clear and it can be determined that one aspect of the present invention is disclosed in this specification and the like in some cases. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one aspect of the present invention can be clear and it can be determined that one aspect of the present invention is disclosed in this specification and the like in some cases. Alternatively, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, a positive electrode and a negative electrode for a secondary battery may be collectively referred to as an electrode; the electrode in this case refers to at least one of the positive electrode and the negative electrode.

In the circuit symbols in this specification, in some cases, a transistor including an oxide semiconductor in a semiconductor layer where a channel is formed is denoted by a circuit symbol "OS" so that it can be clearly identified as a transistor including an oxide semiconductor in a semiconductor layer where a channel is formed.

In this specification, the term "parallel" indicates that the angle between two straight lines is greater than or equal to −10° and less than or equal to 10°, and accordingly includes the case where the angle is greater than or equal to −5° and less than or equal to 5°. In addition, a term "perpendicular" or "vertical" indicates that the angle formed between two straight lines is greater than or equal to 80° and less than or equal to 100°, and accordingly includes the case where the angle is greater than or equal to 85° and less than or equal to 95°.

The invention excluding content that is not specified in the drawings and texts in this specification can be constructed. Alternatively, when the range of a value (e.g., the maximum and minimum values) is described, part of the range is arbitrarily shortened and part of the range is removed, whereby an invention can be specified by a range part of which is removed from the number range. In this manner, it is possible to specify the scope of the present invention so that a conventional technology is excluded, for example.

The descriptions in an embodiment for implementing the invention can be combined with each other as appropriate.

<<1. Power Storage Device>>

[1-1. Structure Example of Power Storage Device 100]

FIG. 1A is a block diagram illustrating a structure example of a power storage device 100. The power storage device 100 in FIG. 1A includes a secondary battery 101 connected to a terminal 102 and a terminal 103, a sensor 104, an MCU 105, and a memory 106.

Charging of the secondary battery 101 and power supply (discharge) from the secondary battery 101 to the load not shown are performed via the terminal 102 and the terminal 103. The sensor 104 which examines a condition of the secondary battery 101 is connected to the secondary battery 101. The MCU 105 is connected to the sensor 104. The MCU 105 performs arithmetic processing of data obtained from the sensor 104 and determines an operation mode of the secondary battery 101.

The memory 106 includes one or a plurality of memory regions. In FIG. 1A, as a plurality of memory regions, a memory region 106a, a memory region 106b, and a memory region 106c are illustrated. The MCU 105 stores the data obtained from the sensor 104 into the memory regions in the memory 106. When a plurality of memory regions are provided in the memory 106, data can be stored in the memory region corresponding to the operation mode.

As the memory 106, a nonvolatile memory is preferably used. With the nonvolatile memory, the stored data can be held without power supply. Thus, even when the secondary battery cannot operate normally, the stored data can be read out. Further, the nonvolatile memory preferably includes a memory element using an oxide semiconductor.

The MCU 105 includes a volatile memory unit and a nonvolatile memory unit. With use of the MCU including the nonvolatile memory unit, an intermittent operation in which operation and suspension are performed at regular intervals can be easily achieved. The nonvolatile memory unit is preferably formed using a memory element using an oxide semiconductor. When the memory element using an oxide semiconductor is used for the nonvolatile memory unit, power consumption of the MCU can be reduced. Note that at least part of the nonvolatile memory unit of the MCU 105 can be used for the memory 106.

[1-2. Modification Example of Power Storage Device 100]

Figure 1B:
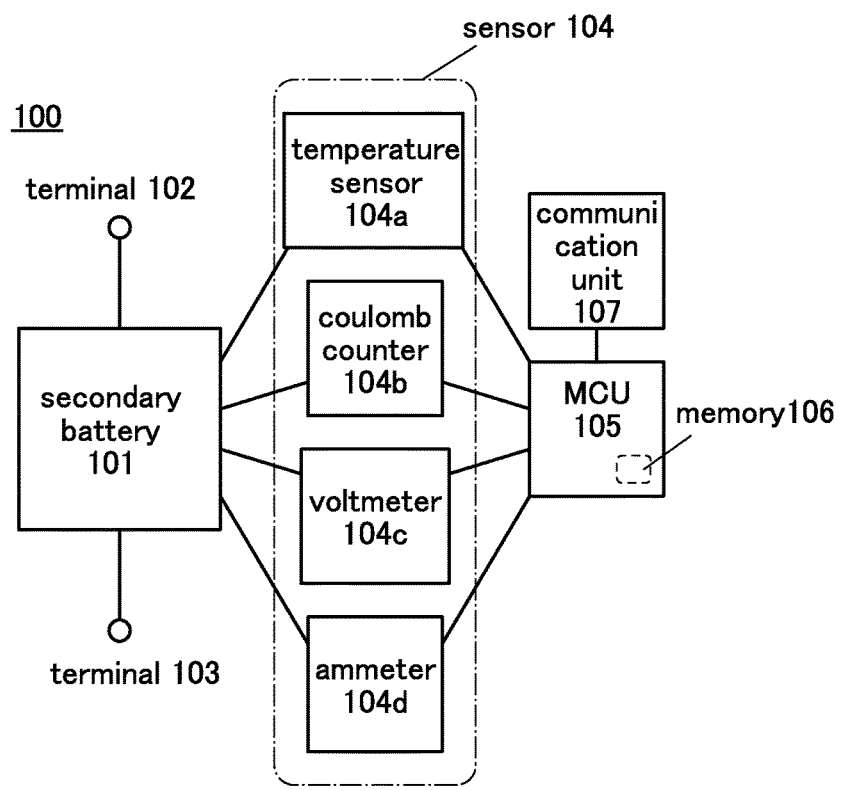

FIG. 1B illustrates a modification example of the power storage device 100. In the power storage device 100 illustrated in FIG. 1B, a temperature sensor 104a, a coulomb counter 104b, a voltmeter 104c, and an ammeter 104d are used as the sensor 104.

The power storage device 100 illustrated in FIG. 1B shows an example in which the memory 106 is provided in the MCU 105. In addition, in the power storage device 100 illustrated in FIG. 1B, a communication unit 107 connected to the MCU 105 is provided, and data can be transmitted and received to/from an external device (not shown) via the communication unit 107.

Data transmission and reception to/from the external device (not shown) via the communication unit 107 may be performed by wired communication using a communication standard such as 100BASE-TX, 1000BASE-TX, or power line communication (PLC) or by wireless communication using a communication standard such as IEEE802.11a, IEEE802.11b, IEEE802.11g, IEEE802.11n, or IEEE802.15.1.

To prevent unauthorized access during communication or malfunction due to interference, communicated information is preferably encrypted. As a standard for encrypting communications, an advanced encryption standard (AES), a temporal key integrity protocol (TKIP), a wired equivalent privacy (WEP) protocol, or the like can be used.

Note that power is supplied to the sensor 104, the MCU 105, the memory 106, and the communication unit 107 via the terminal 102 and the terminal 103. Thus, in the case where power is supplied from an external power supply to the terminal 102 and the terminal 103, the sensor 104, the MCU 105, the memory 106, and the communication unit 107 are supplied with power from the external power supply, and in the case where power is not supplied from the external power supply, power is supplied from the secondary battery 101.

Although the case where the memory 106 and the MCU 105 are provided is described with FIGS. 1A and 1B, one embodiment of the present invention is not limited thereto. A structure in which neither the memory 106 nor the MCU 105 are provided can be employed depending on conditions.

[1-3. Operation Mode of Power Storage Device 100]

Operation of the power storage device 100 is roughly classified into charge operation (charge mode 211) where charge is accumulated in the secondary battery 101, discharge operation (discharge mode 221) where power is supplied to the load connected to the secondary battery 101, and standby operation (standby mode 231) where neither the charge operation nor the discharge operation are performed.

Figure 2A:
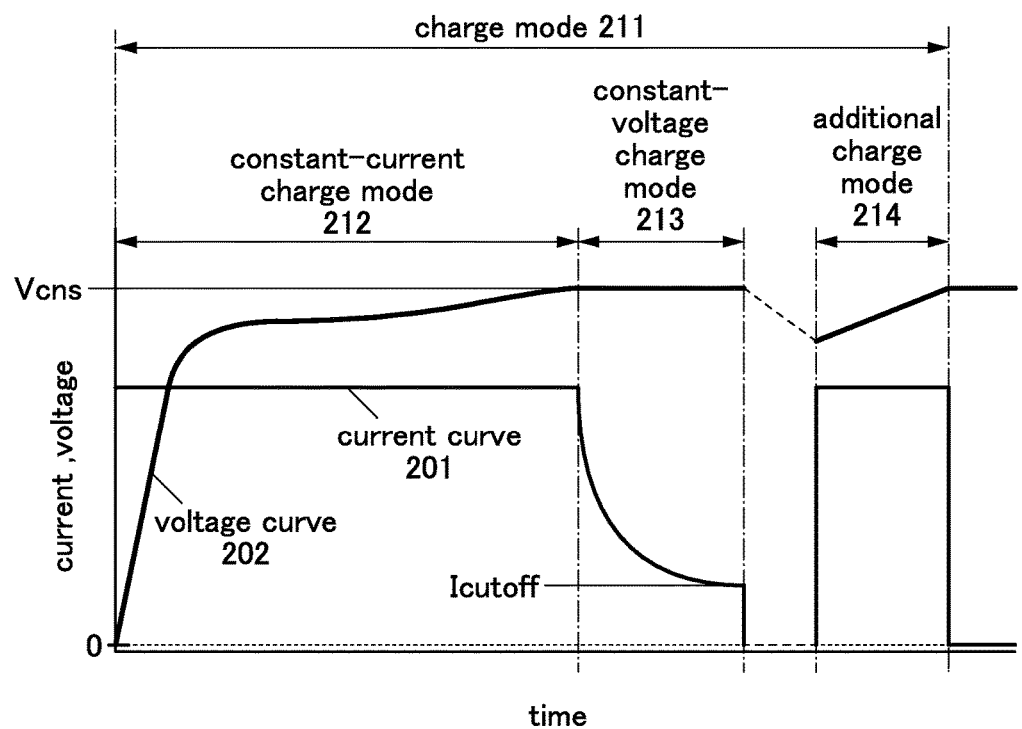
FIGS. 2A and 2B show operation modes of a secondary battery.
Figure 2B:
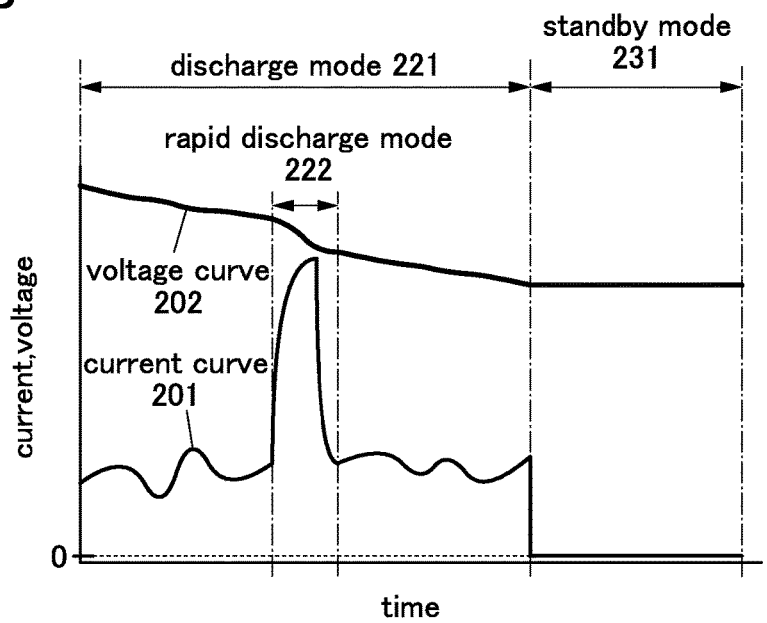

FIGS. 2A and 2B show an example of changes over time of current and voltage in the above modes of the secondary battery 101. FIG. 2A shows a change over time of current and voltage in the charge mode 211 of the secondary battery 101. FIG. 2B shows a change over time of current and voltage in the discharge mode 221 and the standby mode 231 of the secondary battery 101.

In FIGS. 2A and 2B, the horizontal axis represents time and the vertical axis represents the magnitude of current or voltage (absolute value). A current curve 201 indicates the magnitude of current changing over time. A voltage curve 202 indicates the magnitude of voltage changing over time.

Charge of the secondary battery 101 is performed in such a manner that power supplied from the external power supply is supplied to the secondary battery 101 via the terminal 102 and the terminal 103. As a charging method of the secondary battery 101, there are a constant-current charge mode 212 where a constant amount of current is supplied to the secondary battery 101 in charging (the current is a charging current) and a constant-voltage charge mode 213 where a constant level of voltage is supplied to the secondary battery 101 in charging (the voltage is a charging voltage). When charging is performed in the constant-voltage charge mode 213 particularly under a condition where the output voltage of the secondary battery 101 that is to be charged is low, a large amount of current is supplied rapidly to the secondary battery 101 and explosion or ignition of the secondary battery 101 might be caused. Thus, charging of the secondary battery 101 is preferably performed in the constant-current charge mode 212.

Further, the charge mode 211 can be classified into the constant-current charge mode 212, the constant-voltage charge mode 213, and an additional charge mode 214.

The charge operation in the constant-current charge mode 212 is described here. In the constant-current charge mode 212, power is supplied to the secondary battery 101 so that the charging current is constant. When charging starts, the internal resistance of the secondary battery 101 increases. Then, the charging voltage is increased so that a value of the charging current is constant. Charging by the constant-current charge mode 212 is performed until the charging voltage increases to a voltage Vcns that has been set in advance.

Next, the charging operation in the constant-voltage charge mode 213 is described. The secondary battery might deteriorate or be broken when the charging voltage extremely increases. Thus, after charging by the constant-current charge mode 212 is finished, power is supplied to the secondary battery 101 with the charging voltage set to the constant voltage Vcns. When charging is performed by the constant-voltage charge mode 213, the secondary battery 101 can be charged without an increase in the charging voltage.

Further, when charging is performed at a constant charging voltage, the internal resistance of the secondary battery 101 is increased, which leads to a reduction in the charging current. Charging by the constant-voltage charge mode 213 is performed until the charging current is reduced to a current Icutoff that has been set in advance.

Note that the additional charge mode 214 is the charge operation which is performed when the charging voltage is higher than or equal to 50% of the voltage Vcns so that the charging current is constant, which is similar to the charging current of the constant-current charge mode 212.

The discharge mode 221 is the operation where the secondary battery 101 supplies power to the load connected to the secondary battery 101 via the terminal 102 and the terminal 103. The magnitude of current (output current) supplied from the secondary battery 101 to the load varies depending on the load. Further, the voltage output from the secondary battery 101 is reduced, which is accompanied by supply of power.

There is a case where the amount of output current is rapidly increased due to breakdown of the load or short-circuit of the terminal 102 and the terminal 103. By the radical discharge, the secondary battery 101 is likely to deteriorate, and a reduction in charge capacity of the secondary battery 101 and a reduction in lifetime of the battery may be caused. The discharge mode where the amount of output current is large is referred to as a rapid discharge mode 222.

In addition, a state where power is not supplied to/from the secondary battery 101 except the case where the voltage is reduced due to self-discharge is referred to as the standby mode.

[1-4. Operation Example of Power Storage Device 100]

The operation condition of the secondary battery 101 can be monitored constantly by the sensor 104 and the MCU 105. For example, the temperature of the secondary battery 101 can be measured by the temperature sensor 104a. Further, the charge and discharge voltage of the secondary battery 101 can be measured by the voltmeter 104c. Further, the charge and discharge current of the secondary battery 101 can be measured by the ammeter 104*d*.

The coulomb counter 104*b* converts current flowing between the secondary battery 101 and the terminal 102 or 103 into the voltage with a sense resistor and calculates, from the voltage, the amount of charge flowing in the sense resistor. In accordance with the measurement results of the coulomb counter 104*b*, the amount of accumulated charge (remaining battery power) in the secondary battery 101 can be estimated. Further, on the basis of a change in the remaining battery power per predetermined time, the current value can be calculated. Thus, a structure in which the ammeter 104*d* is not provided and the coulomb counter 104*b* is used as an ammeter can be employed.

In order to respond to the rapid discharge mode, the measurement cycles of the sensor 104 and the MCU 105 are set to 1 ms or less, preferably 100 us or less.

In the charge mode 211, the remaining battery power, a change in voltage, and a change in temperature of the secondary battery 101 are measured, whereby the condition of the secondary battery 101 can be estimated. Further, when power exceeding the rated current is supplied in the discharge mode 221, deterioration in battery characteristics or battery life is likely to occur.

The temperature of the secondary battery 101 is monitored by the sensor 104 and the MCU 105 and stores the temperature data in the memory region 106*c* of the memory 106, for example, at the time when the temperature of the secondary battery 101 is higher than or equal to the given temperature.

In particular, the temperature of the secondary battery 101 in the standby mode 231 or the normal discharge mode (discharge mode 221 except the rapid discharge mode 222) is stored, whereby the storage temperature or operating temperature of the secondary battery 101 can be estimated later. Further, the monitoring of the temperature of the secondary battery 101 makes it possible to prevent an accident such as ignition from occurring.

Further, at least in the constant-current charge mode 212, the constant-voltage charge mode 213, and the rapid discharge mode 222, the battery data which indicates the condition of the secondary battery 101 at a start time of each mode and an ending time of the corresponding mode, such as the remaining battery power, the voltage, the current, and the temperature, are stored in the memory 106. In addition, the time period from the start to end of each mode and the maximum value of current flowing during the rapid discharge mode 222 are stored. The memory 106 stores at least the above data, whereby the failure analysis of the secondary battery 101 can be efficiently performed.

As an operation example of the power storage device 100 of one embodiment of the present invention, the following operation is described: the MCU 105 determines the operation mode in accordance with data obtained from the sensor 104 and the data obtained from the sensor 104 is stored in the memory region provided in the memory 106.

With flow charts shown in FIGS. 3A and 3B, FIG. 4, and FIG. 5, an operation example in which the operation record of the charge mode 211 is stored in the memory region 106*a* and the operation record of the discharge mode 221 is stored in the memory region 106*b* is described below. Specifically, the operation example described here includes the following operations: an operation where in the constant-current charge mode 212 and the constant-voltage charge mode 213, battery data at a start time of each mode and an ending time of the corresponding mode, and a time period from the start to end of each mode are stored in the memory region 106*a* of the memory 106; and an operation where battery data at a start time of the rapid discharge mode 222 and at an ending time thereof, a time period from the start to end of the rapid discharge mode 222, and a maximum current value during the rapid discharge mode 222 are stored in the memory region 106*b* of the memory 106.

In the case shown here, the value of the mode flag when the mode is determined as the constant-current charge mode is set to 1, the value of the mode flag when the mode is determined as the constant-voltage discharge mode is set to 2, the value of the mode flag when the mode is determined as the rapid discharge mode is set to 3, and the value of the mode flag other than the above modes is set to 0.

[1-4-1. Determination of Constant-Current Charge Mode and Operation of Storing Battery Data]

Determination of the constant-current charge mode 212 by the MCU 105 and an operation of storing battery data are described. First, a value of a mode flag which is set in the MCU 105 to determine the operation mode is set to 0 (step S301; see FIG. 3A).

Next, on the basis of the result measured by the coulomb counter 104*b*, the MCU 105 determines whether the amount of remaining battery power in the secondary battery 101 is larger than that at the previous measurement time (step S302).

In the case where the amount of remaining battery power is larger than that at the previous measurement time, whether the voltage is higher than that at the previous measurement time is determined (step S303).

Figure 4:
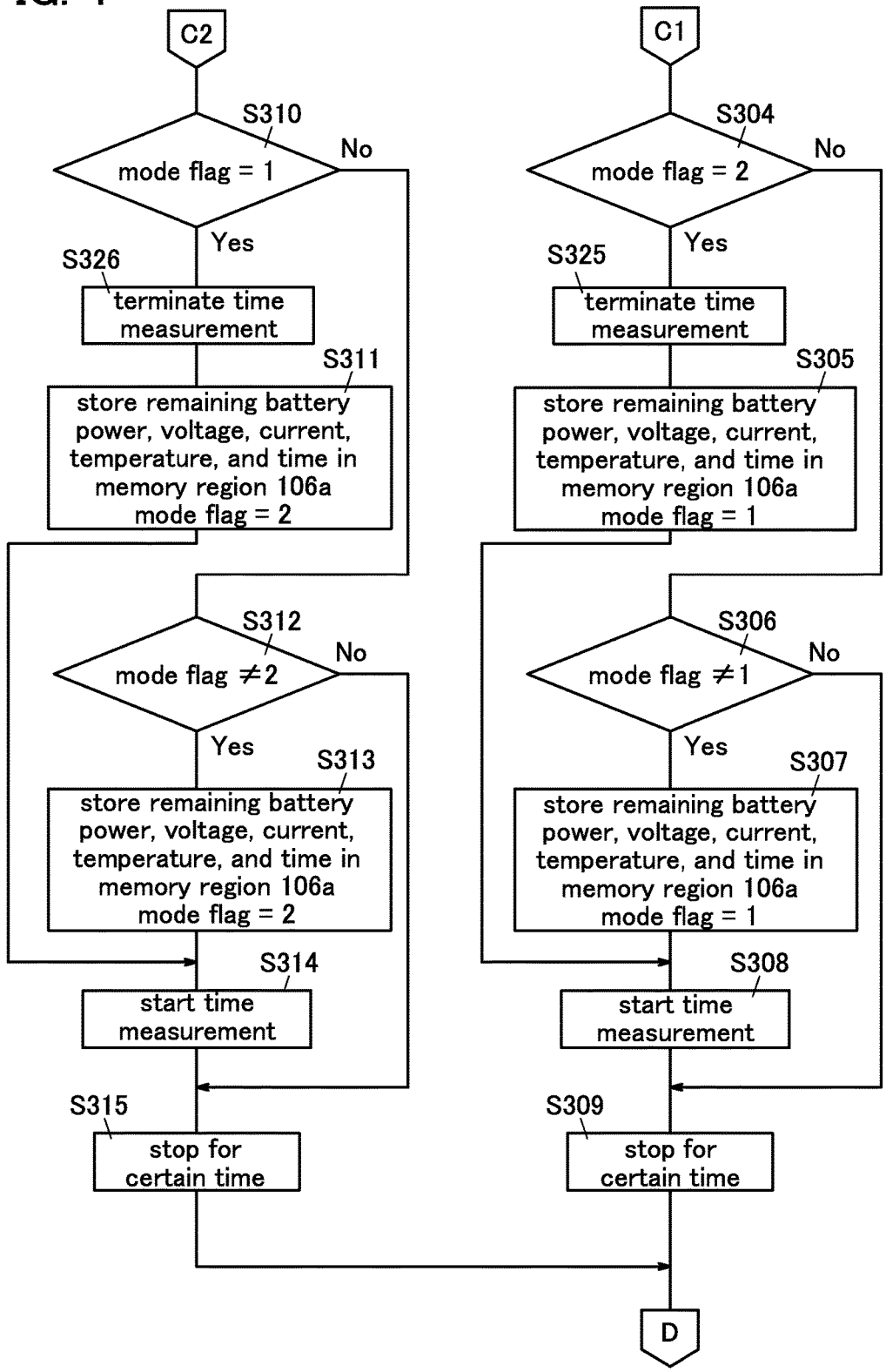
FIG. 4 is a flow chart showing an operation example of a power storage device.

In the case where the voltage is higher than that at the previous measurement time, whether the mode flag is 2 or not is checked (step S304; see FIG. 4). In the case where the mode flag is not 2, it is checked that the mode flag is not 1 (step S306). In the case where the mode flag is not 1, it is recognized that the operation mode switches into the constant-current charge mode 212, and the battery data such as the remaining battery power, the voltage, the current, and the temperature are stored in the memory region 106*a* of the memory 106. In addition, the mode flag value is set to 1 (step S307).

Next, time measurement starts (step S308). Then, the measurement operation is stopped for a certain period. The period of time for stopping measurement operation (suspension time) may be determined in accordance with a storage capacity of the memory 106. The suspension time here is set to 1 minute (step S309).

Figure 3A:
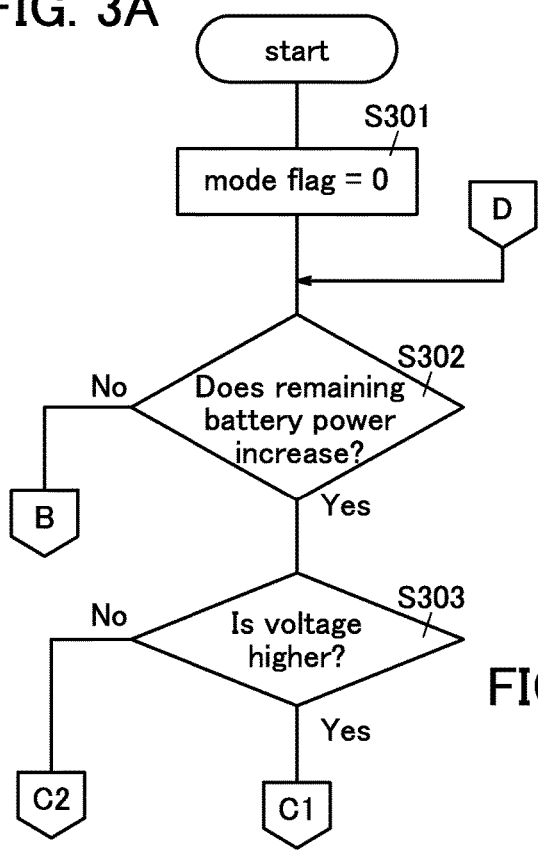
FIGS. 3A and 3B are flow charts showing operation examples of a power storage device.
Figure 3B:
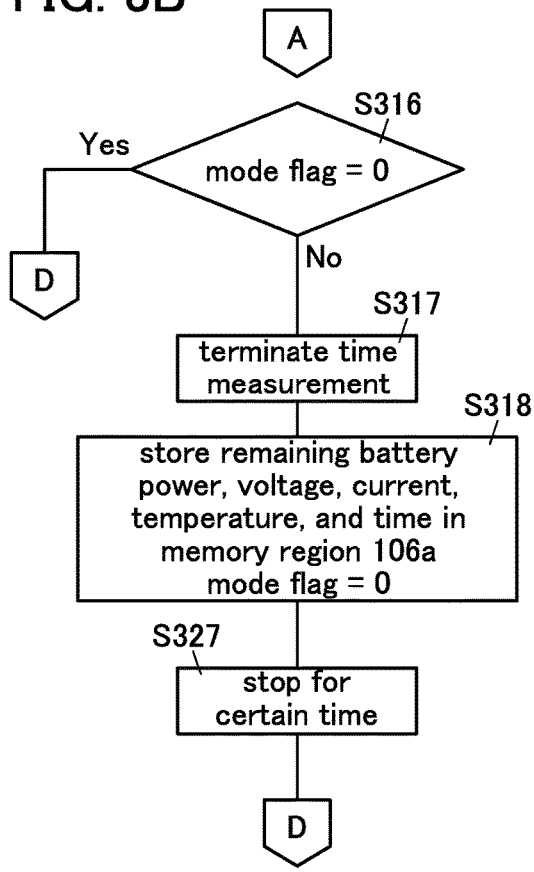

After the operation is stopped for a certain period, the operation returns to the step S302, and whether the amount of remaining battery power of the secondary battery 101 is larger than that at the previous measurement time is determined (see FIG. 3A).

In the case where the amount of remaining battery power is larger than that at the previous measurement time, whether the voltage is higher than that at the previous measurement time is determined (step S303). In the case where the voltage is higher than that at the previous measurement time, whether the mode flag is 2 or not is checked (step S304; see FIG. 4). In the case where the mode flag is not 2, it is checked that the mode flag is not 1 (step S306).

In the case where the mode flag is 1, the step S307 and the step S308 are not performed, and the measurement operation is stopped for a certain period (step S309).

After the measurement operation is stopped for a certain period, the operation returns to the step S302 again, and whether the amount of remaining battery power of the secondary battery 101 is larger than that at the previous time is determined (see FIG. 3A).

When charging is terminated, the amount of remaining battery power of the secondary battery 101 does not increase. In the case where the amount of remaining battery power of the secondary battery 101 does not increase, whether the amount of remaining battery power is decreased is determined (step S319; see FIG. 5). In the case where the amount of remaining battery power does not decrease, whether the mode flag is 0 or not is checked (step S316; see FIG. 3B). In the case where the mode flag is not 0, the time measurement is terminated (step S317), and the battery data such as the remaining battery power, the voltage, the current, and the temperature and the elapsed time are stored in the memory region 106a of the memory 106 (step S318). Then, the measurement operation is stopped for a certain period (step S327), and the operation returns to the step S302 again.

As described above, the following data can be stored in the memory 106: the determination of the constant-current charge mode 212; the data at the start time of the constant-current charge mode 212 and the ending time thereof, such as the remaining battery power, the voltage, the current, and the temperature; and a time period from the start to end of the constant-current charge mode 212.

[1-4-2. Determination of Constant-Voltage Charge Mode and Operation of Storing Battery Data]

Next, determination of the constant-voltage charge mode 213 by the MCU 105 and the operation of storing battery data are described. First, a value of the mode flag is set to 0 (step S301; see FIG. 3A).

Next, on the basis of the result measured by the coulomb counter 104b, the MCU 105 determines whether the amount of remaining battery power of the secondary battery 101 is larger than that at the previous measurement time (step S302).

In the case where the amount of remaining battery power is larger than that at the previous measurement time, whether the voltage is higher than that at the previous measurement time is determined (step S303).

In the case where the voltage is not higher than that at the previous measurement time, whether the mode flag is 1 or not is checked (step S310; see FIG. 4). In the case where the mode flag is not 1, it is checked that the mode flag is not 2 (step S312). In the case where the mode flag is not 2, it is determined that the operation mode switches to the constant-voltage charge mode 213, and the battery data such as the remaining battery power, the voltage, the current, and the temperature are stored in the memory region 106a of the memory 106. In addition, the mode flag value is set to 2 (step S313).

Next, time measurement starts (step S314). Then, the measurement operation is stopped for a certain period (step S315).

After the suspension of the measurement, the operation returns to the step S302 again, and whether the amount of remaining battery power of the secondary battery 101 is larger than that at the previous measurement time is determined (see FIG. 3A).

In the case where the amount of remaining battery power is larger than that at the previous measurement time, whether the voltage is higher than that at the previous measurement time is determined (step S303). In the case where the voltage is not higher than that at the previous measurement time, whether the mode flag is 1 or not is checked (step S310; see FIG. 4). In the case where the mode flag is not 1, it is checked the mode flag is not 2 (step S312).

In the case where the mode flag is 2, the step S313 and the step S314 are not performed, and the operation of time measurement is stopped for a certain period (step S315).

After the suspension of the measurement, the operation returns to the step S302 again, and whether the amount of remaining battery power of the secondary battery 101 is larger than that at the previous measurement time is determined (see FIG. 3A).

When charging is terminated, the amount of remaining battery power of the secondary battery 101 does not increase. In the case where the remaining battery power does not increase, whether the remaining battery decreases or not is determined (step S319; see FIG. 5). In the case where the amount of remaining battery power does not decrease, whether the mode flag is 0 or not is checked (step S316; see FIG. 3B). In the case where the mode flag is not 0, the time measurement is terminated (step S317; see FIG. 3B), and the battery data such as the remaining battery power, the voltage, the current, and the temperature and the elapsed time are stored in the memory region 106a of the memory 106 (step S318). Then, the operation is stopped for a certain period (step S327), and the operation returns to the step S302.

As described above, the following data can be stored in the memory 106: determination of the constant-voltage charge mode 213; battery data at the start time of the constant-voltage charge mode 213 and the ending time thereof, such as the remaining battery power, the voltage, the current, and the temperature; and a time period from the start to end of the constant-voltage charge mode 213.

[1-4-3. Storage Operation at Switching from Constant-Current Charge Mode to Constant-Voltage Charge Mode]

Next, determination, by the MCU 105, of switching from the constant-current charge mode 212 to the constant-voltage charge mode 213 and an operation of storing battery data are described.

As a condition for this operation, it is determined by the MCU 105 that the secondary battery 101 operates in the constant-current charge mode 212. In other words, the battery data at the start time of the constant-current charge mode 212 has been stored, the time measurement has started, and the mode flag is 1.

After the step S309, the operation returns to the step S302 again, and whether the amount of remaining battery power of the secondary battery 101 is larger than that at the previous measurement time is determined (see FIG. 3A).

In the case where the amount of remaining battery power is larger than that at the previous measurement time, whether the voltage is higher than that at the previous measurement time is determined (step S303).

At this point, in the case where the operation mode of the secondary battery 101 switches into the constant-voltage charge mode 213, the voltage is not higher than that at the previous measurement time. Thus, the operation proceeds to the step S310, and whether the mode flag is 1 or not is checked (see FIG. 4).

Since the mode flag is 1, the time measurement is terminated (step S326), and the battery data such as the remaining battery power, the voltage, the current, and the temperature and a time period from the start to end of the constant-current charge mode 212 are stored in the memory region 106a of the memory 106 (step S311). In addition, the value of the mode flag is set to 2. The battery data stored in the step S311 is the battery data at the end of the constant-current charge mode 212, which is also the battery data at the start of the constant-voltage charge mode 213.

Next, time measurement restarts (step S314). The subsequent steps are the same as the determination of the constant-voltage charge mode 213 by the MCU 105 and the operation of storing the battery data; thus, description thereof is omitted.

Note that in FIG. 2A, the time measurement is once terminated at the time of switching from the constant-current charge mode 212 to the constant-voltage charge mode 213 in order to clarify the elapsed time of the constant-current charge mode 212. However, the elapsed time of each operation mode can be calculated under the condition where the time measurement is not terminated.

[1-4-4. Storage Operation at Switching from Constant-Voltage Charge Mode to Constant-Current Charge Mode]

Next, determination, by the MCU 105, of switching from the constant-voltage charge mode 213 to the constant-current charge mode 212 and the operation of storing battery data are described.

As a condition for this operation, it is determined by the MCU 105 that the secondary battery 101 operates in the constant-voltage charge mode 213. In other words, the battery data at the start of the constant-voltage charge mode 213 has been stored, the time measurement has started, and the mode flag is 2.

After the step S315, the operation returns to the step S302 again, and whether the amount of remaining battery power of the secondary battery 101 is larger than that at the previous measurement time is determined (see FIG. 3A).

In the case where the amount of remaining battery power is larger than that at the previous measurement time, whether the voltage is higher than that at the previous measurement time is determined as a next step (step S303).

At this point, in the case where the operation mode of the secondary battery 101 switches into the constant-current charge mode 212, the voltage is higher than that at the previous measurement time. Thus, the operation proceeds to the step S304, and whether the mode flag is 2 or not is checked (see FIG. 4).

Since the mode flag value is 2, the time measurement is terminated (step S325), and the battery data such as the remaining battery power, the voltage, the current, and the temperature and a time period from the start to end of the constant-voltage charge mode 213 are stored in the memory region 106a of the memory 106 (step S305). In addition, the value of the mode flag is set to 1. The battery data stored in the step S305 is the battery data at the end of the constant-voltage charge mode 213, which is also the battery data at the start of the constant-current charge mode 212.

Next, time measurement restarts (step S308). The subsequent operations are the same as the determination of the constant-current charge mode 212 by the MCU 105 and the operation of storing the battery data; thus, description thereof is omitted.

[1-4-5. Determination of Rapid Discharge Mode and Operation of Storing Battery Data]

Next, determination of the rapid discharge mode 222 by the MCU 105 and an operation of storing battery data are described. First, the value of the mode flag is set to 0 (step S301; see FIG. 3A).

Next, on the basis of the result measured by the coulomb counter 104b, the MCU 105 determines whether the amount of remaining battery power of the secondary battery 101 is larger than that at the previous measurement time (step S302).

Figure 5:
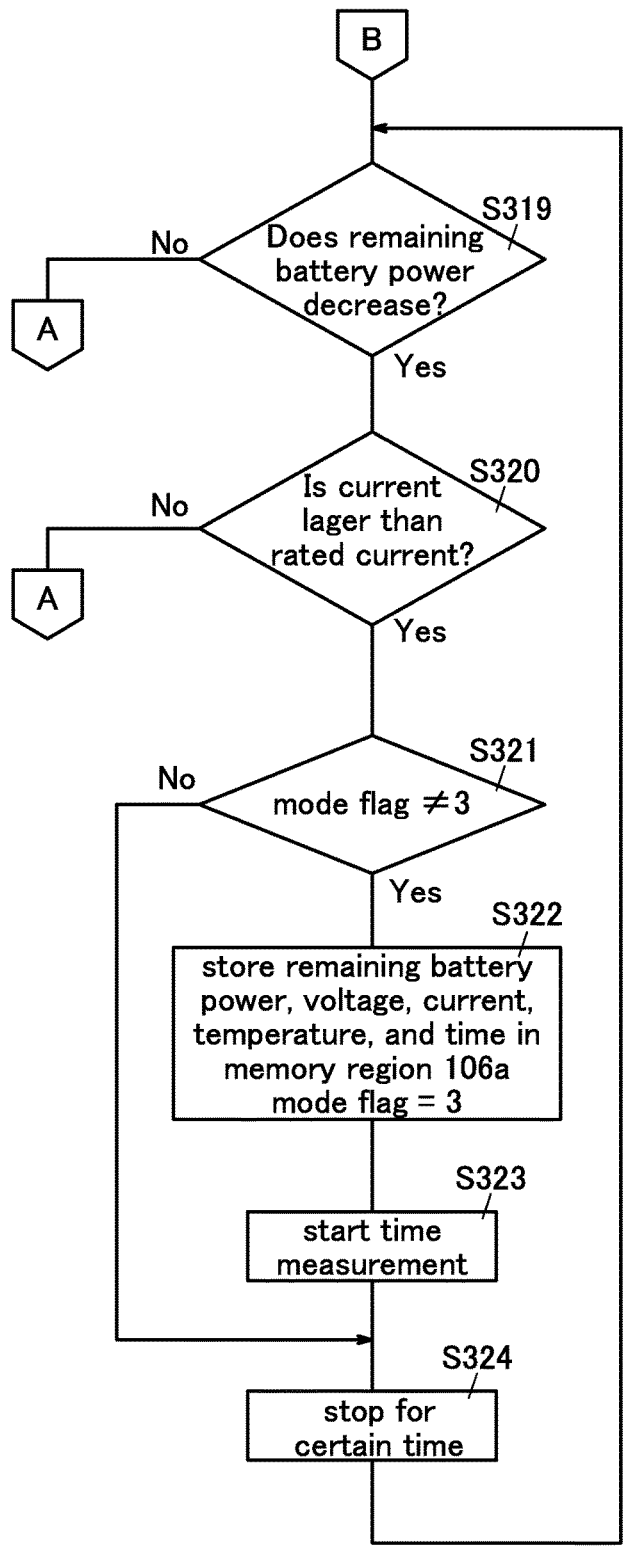
FIG. 5 is a flow chart showing an operation example of a power storage device.

In the case where the amount of remaining battery power is not larger than that at the previous measurement time, whether the amount of remaining battery power decreases or not (step S319; see FIG. 5).

In the case where the secondary battery 101 is in the discharge mode, the amount of remaining battery power of the secondary battery 101 is decreased. In the case where the amount of remaining battery power of the secondary battery 101 is decreased, whether the current value is larger than that of the rated current is determined (step S320).

In the case where the current value is larger than that of the rated current, it is checked that the value of the mode flag is not 3 (step S321).

At this point, in the case where the value of the mode flag is not 3, it is determined that the operation mode switches into the rapid discharge mode 222, and the battery data such as the remaining battery power, the voltage, the current, and the temperature are stored in the memory region 106b of the memory 106. In addition, the value of the mode flag is set to 3 (step S322).

Next, time measurement starts (step S323). Then, the measurement operation is stopped for a certain time (suspension time) (step S324). This suspension time may be set to about one-tenth to half of the estimated time of rapid discharge. The time period of rapid discharge in many cases is 1 to several microseconds, and the suspension time is set to 100 μs.

After the suspension of the measurement, the operation returns to the step S319 again, and whether the amount of remaining battery power of the secondary battery 101 is smaller than that at the previous measurement time is checked. Note that the operation may return to not the step S319 but the step S302.

In the case where in the step S319, the amount of remaining battery power is smaller than that at the previous measurement time, whether the current value is larger than that of the rated current is determined in the step S320.

In the case where the current value is larger than the rated current, whether the value of the mode flag is 3 or not is checked (step S321). At this point, in the case where the value of the mode flag is 3, the step S322 and the step S323 are not performed, and the measurement operation is stopped again for a certain time (step S324).

After the suspension of the measurement operation, the operation returns to the step S319, whether the amount of remaining battery power of the secondary battery 101 is smaller than that at the previous measurement time is determined. Note that the operation may return to not the step S319 but the step S302.

When the discharge operation is terminated, the amount of remaining battery power of the secondary battery 101 does not decrease. In the case where the amount of remaining battery power does not decrease, whether the value of the mode flag is 0 or not is checked (step S316; see FIG. 3B). Further, in the case where the current value is not larger than that of the rated current even though the amount of remaining battery power of the secondary battery 101 decreases, the operation proceeds to the step S316, and whether the value of the mode flag is 0 or not is checked.

In this case, the value of the mode flag is 3; thus, the time measurement is terminated (step S317), and the battery data such as the remaining battery power, the voltage, the current, the temperature, and the maximum value of current in the rapid discharge mode 222 and the elapsed time are stored in the memory region 106b of the memory 106 (step S327). In addition, the value of the mode flag is set to 0. Then, the operation returns to the step S302.

As described above, the following data can be stored in the memory 106: the determination of the rapid discharge mode 222; battery data at the start time to the ending time of the rapid discharge mode 222, such as the remaining battery power, the voltage, the current, and the temperature; another battery data of the maximum value of current flowing in the rapid discharge mode 222; and a time period from the start to end of the rapid discharge mode 222.

[1-4-6. Determination of Additional Charge Mode and Operation of Storing Battery Data]

Note that the additional charge mode 214 is included in the constant-current charge mode 212 and is performed when the charging voltage is higher than or equal to 50% of the voltage Vcns; thus, in the above operation example, the additional charge mode 214 is regarded as the constant-current charge mode 212, and accordingly the battery data and the like are stored.

[1-4-7. Determination of Normal Discharge Mode and Standby Mode and Operation of Storing Battery Data]

In the case of the normal discharge mode (discharge mode 221 except the rapid discharge mode 222), the value of the mode flag is 0. Although the amount of remaining battery power decreases, it is determined that the value of the mode flag is equal to 0 in the step S316; accordingly the operation of storing the battery data is not performed. The operation returns to the step S302.

In the case of the standby mode 231, the current larger than the rated current does not flow even when the battery capacity is reduced due to self-discharge; thus, the operation of storing the battery data is not performed.

Although in the above operation example, storing the battery data is not performed in the normal discharge mode and the standby mode 231, the battery data of the normal discharge mode and the standby mode 231 may be stored as needed.

Further, although in the above operation example, the memory region of the memory 106 where the battery data is stored differs depending on the operation mode, one embodiment of the present invention is not limited thereto, and the battery data and the like of different operation modes may be stored in the same memory region.

<<2. MCU>>

[2-1. Configuration Example of MCU 105]

Figure 6:
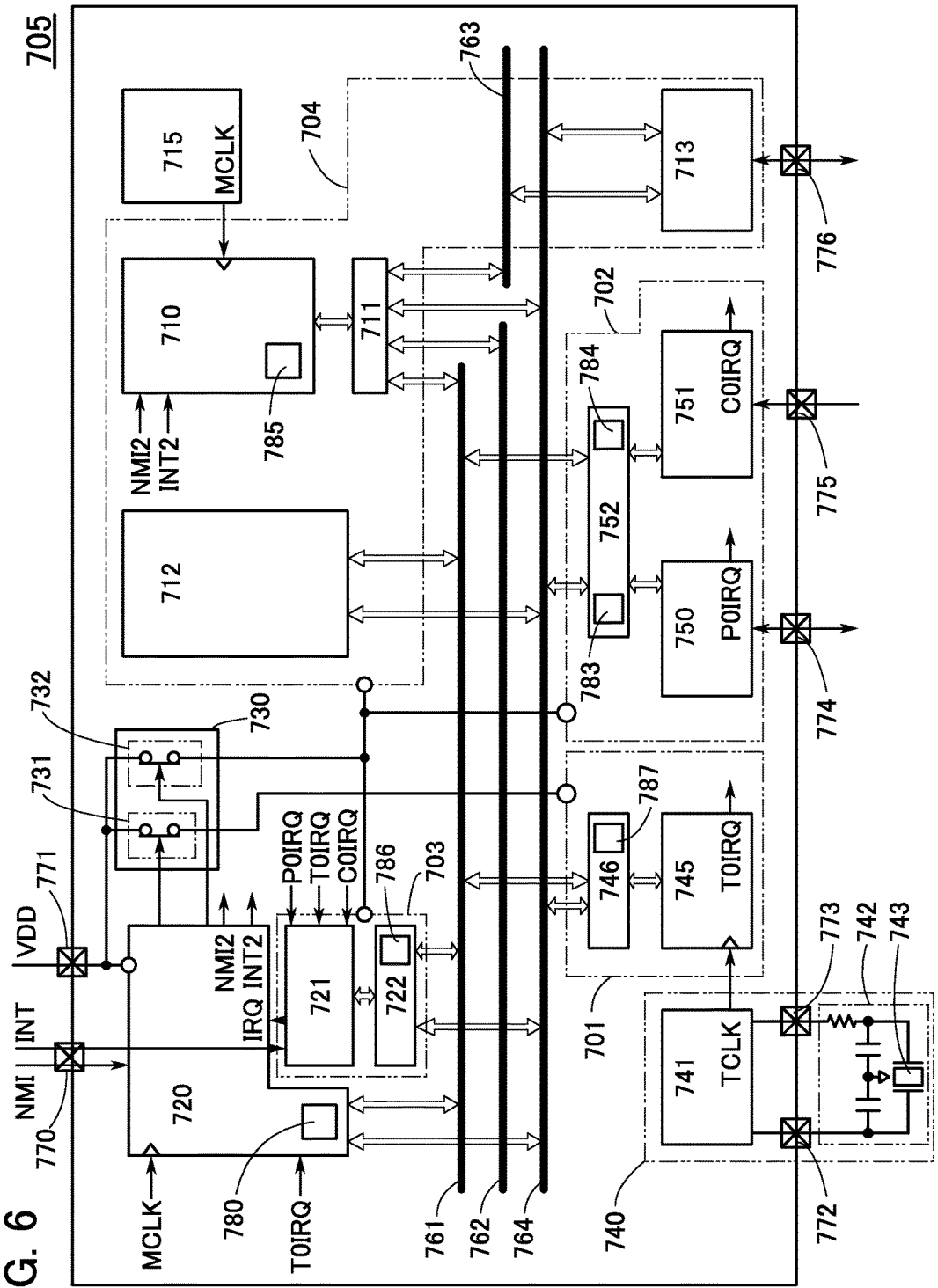
FIG. 6 is a block diagram illustrating a structure example of an MCU.

Next, a configuration example of a circuit 705 applicable to the MCU 105 is described with reference to FIG. 6. FIG. 6 is a block diagram of the circuit 705.

The circuit 705 includes a CPU (central processing unit) 710, a bus bridge 711, a memory 712, a memory interface 713, a controller 720, an interrupt controller 721, an I/O interface (input/output interface) 722, and a power gate unit 730.

The circuit 705 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the circuit 705 includes at least connection terminals 770 to 776 as portions for connection to an external device. Note that each of the connection terminals 770 to 776 represents one terminal or a terminal group including a plurality of terminals. An oscillation unit 742 including a quartz crystal unit 743 is connected to the circuit 705 through the connection terminal 772 and the connection terminal 773.

The CPU 710 includes a register 785 and is connected to the bus lines 761 to 763 and the data bus line 764 through the bus bridge 711.

The memory 712 is a memory device which can function as a main memory of the CPU 710. As an example thereof, a random access memory (RAM) is used. The memory 712 is a device that stores an instruction to be executed by the CPU 710, data necessary for execution of the instruction, and data processed by the CPU 710. Under the instruction executed by the CPU 710, data is written into and read out from the memory 712. Further, part of the memory 712 may be used as the memory 106.

In the circuit 705 in a low power consumption mode, supply of power to the memory 712 is blocked. Thus, it is preferable that the memory 712 be a memory which can hold data even while power is not supplied.

The memory interface 713 is an input/output interface with an external memory device. Under the instruction executed by the CPU 710, data is written into and read out from the external memory device connected to the connection terminal 776 via the memory interface 713.

A clock generation circuit 715 is a circuit that generates a clock signal MCLK (hereinafter simply also referred to as "MCLK") to be used in the CPU 710, and includes an RC oscillator and the like. MCLK is also output to the controller 720 and the interrupt controller 721.

The controller 720 is a circuit which controls the circuit 705, and can control, for example, power supply of the circuit 705, the clock generation circuit 715, the crystal oscillation circuit 741, and the like.

The connection terminal 770 is a terminal for inputting an external interrupt signal. A non-maskable interrupt signal NMI is input to the controller 720 through the connection terminal 770. As soon as the non-maskable interrupt signal NMI is input to the controller 720, the controller 720 outputs the non-maskable interrupt signal NMI to the CPU 710, so that the CPU 710 executes interrupt processing.

An interrupt signal INT is input to the interrupt controller 721 through the connection terminal 770. Interrupt signals (T0IRQ, P0IRQ, and C0IRQ) from the peripheral circuits (745, 750, and 751) are input to the interrupt controller 721 without going through the buses (761 to 764).

The interrupt controller 721 has a function of setting priorities to interrupt requests. When the interrupt controller 721 detects the interrupt signal, the interrupt controller 721 determines if the interrupt request is valid or not. If the interrupt request is valid, the interrupt controller 721 outputs an interrupt signal IRQ into the controller 720.

The interrupt controller 721 is connected to the bus line 761 and the data bus line 764 through the I/O interface 722.

When the interrupt signal INT is input, the controller 720 outputs an interrupt signal INT2 to the CPU 710 and makes the CPU 710 execute interrupt processing.

The interrupt signal T0IRQ is directly input to the controller 720 without going through the interrupt controller 721 in some cases. When the controller 720 receives the interrupt signal T0IRQ, the controller 720 outputs a non-maskable interrupt signal NMI2 to the CPU 710, so that the CPU 710 executes interrupt processing.

A register 780 of the controller 720 is provided in the controller 720. A register 786 of the interrupt controller 721 is provided in the I/O interface 722.

Then, peripheral circuits included in the circuit 705 will be described. The circuit 705 includes the timer circuit 745, the I/O port 750, and the comparator 751 as peripheral circuits. These peripheral circuits are just examples, and a variety of circuits can be provided as appropriate depending on conditions where the circuit 705 is used.

The timer circuit 745 has a function of measuring time in response to a clock signal TCLK (hereinafter simply also referred to as "TCLK") output from a clock generation circuit 740. In addition, the timer circuit 745 outputs the interrupt signal T0IRQ to the controller 720 and the interrupt controller 721 at predetermined intervals. The timer circuit 745 is connected to the bus line 761 and the data bus line 764 through the I/O interface 746.

TCLK is a clock signal the frequency of which is lower than that of MCLK. For example, the frequency of MCLK is about several megahertz (MHz) (e.g., 8 MHz) and the frequency of TCLK is about several tens of kilohertz (kHz) (e.g., 32 kHz). The clock generation circuit 740 includes the crystal oscillation circuit 741 incorporated in the circuit 705 and the oscillation unit 742 which is connected to the connection terminal 772 and the connection terminal 773. The quartz crystal unit 743 is used as a resonator unit of the oscillation unit 742. In addition, the clock generation circuit 740 is made up of a CR oscillator and the like, and thereby, all modules in the clock generation circuit 740 can be incorporated in the circuit 705.

The I/O port 750 is an interface that inputs and outputs information to/from an external device (e.g., the sensor 104) which is connected to the I/O port 750 through the connection terminal 774 and is an input/output interface for a digital signal. The I/O port 750 outputs the interrupt signal P0IRQ to the interrupt controller 721 in response to an input digital signal.

The comparator 751 is a peripheral circuit that processes an analog signal inputted from the connection terminal 775. The comparator 751 compares a potential (or current) of the analog signal inputted from the connection terminal 775 with a potential (or current) of a reference signal and generates a digital signal the level of which is 0 or 1. Further, the comparator 751 generates the interrupt signal C0IRQ in accordance with the digital signal. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the I/O port 750 and the comparator 751 can have respective I/O interfaces.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The circuit 705 includes the power gate unit 730 that can stop power supply to the internal circuits. Power is supplied only to a circuit necessary for operation by the power gate unit 730, so that power consumption of the whole circuit 705 can be lowered.

As illustrated in FIG. 6, circuits in a unit 701, a unit 702, a unit 703, and a unit 704 in the circuit 705 which are surrounded by dashed lines are connected to the connection terminal 771 through the power gate unit 730. The connection terminal 771 is a power supply terminal for supplying a high power supply potential $V_{DD}$ (hereinafter simply also referred to as "$V_{DD}$"). The connection terminal 771 is connected to, for example, the secondary battery 101. Note that a converter may be provided between the connection terminal 771 and the secondary battery 101.

In one embodiment of the present invention, the unit 701 includes the timer circuit 745 and the I/O interface 746; the unit 702 includes the I/O port 750, the comparator 751, and the I/O interface 752; the unit 703 includes the interrupt controller 721 and the I/O interface 722; the unit 704 includes the CPU 710, the memory 712, the bus bridge 711, and the memory interface 713.

The power gate unit 730 is controlled by the controller 720. The power gate unit 730 includes a switch circuit 731 and a switch circuit 732 for blocking supply of $V_{DD}$ to the units 701 to 704.

The switching of the switch circuits 731 and 732 is controlled by the controller 720. Specifically, the controller 720 outputs a signal to turn off one or both of the switch circuits included in the power gate unit 730, depending on the request by the CPU 710 (power supply stop). In addition, the controller 720 outputs a signal to turn on the switch circuit included in the power gate unit 730 with, as a trigger, the non-maskable interrupt signal NMI or the interrupt signal T0IRQ from the timer circuit 745 (start of power supply).

FIG. 6 illustrates a structure where two switch circuits (the switch circuits 731 and 732) are provided in the power gate unit 730; however, the structure is not limited thereto. Switch circuits may be provided as much as needed to block supply of power.

In one embodiment of the present invention, the switch circuit 731 is provided to independently control supply of power to the unit 701, and the switch circuit 732 is provided to independently control supply of power to the units 702 to 704. However, the embodiment of the present invention is not limited to such power supply paths. For example, another switch circuit which is different from the switch circuit 732 may be provided to independently control supply of power to the memory 712. Further, a plurality of switch circuits may be provided for one circuit.

In addition, $V_{DD}$ is constantly supplied from the connection terminal 771 to the controller 720 without going through the power gate unit 730. In order to reduce noise, a power supply potential from an external power supply circuit, which is different from the power supply circuit for $V_{DD}$, is given to each of the oscillation circuit of the clock generation circuit 715 and the crystal oscillation circuit 741.

By provision of the controller 720, the power gate unit 730, and the like, the circuit 705 can operate in three kinds of operation modes. The first operation mode is a normal operation mode where all circuits included in the circuit 705 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated therewith are active. In the third operation mode, the controller 720 alone is active. Here, the second operation mode is referred to as "the Noff1 mode" and the third operation mode is referred to as "the Noff2 mode".

The controller 720 and some of the peripheral circuits (circuits necessary for timer operation) alone operate in the Noff1 mode and the controller 720 alone operates in the Noff2 mode.

Note that power is constantly supplied to the oscillator of the clock generation circuit 715 and the crystal oscillation circuit 741 regardless of the operation modes. In order to bring the clock generation circuit 715 and the crystal oscillation circuit 741 into non-active modes, an enable signal is inputted from the controller 720 or an external circuit to stop oscillation of the clock generation circuit 715 and the crystal oscillation circuit 741.

In addition, in Noff1 and Noff2 modes, power supply is stopped by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 783 of the I/O port 750.

Note that in this specification, the phrase "a circuit is non-active" includes a state where major functions in Active mode (normal operation mode) are stopped and an operation state with power consumption lower than that in Active mode, as well as a state where a circuit is stopped by blocking supply of power.

Further, in order that the circuit 705 can return from the Noff1 or Noff2 mode to Active mode more rapidly, the registers 784 to 787 each have a backup storage portion for saving data at the time of power supply stop. In other words, the registers 784 to 787 each include a volatile data storage portion (also referred to as "volatile memory unit") and a nonvolatile data storage portion (also referred to as "nonvolatile memory unit"). In Active mode, by accessing the volatile memory units of the registers 784 to 787, data is written and read out.

Note that since power is always supplied to the controller 720, the register 780 of the controller 720 is not provided with a nonvolatile memory unit. In addition, as described above, even in the Noff1 or Noff2 mode, the register 783 operates so that the output buffer of the I/O port 750 functions. Since power is always supplied to the register 783, the register 783 is not provided with a nonvolatile memory unit.

A volatile memory unit includes one or more volatile memory elements. A nonvolatile memory unit includes one or more nonvolatile memory elements. Note that the volatile memory element shows access speed higher than that of the nonvolatile memory element.

There is no particular limitation on a semiconductor material used for a transistor included in the volatile memory element. However, the semiconductor material preferably has a band gap width different from that of a semiconductor material used for a transistor included in the nonvolatile memory element to be described later. As such a semiconductor material, silicon, germanium, silicon germanium, gallium arsenide, or the like can be used, and a single crystal semiconductor is preferably used. In order to increase the speed of data processing, it is preferable to use a transistor with high switching speed, such as a transistor formed using single crystal silicon.

The nonvolatile memory element is electrically connected to a node where electric charge corresponding to data of the volatile memory element is held, and is used for storing data from the volatile memory element in a period during which power is not supplied. Accordingly, the nonvolatile memory element has a longer data holding time than at least the volatile memory element to which power is not supplied.

In the shift from Active mode to Noff1 or Noff2 mode, prior to power supply stop, data stored in the volatile memory units of the registers 784 to 787 are written into the nonvolatile memory units, so that data in the volatile memory units are reset to initial values; as a result, supply of power is blocked.

In the return from Noff1 or Noff2 mode to Active mode, when power is supplied again to the registers 784 to 787, data in the volatile memory units are reset to initial values. Then, data in the nonvolatile memory units are written into the volatile memory units.

Accordingly, even in the low power consumption mode, data needed for processing by the circuit 705 are stored in the registers 784 to 787, and thus, the circuit 705 can return from the low power consumption mode to Active mode immediately.

[2-2. Configuration Example of Register]

Figure 7:
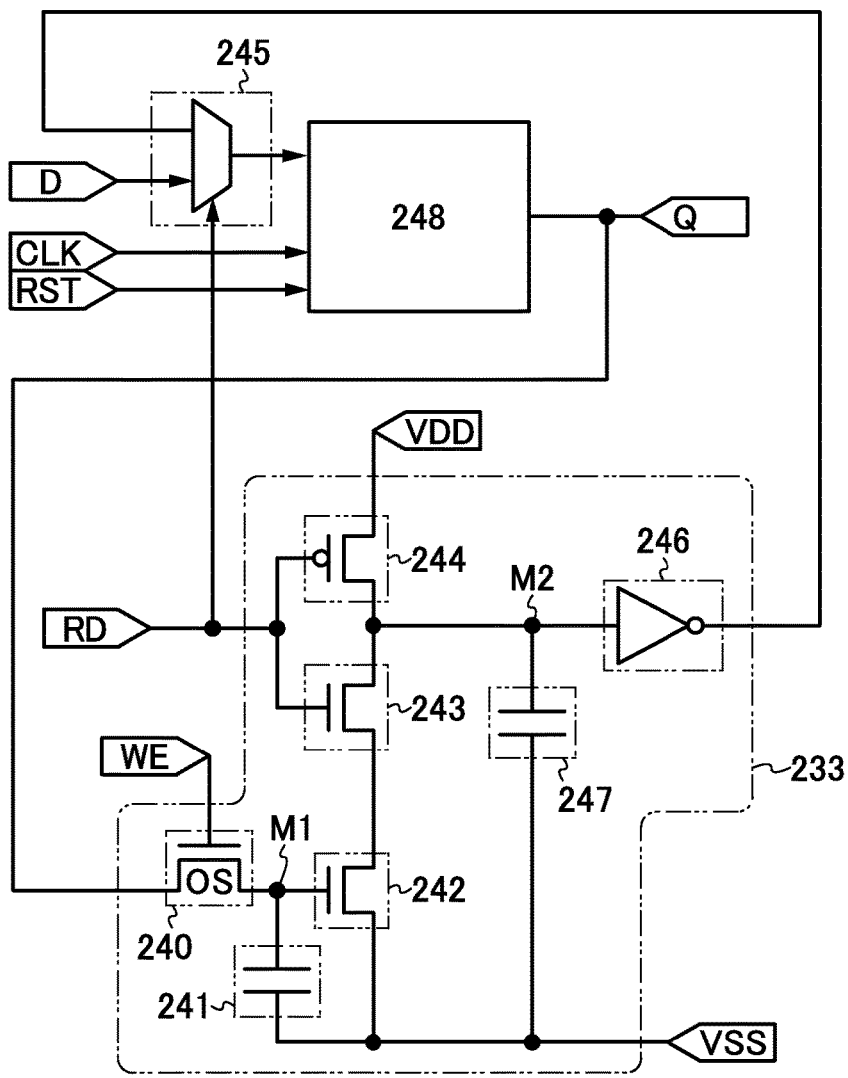
FIG. 7 is a circuit diagram illustrating an example of a register including a nonvolatile memory unit.

FIG. 7 shows a register 1196 as one example of a circuit configuration that can be used for the registers 784 to 787. The circuit configuration includes a volatile memory unit and a nonvolatile memory unit and can store 1-bit data.

The register 1196 illustrated in FIG. 7 includes a flip-flop 248 which is a volatile memory unit, a nonvolatile memory unit 233, and a selector 245.

The flip-flop 248 is supplied with a reset signal RST, a clock signal CLK, and a data signal D. The flip-flop 248 has a function of holding data of a data signal D in response to the clock signal CLK and outputting a high-level potential H or a low-level potential L as a data signal Q in accordance with the data signal D.

The nonvolatile memory unit 233 is supplied with a write control signal WE, a read control signal RD, and a data signal D.

The nonvolatile memory unit 233 has a function of storing data of an input data signal D in accordance with the write control signal WE and outputting the stored data as the data signal D in accordance with the read control signal RD.

The selector 245 selects the data signal D or the data signal outputted from the nonvolatile memory unit 233 and inputs the selected signal to the flip-flop 248 in accordance with the read control signal RD.

Further, as illustrated in FIG. 7, a transistor 240 and a capacitor 241 are provided in the nonvolatile memory unit 233.

The transistor 240 is an n-channel transistor. One of a source and a drain of the transistor 240 is electrically connected to an output terminal of the flip-flop 248. The transistor 240 has a function of controlling the holding of a data signal output from the flip-flop 248 in accordance with the write control signal WE.

The transistor 240 preferably has extremely low off-state current. For example, a transistor which includes an oxide semiconductor for a semiconductor layer where a channel is formed (hereinafter, the transistor is also referred to as "OS transistor") is used as the transistor 240.

One of a pair of electrodes of the capacitor 241 and the other of the source and the drain of the transistor 240 are connected to a node M1. A low power supply potential $V_{SS}$ is applied to the other of the pair of the electrodes of the capacitor 241. The capacitor 241 has a function of holding electric charge based on data of the stored data signal D in the node M1. The transistor 240 preferably has extremely low off-state current. Since a transistor having extremely low off-state current is used for the transistor 240, the electric charge in the node M1 is held and thus the data is held even when supply of the power supply voltage is stopped. By using a transistor having extremely low off-state current for the transistor 240, the capacitor 241 can be small or omitted.

A transistor 244 is a p-channel transistor. A high power supply potential $V_{DD}$ is supplied to one of a source and a drain of the transistor 244. The read control signal RD is input to a gate of the transistor 244.

A transistor 243 is an n-channel transistor. One of a source and a drain of the transistor 243 and the other of the source and the drain of the transistor 244 are connected to a node M2. A gate of the transistor 243 is connected to the gate of the transistor 244 and the read control signal RD is input to the gate of the transistor 243.

A transistor 242 is an n-channel transistor. One of a source and a drain of the transistor 242 is connected to the other of the source and the drain of the transistor 243. The power supply potential $V_{SS}$ is supplied to the other of the source and the drain of the transistor 243. Note that a high-level potential H which the flip-flop 248 outputs is a potential at which the transistor 242 is turned on, and a low-level potential L which the flip-flop 248 outputs is a potential at which the transistor 242 is turned off.

An input terminal of an inverter 246 is connected to the node M2. In addition, an output terminal of the inverter 246 is connected to an input terminal of the selector 245.

One electrode of a capacitor 247 is connected to the node M2. The power supply potential $V_{SS}$ is supplied to the other electrode of the capacitor 247. The capacitor 247 has a function of holding electric charge based on data of a data signal input to the inverter 246.

In the register 1196 having the above-described structure in FIG. 7, when data of the flip-flop 248 is stored in the nonvolatile memory unit 233, the transistor 240 is turned on by inputting a signal for turning on the transistor 240 as the write control signal WE, so that electric charge corresponding to the data signal Q in the flip-flop 248 is supplied to the node M1. After that, by turning off the transistor 240 by inputting a signal for turning off the transistor 240 as the write control signal WE, electric charge supplied to the node M1 is held. While $V_{SS}$ is supplied as the potential of the read control signal RD, the transistor 243 is off and the transistor 244 is on, so that the potential of the node M2 becomes $V_{DD}$.

When data is restored from the nonvolatile memory unit 233 to the flip-flop 248, $V_{DD}$ is applied as the read control signal RD. Accordingly, the transistor 244 is turned off and the transistor 243 is turned on, so that a potential based on the electric charge held in the node M1 is supplied to the node M2. In the case where electric charge corresponding to the high-level potential H of the data signal Q is held in the node M1, the transistor 242 is in an on state, $V_{SS}$ is supplied to the node M2, and $V_{DD}$ outputted from the inverter 246 is input to the flip-flop 248 through the selector 245. Alternatively, in the case where electric charge corresponding to the low-level potential L of the data signal Q is held in the node M1, the transistor 242 is turned off, the potential ($V_{DD}$) of the node M2 when $V_{SS}$ is supplied is held as the potential of the read control signal RD, and $V_{SS}$ outputted from the inverter 246 is input to the flip-flop 248 through the selector 245.

By provision of the volatile memory unit and the nonvolatile memory unit 233 in the register 1196 as described above, data of the volatile memory unit can be stored in the nonvolatile memory unit 233 before supply of power to the CPU is stopped, and data can be quickly restored from the nonvolatile memory unit 233 to the volatile memory unit when the supply of power to the CPU is resumed.

By storing and restoring data in such a manner, the CPU does not need to be started up from a state where the volatile memory unit is initialized every time the supply of power is stopped; thus, after the supply of power is resumed, the CPU can start arithmetic processing relating to measurement immediately.

In order to increase the speed of reading data, it is preferable for the transistor 242 to use a transistor that is similar to the transistor used for the above volatile memory element.

Note that in the register 1196, $V_{SS}$ is supplied to the other of the source and the drain of the transistor 242 and the other electrode of the capacitor 241. The other of the source and the drain of the transistor 242 and the other electrode of the capacitor 241 may have the same potential or different potentials. Further, the capacitor 241 is not necessarily provided. For example, in the case where the parasitic capacitance of the transistor 242 is high, the parasitic capacitance can be used instead of the capacitor 241.

The node M1 has the same effect as a floating gate of a floating-gate transistor that is used as a nonvolatile memory element. However, since data can be directly rewritten by turning on or off the transistor 240, injection of electric charge into a floating gate and extraction of electric charge from the floating gate with use of high voltage are not necessary. In other words, in the nonvolatile memory unit 233, high voltage needed for writing or erasing data in a conventional floating gate transistor is not necessary. Thus, by using the nonvolatile memory unit 233, power consumption needed for storage of data can be reduced.

For similar reasons, a decrease in operation speed due to data writing or data erasing can be suppressed; thus, the nonvolatile memory unit 233 can operate at high speed. For similar reasons, deterioration of a gate insulating film (tunnel insulating film), which is a problem of a conventional floating gate transistor, does not occur. In other words, unlike in a conventional floating gate transistor, the nonvolatile memory unit 233 has no limitation on the number of writings in principle. From the above, the nonvolatile memory unit 233 can be adequately used as a memory device that needs many rewritings and high-speed operation, such as a register.

Further, a nonvolatile memory element formed using an OS transistor can hold data even under an environment at 100° C. to 200° C. Thus, it is preferable that the nonvolatile memory unit 233 be formed using an OS transistor.

In the above, the configuration of the nonvolatile memory unit 233 is not limited to that in FIG. 7. For example, a phase change memory (PCM), a resistance random access memory (ReRAM), a magnetoresistive random access memory (MRAM), a ferroelectric random access memory (FeRAM), or a flash memory can be used.

Volatile memory elements can be included in, for example, a register such as a buffer register or a general-purpose register. A cache memory including a static random access memory (SRAM) or the like can also be provided in the volatile memory unit. The register and cache memory can store data in the nonvolatile memory unit 233.

<<3. Memory Device>>

Next, an example of a memory device applicable to the memory 106 included in the power storage device 100 is described.

[3-1. DOSRAM]

Figure 8A:
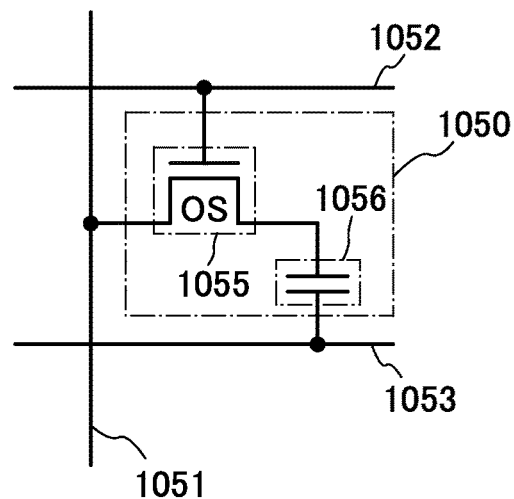
FIGS. 8A and 8B show an example of a memory device.
Figure 8B:
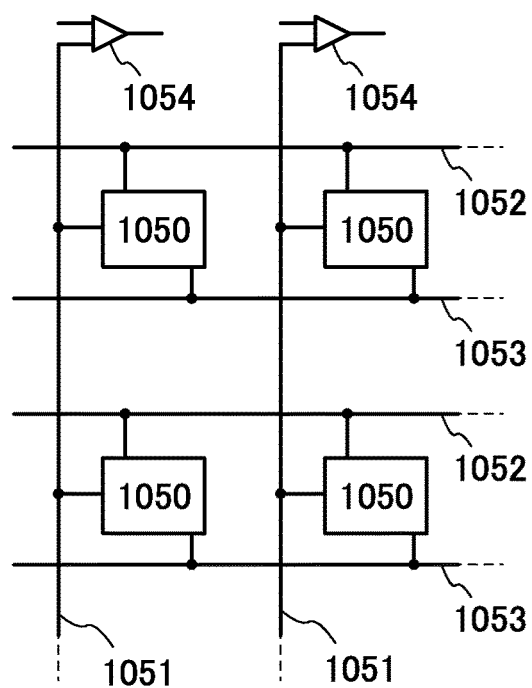

FIGS. 8A and 8B illustrate a dynamic oxide semiconductor random access memory (DOSRAM) which is an example of a memory device applicable to the memory 106. A DOSRAM is a memory device in which an OS transistor is used as a selection transistor (functioning as a switching transistor) of a memory cell.

FIG. 8A is a circuit diagram of a memory cell 1050. FIG. 8B is a circuit diagram of a memory cell array in which the memory cells 1050 are arranged in matrix.

The memory cell 1050 includes a transistor 1055 and a capacitor 1056. A gate of the transistor 1055 is electrically connected to a word line 1052. A source of the transistor 1055 is electrically connected to a bit line 1051. A drain of the transistor 1055 is electrically connected to one terminal of the capacitor 1056. The other terminal of the capacitor 1056 is electrically connected to a capacitor line 1053.

The memory cell array includes a plurality of memory cells 1050, a plurality of bit lines 1051, a plurality of word lines 1052, a plurality of capacitor lines 1053, and a plurality of sense amplifiers 1054.

Note that the bit lines 1051 and the word lines 1052 are provided in a grid pattern, and the memory cell 1050 is provided for each intersection of the bit line 1051 and the word line 1052. The bit lines 1051 are connected to the sense amplifiers 1054, which have a function of reading the potentials of the bit lines 1051 as data.

Figure 9:
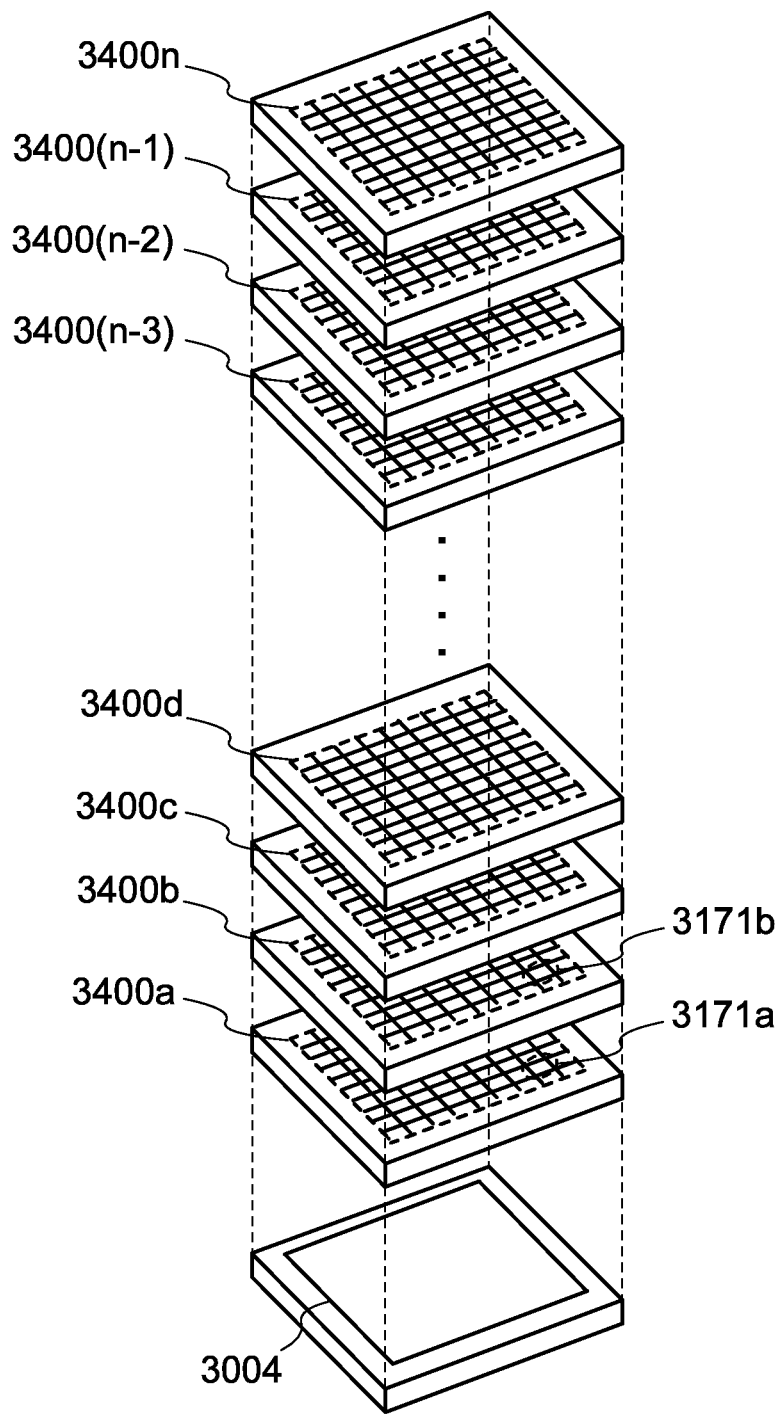
FIG. 9 illustrates an example of a memory device.

FIG. 9 is a perspective view of a memory device. The memory device illustrated in FIG. 9 includes, in the upper portion, a plurality of layers of memory cell arrays (memory cell arrays 3400a to 3400n (n is an integer greater than or equal to 2)) each including a plurality of memory cells as memory circuits and, in the lower portion, a logic circuit 3004 which is necessary for operating the memory cell arrays 3400a to 3400n.

A voltage retained in the capacitor 1056 gradually decreases with time due to leakage current of the transistor 1055. After a certain period of time, the voltage originally charged from V0 to V1 is decreased to VA which is a limit for reading data 1. This period is called a holding period T_1. In the case of a two-level memory cell, refresh operation needs to be performed within the retention period T_1.

For example, in the case where the off-state current of the transistor 1055 is not sufficiently low, the retention period T_1 becomes short because the voltage retained in the capacitor 1056 significantly changes with time. Thus, refresh operation needs to be performed frequently. An increase in frequency of refresh operation increases power consumption of the memory device.

Thus, an OS transistor is used as the transistor 1055. The OS transistor has extremely low off-state current. When the OS transistor is used as the transistor 1055, the retention period T_1 can be very long. In other words, the frequency of refresh operation can be reduced; thus, power consumption can be reduced. For example, in the case where a memory cell is formed using the transistor 1055 having an off-state current of $1\times10^{-21}$ A to $1\times10^{-25}$ A, data can be retained for several days to several decades without supply of electric power. Further, the memory cell 1050 can be used in the nonvolatile memory unit included in the MCU 105.

With use of the OS transistor, a memory device with high degree of integration and low power consumption can be obtained.

Further, the memory device formed using the OS transistor can hold data even under an environment at 100° C. to 200° C.

[3-2. NOSRAM]

Next, as an example of a memory device different from the memory device illustrated in FIGS. 8A and 8B and FIG. 9, a nonvolatile oxide semiconductor random access memory (NOSRAM) is described. A NOSRAM indicates a memory in which an OS transistor is used as a selection transistor (functioning as a switching element) of a memory cell and a transistor using a silicon material or the like is used as an output transistor of the memory cell.

Figure 10A:
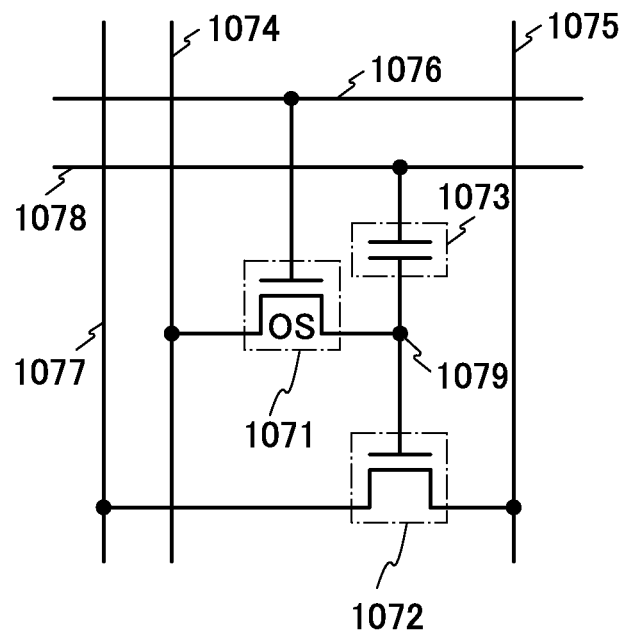
FIG. 10A is a circuit diagram of a memory device.
Figure 10B:
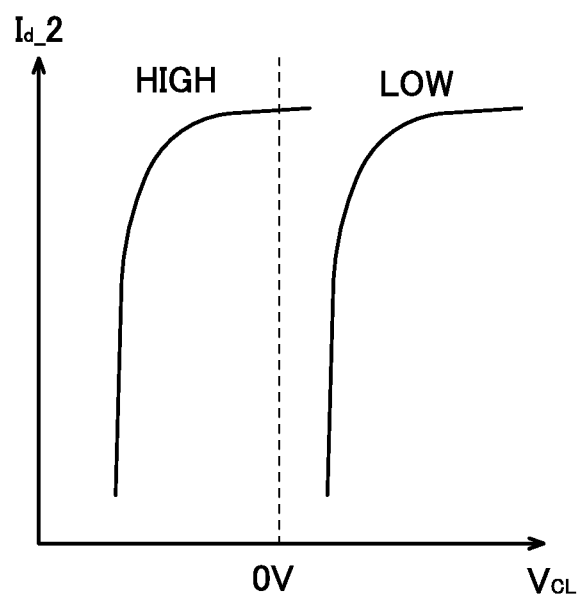
FIG. 10B shows electric characteristics of a memory cell.

FIG. 10A is a circuit diagram of a memory device including a memory cell and wirings. FIG. 10B is a graph showing electric characteristics of the memory cell in FIG. 10A.

The memory cell includes a transistor 1071, a transistor 1072, and a capacitor 1073. Here, a gate of the transistor 1071 is electrically connected to a word line 1076. A source of the transistor 1071 is electrically connected to a source line 1074. A drain of the transistor 1071 is electrically connected to a gate of the transistor 1072 and one terminal of the capacitor 1073, and this portion is referred to as a node 1079. A source of the transistor 1072 is electrically connected to a source line 1075. A drain of the transistor 1072 is electrically connected to a drain line 1077. The other terminal of the capacitor 1073 is electrically connected to a capacitor line 1078.

The memory device illustrated in FIGS. 10A and 10B utilizes variation in the apparent threshold voltage of the transistor 1072, which depends on the potential of the node 1079. For example, FIG. 10B shows a relation between a voltage $V_{CL}$ of the capacitor line 1078 and a drain current $I_{d\_2}$ flowing through the transistor 1072.

Note that the potential of the node 1079 can be controlled through the transistor 1071. For example, the potential of the source line 1074 is set to a high power supply potential $V_{DD}$. In this case, when the potential of the word line 1076 is set to be higher than or equal to the sum of the high power supply potential $V_{DD}$ and the threshold voltage Vth of the transistor 1071, the potential of the node 1079 can be HIGH. Further, when the potential of the word line 1076 is set to be lower than or equal to the threshold voltage Vth of the transistor 1071, the potential of the node 1079 can be LOW.

Thus, the transistor 1072 has electric characteristics shown with either a $V_{CL}$-$I_{d\_2}$ curve denoted as LOW or a $V_{CL}$-$I_{d\_2}$ curve denoted as HIGH. That is, when the potential of the node 1079 is LOW, $I_{d\_2}$ is small at a $V_{CL}$ of 0 V; accordingly, data 0 is stored. Further, when the potential of the node 1079 is HIGH, $I_{d\_2}$ is large at a $V_{CL}$ of 0 V; accordingly, data 1 is stored. In such a manner, data can be stored in the node 1079.

By using a transistor with low off-state current as the transistor 1071, a data retention period can be lengthened. In other words, the OS transistor having extremely low off-state current is used as the transistor 1071, whereby the potential of the node 1079 can be held for an extremely long period. Further, when the transistor 1072 is used for reading data, data stored in the node 1079 is not lost at the time of reading data; thus, data can be read out repeatedly. For example, in the case where a memory cell is formed using the transistor 1071 having an off-state current of $1\times10^{-21}$ A to $1\times10^{-25}$ A, data can be held for several days to several decades without supply of electric power. Further, the NOSRAM can be used for the nonvolatile memory unit in the MCU 105.

The memory device formed using an OS transistor can hold data even under an environment at 100° C. to 200° C.

With use of the OS transistor, a memory device with high degree of integration and low power consumption can be obtained.

[3-3. Memory Capacitance]

The memory capacitance of the memory 106 may be determined on the basis of the battery capacity, charge and discharge voltage, charge and discharge current, assumed operating temperature, and assumed operating time of the secondary battery 101 and the resolution for measuring the data.

In the charge mode, the resolution for measuring the battery capacity is less than or equal to 10% of the maximum battery capacity, preferably less than or equal to 1% thereof, further preferably less than or equal to 0.1% thereof. Further, the resolution for measuring the voltage and the current is less than or equal to half the minimum reading value, preferably less than or equal to 1/10 thereof. The resolution for measuring the temperature is lower than or equal to 10° C., preferably lower than or equal to 5° C. The resolution of operating time in the charge mode is shorter than or equal to 10 minutes, preferably shorter than or equal to 1 minute.

In the rapid discharge mode, a large amount of current flows in a short period of time; thus, the resolution for measuring current is less than or equal to ⅔ of the rated current, preferably less than or equal to ½ thereof. Further, the resolution of operating time is shorter than or equal to 10 ms, preferably shorter than or equal to 1 ms, further preferably shorter than or equal to 100 µs.

For example, under the condition where the maximum battery capacity is 3000 mAh, the charge and discharge voltage is 0 V to 6.0 V, the charge and discharge current is 0 A to 3.0 A, the assumed operating temperature is 0° C. to 200° C., and the operating time is 480 minutes (8 hours), the memory capacitance per charge mode can be determined as shown in Table 1.

TABLE 1

| | Measurement Range | Resolution | Necessary Capacitance (bit) |
|---|---|---|---|
| Battery Capacity | 0 to 3000 mAh | 10 mV | 9 × 2 |
| Voltage | 0 to 6.0 V | 10 mV | 10 × 2 |
| Current | 0 to 3.0 A | 10 mA | 9 × 2 |
| Temperature | 0 to 200° C. | 10° C. | 5 × 2 |
| Operation Time | 480 min | 1 min | 9 |
| | | | Total 75 bits |

Further, the memory capacitance per rapid discharge mode can be determined as shown in Table 2. Note that in Table 2, the maximum amount of operating time of the rapid discharge mode is 50 ms, and the maximum amount of discharge current is 30 A.

TABLE 2

| | Measurement Range | Resolution | Necessary Capacitance (bit) |
|---|---|---|---|
| Battery Capacity | 0 to 3000 mAh | 10 mV | 9 × 2 |
| Voltage | 0 to 6.0 V | 10 mV | 10 × 2 |
| Current | 0 to 3.0 A | 1 A | 9 × 2 |
| Temperature | 0 to 200° C. | 10° C. | 5 × 2 |
| Operation Time | 50 min | 100 µs | 9 |
| | | | Total 67 bits |

According to Table 1, the memory capacitance per charge mode is 75 bits, which is needed for storing the operating time and the battery data at the start time and the ending time of the mode. Further, according to Table 2, the memory capacitance per rapid discharge mode is 67 bits, which is needed for storing the operating time and the battery data at the start time and the ending time of the mode.

In the case where the memory device records the charge mode performed five times per day and the rapid discharge mode performed five times per day, the capacitance needed for storing data for three years can be estimated to be (75×5+67×5)×365×3=777450 bits, that is about 760 kbits.

<<4. Semiconductor Device>>

A structure example of a semiconductor device which can be used for a MCU, a memory, or the like is described.

[4-1. Structure Example of Transistor]

A structure example of a transistor which can be used for a MCU, a memory, or the like is described.

There is no particular limitation on a structure of a transistor which can be used for the MCU, a memory, or the like, and a given structure can be used. For example, a staggered type or a planar type having a bottom-gate structure which is described below can be employed. A transistor may have a single-gate structure in which one channel formation region is formed or a multi-gate structure such as a double-gate structure in which two channel formation regions are formed or a triple-gate structure in which three channel formation regions are formed. In addition, a transistor may have a structure in which two gate electrodes are provided above and below a channel formation region with gate insulating layers provided therebetween (in this specification, this structure is referred to as a dual-gate structure).

[4-1-1. Bottom-Gate Structure]

Figure 11A:
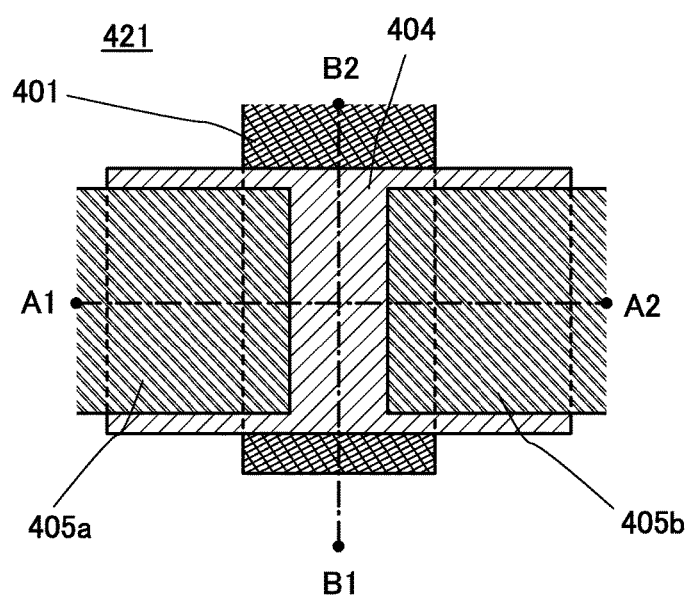
FIGS. 11A to 11C illustrate a structure example of a transistor.
Figure 11B:
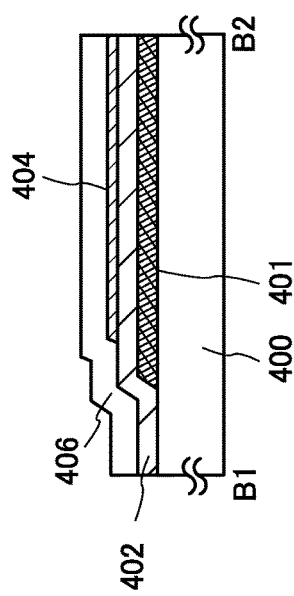
Figure 11C:
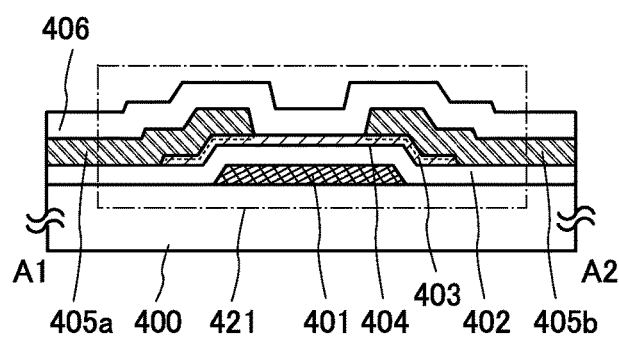

FIGS. 11A to 11C illustrate a structure example of a transistor 421 having a bottom-gate top-contact structure, which is one kind of bottom-gate transistor. FIG. 11A is a plan view of the transistor 421. FIG. 11B is a cross-sectional view taken along the long dashed short dashed line A1-A2 in FIG. 11A. FIG. 11C is a cross-sectional view taken along the long dashed short dashed line B1-B2 in FIG. 11A.

The transistor 421 includes a gate electrode 401 provided over a substrate 400 having an insulating surface, a gate insulating film 402 provided over the gate electrode 401, an oxide film 404 overlapping with the gate electrode 401 with the gate insulating film 402 provided therebetween, and a source electrode 405a and a drain electrode 405b provided in contact with the oxide film 404. In addition, an insulating film 406 is provided so as to cover the source electrode 405a and the drain electrode 405b and be in contact with the oxide film 404. Note that the substrate 400 may be an element formation substrate where another element is formed.

Note that in the oxide film 404, n-type regions 403 may be provided in regions in contact with the source electrode 405a and the drain electrode 405b.

[4-1-2. Top-Gate Structure]

Figure 12A:
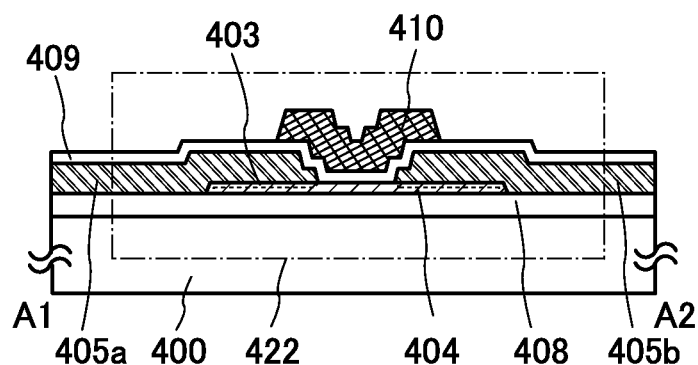
FIGS. 12A and 12B illustrate structure examples of transistors.

FIG. 12A illustrates a transistor 422 having a top-gate structure.

The transistor 422 includes an insulating film 408 provided over a substrate 400 having an insulating surface, an oxide film 404 provided over the insulating film 408, a source electrode 405a and a drain electrode 405b provided in contact with the oxide film 404, a gate insulating film 409 provided over the oxide film 404, the source electrode 405a, and the drain electrode 405b, and a gate electrode 410 overlapping with the oxide film 404 with the gate insulating film 409 provided therebetween.

Note that in the oxide film 404, n-type regions 403 may be provided in regions in contact with the source electrode 405a and the drain electrode 405b.

[4-1-3. Dual-Gate Structure]

Figure 12B:
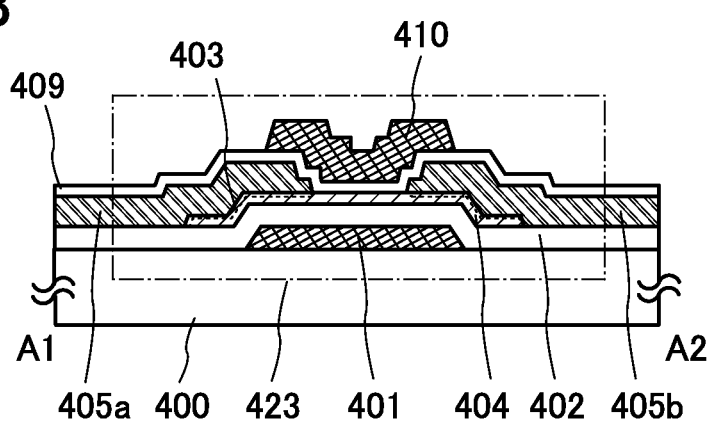

FIG. 12B illustrates a transistor 423 having a dual-gate structure, which includes two gate electrodes above and below a channel formation region with gate insulating films provided therebetween.

The transistor 423 includes a gate electrode 401 provided over a substrate 400 having an insulating surface, a gate insulating film 402 provided over the gate electrode 401, an oxide film 404 overlapping with the gate electrode 401 with the gate insulating film 402 provided therebetween, a source electrode 405a and a drain electrode 405b provided in contact with the oxide film 404, a gate insulating film 409 covering the source electrode 405a and the drain electrode 405b and in contact with the oxide film 404, and a gate electrode 410 overlapping with the oxide film 404 with the gate insulating film 409 provided therebetween.

Note that in the oxide film 404, n-type regions 403 may be provided in regions in contact with the source electrode 405a and the drain electrode 405b.

[4-2. Components of Transistor]

Components of the transistor are described.

[4-2-1. Conductive Layer]

As the gate electrode 401 and the gate electrode 410, a layer containing Al, Cr, Cu, Ta, Ti, Mo, W, or the like can be used, for example.

As the source electrode 405a and the drain electrode 405b, a layer containing Al, Cr, Cu, Ta, Ti, Mo, W, or the like can be used, for example.

[4-2-2. Insulating Layer]

As the gate insulating film 402, the insulating film 406, and the gate insulating film 409, for example, a silicon oxide film, a silicon oxynitride film, a silicon nitride oxide film, a silicon nitride film, a gallium oxide film, an aluminum oxide film, or an aluminum oxynitride film can be used.

[4-2-3. Oxide Film]

In addition, a material applicable to the oxide film 404 is described.

[4-2-3-1. Single-Layer Film]

As the oxide film 404, a film of In-based metal oxide, Zn-based metal oxide, In—Zn-based metal oxide, In—Ga—Zn-based metal oxide, or the like can be used, for example.

Alternatively, a metal oxide containing another metal element instead of part or all of Ga in the In—Ga—Zn-based metal oxide may be used. As the metal element contained instead of part or all of Ga, a metal element that is capable of combining with more oxygen atoms than gallium is can be used, for example, and specifically one or more of titanium, zirconium, hafnium, germanium, and tin can be used, for instance. Alternatively, as the metal element, one or more elements of lanthanum, cerium, praseodymium, neodymium, samarium, europium, gadolinium, terbium, dysprosium, holmium, erbium, thulium, ytterbium, and lutetium may be used. These metal elements each have a function as a stabilizer. Note that the amount of the metal element is the amount at which the metal oxide can serve as a semiconductor. When a metal element that is capable of combining with more oxygen atoms than gallium is used and oxygen is supplied to a metal oxide, oxygen defects in the metal oxide can be reduced.

The concentration of hydrogen in the oxide film, which is measured by secondary ion mass spectrometry (SIMS), can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the oxide film, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the oxide film, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of silicon in the oxide film, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The amount of each of the following gases released from the oxide film is preferably $1\times10^{19}$/cm$^3$ or less, more preferably $1\times10^{18}$/cm$^3$ or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

As the oxide film 404, an oxide semiconductor film can be used, for example.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film as the oxide film, change in electric characteristics due to irradiation with visible light or ultraviolet light is small. Thus, the transistor has high reliability.

The oxide semiconductor film can be formed by a sputtering method. In the case where an In—Ga—Zn—O compound target is used as a sputtering target, an In—Ga—Zn—O compound target is preferably used which is formed by mixing an InO$_x$ powder, a GaO$_y$ powder, and a ZnO$_z$ powder at a molar ratio of 2:2:1, 8:4:3, 3:1:1, 1:1:1, 4:2:3, 3:1:2, or 3:1:4, for example, where x, y, and z are each a given positive number. Note that a sputtering target may be polycrystalline.

Alternatively, a magnetron may be used so that a plasma space in the vicinity of the sputtering target can be densified by a magnetic field. In a magnetron sputtering apparatus, a magnet assembly is located behind a sputtering target so that a magnetic field can be formed in front of the sputtering target, for example. In sputtering of the sputtering target, the magnetic field captures an ionized electron or a secondary electron generated by sputtering. The thus captured electron has an increased probability of collision with an inert gas such as a rare gas in a film formation chamber, thereby increasing the plasma density. Accordingly, the rate of film formation can be increased without a significant increase in temperature of an element formation layer, for example.

In the case where a CAAC-OS film is deposited by a sputtering method, impurities (e.g., hydrogen, water, carbon dioxide, and nitrogen) existing in a deposition chamber of a sputtering apparatus are preferably reduced. In addition, impurities in a deposition gas are preferably reduced. For example, as a deposition gas such as an oxygen gas or an argon gas, a highly purified gas having a dew point of −40° C. or lower, preferably −80° C. or lower, still preferably −100° C. or lower is used, whereby entry of impurities into a CAAC-OS film can be suppressed.

In the case where a CAAC-OS film is deposited by a sputtering method, it is preferable to suppress plasma damage at the time of deposition by increasing the proportion of oxygen in the deposition gas and optimizing electric power. For example, the proportion of oxygen in the deposition gas is preferably 30 vol. % or higher, more preferably 100 vol. %.

In the case where a CAAC-OS film is formed using a sputtering method, it is preferable to remove hydrogen, water, and the like in the film to reduce the concentration of impurities in the film by performing heat treatment after the deposition step in addition to the substrate heating (150° C. to 450° C.) in the deposition step.

When the oxide film 404 is formed as described in the above process so that the film does not contain hydrogen, water, and the like, whereby the concentration of impurities contained in the oxide film 404 can be reduced. Alternatively, the concentration of impurities can be reduced by performing heat treatment after the oxide film 404 is formed, thereby removing hydrogen, water, and the like from the oxide film.

In the case where heat treatment is performed after the oxide film 404 is formed, there is no particular limitation on a heating apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas.

By the heat treatment, impurities such as hydrogen (water, a compound having a hydroxyl group) can be released from the oxide film 404. Thus, the impurities in the oxide film 404 can be reduced, so that the oxide film 404 can be highly purified. Further, in particular, hydrogen serving as an unstable carrier source can be released from the oxide film 404; therefore, the reliability of a transistor including the oxide film 404 can be improved.

Then, by supplying oxygen to the oxide film 404 to fill oxygen vacancies, the oxide film 404 can be made i-type (intrinsic semiconductor) or substantially i-type. The carrier density of an oxide film which is substantially i-type is lower than $1 \times 10^{17}/cm^3$, lower than $1 \times 10^{15}/cm^3$, or lower than $1 \times 10^{13}/cm^3$.

The treatment for supplying oxygen to the oxide film 404 can be performed with an ion doping apparatus or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used.

By heat treatment performed in an atmosphere containing an oxidation gas, oxygen can be supplied to the oxide film 404 and oxygen vacancies in the oxide film 404 can be filled at the same time as the release of the impurities. Oxygen vacancies in the oxide film 404 may be filled in such a manner that heat treatment is performed in an inert gas atmosphere and then another heat treatment is performed in an atmosphere containing an oxidation gas at 10 ppm or more, 1% or more, or 10% or more.

By highly purifying the oxide film 404 so as to be i-type (intrinsic semiconductor) or substantially i-type, the negative shift of the threshold voltage of the transistor including the oxide film 404 can be prevented. As a result, the reliability of the transistor can be improved. Accordingly, the reliability of the semiconductor device can be improved.

[4-2-3-2. Stacked Film]

Furthermore, the oxide film 404 may be a stacked film. The stacked oxide film is described below. For example, the oxide film 404 may be a stacked film including two or more films of an amorphous oxide semiconductor film, a microcrystalline oxide semiconductor film, and a CAAC-OS film.

Figure 13A:
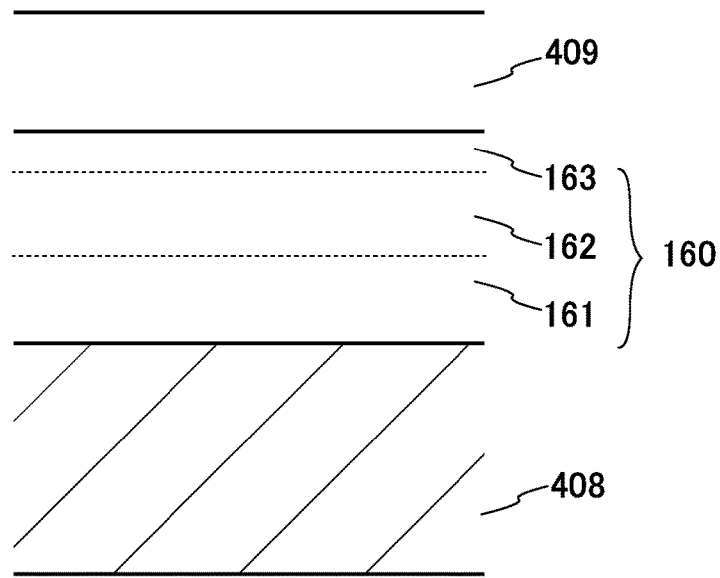
FIGS. 13A and 13B show structure examples of stacked oxide films.

A structure example of a stacked oxide film is shown in FIG. 13A.

Figure 13B:
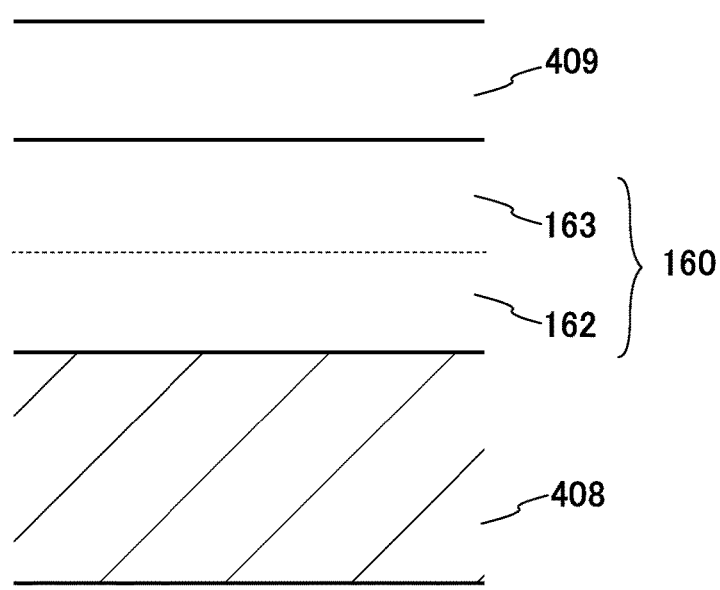

A stacked-layer structure illustrated in FIG. 13A includes a stacked oxide film 160 between an insulating film 408 and a gate insulating film 409. In addition, the stacked oxide film 160 includes an oxide layer 161, an oxide layer 162, and an oxide layer 163. Note that as illustrated in FIG. 13B, the oxide layer 161 is not necessarily provided.

The oxide layer 161 and the oxide layer 163 are each an oxide layer including at least one of metal elements constituting the oxide layer 162.

The oxide layer 162 is formed using an oxide applicable to the oxide film 404 described above.

As the oxide layer 161, an oxide layer that is represented by an In-M-Zn oxide layer (M is a metal such as Al, Ti, Ga, Ge, Y, Zr, Sn, La, Ce, or Hf) and has an atomic ratio of M higher than that in the oxide layer 162 is included. Specifically, as the oxide layer 161, an oxide layer containing the above element at proportion 1.5 times or more, preferably twice or more, more preferably 3 times or more that in the oxide layer 162 is used. Any of the above elements is more strongly bonded to oxygen than indium is, and thus has a function of suppressing generation of an oxygen vacancy in the oxide layer. In other words, the oxide layer 161 is an oxide layer in which oxygen vacancies are less likely to be generated than in the oxide layer 162.

As the oxide layer 163, an oxide layer that is represented by an In-M-Zn oxide layer (M is a metal such as Al, Ti, Ga, Ge, Y, Zr, Sn, La, Ce, or HO and has an atomic ratio of M higher than that in the oxide layer 162 is included. Specifically, as the oxide layer 163, an oxide layer containing the above element at proportion 1.5 times or more, preferably 2 times or more, more preferably 3 times or more that in the oxide layer 162 is used.

In other words, when each of the oxide layer 161, the oxide layer 162, and the oxide layer 163 is an In-M-Zn oxide layer containing at least indium, zinc, and M (M is a metal element such as Al, Ti, Ga, Ge, Y, Zr, Sn, La, Ce, or HO, and the atomic ratio of In to M and Zn included in the oxide layer 161 is $x_1:y_1:z_1$, the atomic ratio of In to M and Zn included in the oxide layer 162 is $x_2:y_2:z_2$, and the atomic ratio of In to M and Zn included in the oxide layer 163 is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide layer 162, a transistor can have stable electric characteristics. However, when $y_2$ is 3 times or more as large as $x_2$, the field-effect mobility of the transistor is reduced; accordingly, $y_2$ is preferably less than 3 times $x_2$.

Note that when the oxide layer 161 is an In-M-Zn oxide layer, the atomic ratio between In and M is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. When the oxide layer 162 is an In-M-Zn oxide layer, the atomic ratio between In and M is preferably as follows: the atomic percentage of In is greater than or equal to 25 at. % and the proportion of M is less than 75 at. %; further preferably, the atomic percentage of In is greater than or equal to 34 at. % and the atomic percentage of M is less than 66 at. %. When the oxide layer 163 is an In-M-Zn oxide layer, the atomic ratio between In and M is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. Note that the total atomic percentage of In and Min the above description is assumed to be 100 at. %.

The constituent elements of the oxide layer 161 and the oxide layer 163 may be different from each other, or their constituent elements may be the same at the same atomic ratios or different atomic ratios.

For the oxide layer 161, the oxide layer 162, and the oxide layer 163, for example, an oxide semiconductor containing indium, zinc, and gallium can be used. Specifically, the oxide layer 161 can be formed using an In—Ga—Zn oxide having an atomic ratio of In to Ga and Zn which is 1:3:2, an In—Ga—Zn oxide having an atomic ratio of In to Ga and Zn which is 1:3:4, an In—Ga—Zn oxide having an atomic ratio of In to Ga and Zn which is 1:6:4, an In—Ga—Zn oxide having an atomic ratio of In to Ga and Zn which is 1:9:6, or an oxide having a composition which is in the neighborhood of any of the above atomic ratios. The oxide layer 162 can be formed using an In—Ga—Zn oxide having an atomic ratio of In to Ga and Zn which is 1:1:1, an In—Ga—Zn oxide having an atomic ratio of In to Ga and Zn which is 3:1:2, or an oxide having a composition which is in the neighborhood of any of the above atomic ratios. The oxide layer 163 can be formed using an In—Ga—Zn oxide having an atomic ratio of In to Ga and Zn which is 1:3:2, an In—Ga—Zn oxide having an atomic ratio of In to Ga and Zn which is 1:3:4, an In—Ga—Zn oxide having an atomic ratio of In to Ga and Zn which is 1:6:4, an In—Ga—Zn oxide having an atomic ratio of In to Ga and Zn which is 1:9:6, or an oxide having a composition which is in the neighborhood of any of the above atomic ratios.

The thickness of the oxide layer 161 is from 3 nm to 100 nm, preferably from 3 nm to 50 nm. The thickness of the oxide layer 162 is from 3 nm to 1500 nm, preferably from 3 nm to 100 nm, further preferably from 3 nm 50 nm.

Note that for each of the oxide layer 161 and the oxide layer 163, a material in which the proportion of indium in the atomic ratio is smaller than that in a material used for the oxide layer 162 is used. The indium and gallium contents in the oxide layers can be compared with each other by time-of-flight secondary ion mass spectrometry (also referred to as TOF-SIMS) or X-ray photoelectron spectrometry (also referred to as XPS).

Preferably, each of the oxide layer 161 and the oxide layer 163 contains one or more kinds of metal elements forming the oxide layer 162, and is formed using an oxide semiconductor whose energy of the bottom of the conduction band is higher than that of the oxide layer 162 by 0.05 eV or more, 0.07 eV or more, 0.1 eV or more, or 0.15 eV or more and which is close to the vacuum level by 2 eV or less, 1 eV or less, 0.5 eV or less, or 0.4 eV or less.

When an electric field is applied to the gate electrode of a transistor having such a structure, a channel is formed in the oxide layer 162 of the stacked oxide film 160, because the oxide layer 162 has the lowest energy at the bottom of the conduction band. In other words, the oxide layer 163 is formed between the oxide layer 162 and the gate insulating film 409, and thereby a structure in which the channel of the transistor is not in contact with the gate insulating film 409 can be obtained.

A band structure of the stacked oxide film 160 is described here.

The band structure of the stacked oxide film 160 can be determined by the following method, for example. The energy gap of each of the oxide layers 161 to 163, the energy gap at the interface between the oxide layers 161 and 163, and the energy gap at the interface between the oxide layers 161 and 163 are measured using a spectroscopic ellipsometer. Next, the energy difference between the vacuum level and the top of the valence band of each of the oxide layers 161 to 163 is measured using an ultraviolet photoelectron spectrometer (UPS). Then, an energy difference (electron affinity) between the vacuum level and the bottom of a conduction band of each layer, which is calculated by subtracting the energy gap of each layer from the energy difference between the vacuum level and the top of the valence band, is plotted. In such a manner, the band structure of the stacked oxide film 160 can be determined. Here, the oxide layer 161 and the oxide layer 163 are each formed using an In—Ga—Zn oxide with an energy gap of 3.15 eV, and the oxide layer 162 is formed using an In—Ga—Zn oxide with an energy gap of 2.8 eV. Further, the energy gap of the vicinity of the interface between the oxide layer 161 and the oxide layer 162 is set to 3 eV, and the energy gap of the vicinity of the interface between the oxide layer 163 and the oxide layer 162 is set to 3 eV.

Figure 14A:
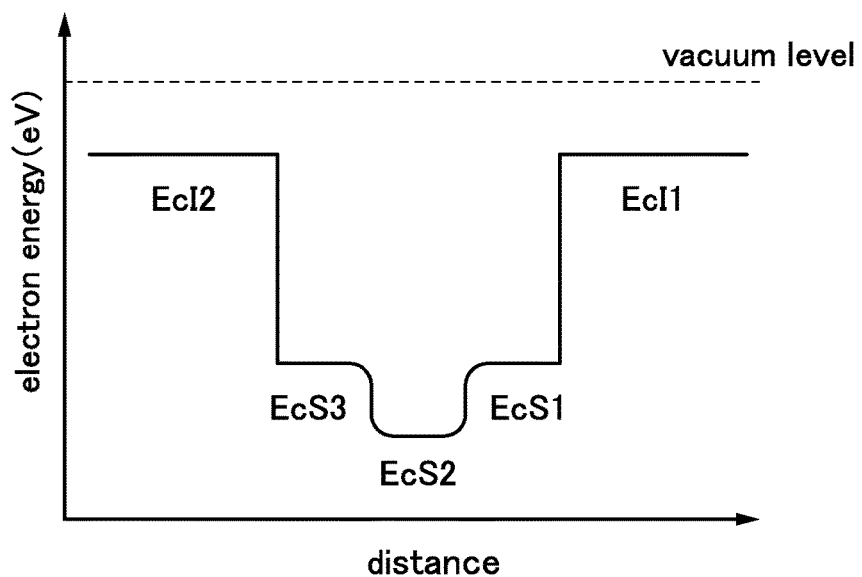
FIGS. 14A and 14B are schematic diagrams of band structures.

FIG. 14A is a schematic view of the band structure of the stacked oxide film 160 determined by the above method. With reference to FIG. 14A, a case is described in which silicon oxide films are provided in contact with the oxide layer 161 and the oxide layer 163. In FIG. 14A, the vertical axis represents electron energy (eV) and the horizontal axis represents distance. Here, EcI1 and EcI2 represent energy at the bottom of the conduction band of the silicon oxide film, EcS1 represents energy at the bottom of the conduction band of the oxide layer 161, EcS2 represents energy at the bottom of the conduction band of the oxide layer 162, and EcS3 represents energy at the bottom of the conduction band of the oxide layer 163.

As illustrated in FIG. 14A, the energy at the bottom of the conduction band changes continuously in the oxide layer 161, the oxide layer 162, and the oxide layer 163. This can be understood also from the fact that the compositions of the oxide layer 161, the oxide layer 162, and the oxide layer 163 are close to each other and oxygen is easily diffused.

Note that FIG. 14A illustrates the case where the oxide layer 161 and the oxide layer 163 are oxide layers having similar properties; however, the oxide layer 161 and the oxide layer 163 may be oxide layers having different energy gaps. For example, in the case where EcS1 is higher than EcS3, part of the band structure can be illustrated as in FIG. 14B. Although not illustrated in FIG. 14A or 14B, EcS3 may be higher than EcS1.

Figure 14B:
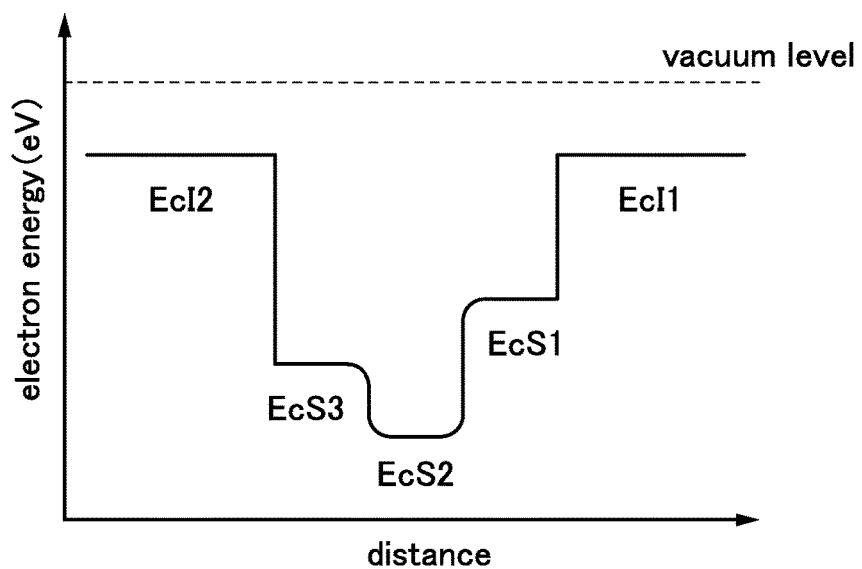

It can be seen from FIGS. 14A and 14B that the oxide layer 162, serves as a well and a channel of the transistor including the stacked oxide film 160 is formed in the oxide layer 162. Note that since the energies at the bottoms of the conduction bands are changed continuously, the structure of the stacked oxide film 160 can also be referred to as a U-shaped well. Further, a channel formed to have such a structure can also be referred to as a buried channel.

Since each of the oxide layer 161 and the oxide layer 163 is an oxide layer containing one or more kinds of metal elements forming the oxide layer 162, the stacked oxide film 160 can also be referred to as a stacked oxide film in which layers containing the same main components are stacked. The stacked oxide film in which layers containing the same main components are stacked is formed not simply by stacking layers but so as to have a continuous energy band (here, in particular, a well structure having a U shape in which energies at the bottoms of the conduction bands are changed continuously between any of the layers). This is because when impurities which form a defect state such as a trap center or a recombination center are mixed at each interface, the continuity of the energy band is lost, and thus carriers are trapped or disappear by recombination at the interface.

In order to form a continuous energy band, the layers need to be stacked successively without exposure to the air with the use of a multi-chamber deposition apparatus (a sputtering apparatus) including a load lock chamber. Each chamber in the sputtering apparatus is preferably subjected to high vacuum evacuation (to a vacuum of about $1\times10^{-4}$ Pa to $5\times10^{-7}$ Pa) with the use of a suction vacuum evacuation pump such as a cryopump in order to remove water or the like which is an impurity for an oxide semiconductor as much as possible. Alternatively, a turbo-molecular pump is preferably used in combination with a cold trap so that a gas does not flow backward from an evacuation system to a chamber.

In order to obtain a highly purified intrinsic oxide semiconductor, a chamber needs to be subjected to high vacuum evacuation, and in addition, a sputtering gas needs to be highly purified. When a highly purified gas having a dew point of −40° C. or lower, preferably −80° C. or lower, further preferably −100° C. or lower is used as an oxygen gas or an argon gas used as a sputtering gas, moisture or the like can be prevented from entering an oxide semiconductor as much as possible.

The oxide layer 161 and the oxide layer 163 each serve as a barrier layer and can prevent a trap level formed at an interface between the stacked oxide film 160 and each of the insulating layers which are in contact with the stacked oxide film 160 from adversely affecting the oxide layer 162 which serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. The oxide layers in which oxygen vacancies are less likely to be generated than in the oxide layer 162 are provided over and under and in contact with the oxide layer 162 in the stacked oxide film 160, whereby oxygen vacancies in the oxide layer 162 can be reduced. For example, in the oxide layer 162, the absorption coefficient due to the localized states, which is obtained by measurement by a constant photocurrent method (CPM), is set lower than $1\times10^{-3}$/cm, preferably lower than $1\times10^{-4}$/cm.

Note that the channel formation region means a region in the stacked oxide film 160 (the oxide layer 161, the oxide layer 162, and the oxide layer 163) that overlaps with the gate electrode 410. Note that when the n-type regions 403 can be formed in the stacked oxide film 160, a region of the stacked oxide film 160 that overlaps with the gate electrode 410 and is interposed between the n-type regions 403 serves as a channel formation region. The channel formation region is mainly formed in a region of the stacked oxide film 160 overlapping with the gate electrode 410 and depends on semiconductor characteristics of the stacked oxide film 160. Accordingly, the region of the stacked oxide film 160 overlapping with the gate electrode 410 serves as a channel formation region when the stacked oxide film 160 is an i-type region and does not serve as a channel formation region when the stacked oxide film 160 is an n-type region. Note that a channel refers to a main path through which current flows in the channel formation region.

In addition, when the oxide layer 162 is in contact with an insulating layer including a different constituent element (e.g., a base insulating layer including a silicon oxide film), an interface state is sometimes formed at the interface between the two layers and the interface state forms a channel. At this time, another transistor having a different threshold voltage appears, so that an apparent threshold voltage of the transistor is varied. However, since the oxide layer 161 contains one or more kinds of metal elements forming the oxide layer 162 in the stacked oxide film 160, an interface state is less likely to be formed at an interface between the oxide layer 161 and the oxide layer 162. Thus, the formation of the oxide layer 161 makes it possible to reduce fluctuation in the electric characteristics of the transistor, such as threshold voltage.

When a channel is formed at an interface between the gate insulating film 409 and the oxide layer 162, interface scattering occurs at the interface and the field-effect mobility of the transistor is decreased. However, since the oxide layer 163 contains one or more kinds of metal elements forming the oxide layer 162 in the stacked oxide film 160, scattering of carriers is less likely to occur at an interface between the oxide layer 163 and the oxide layer 162, and thus the field-effect mobility of the transistor can be increased.

Further, the oxide layer 161 and the oxide layer 163 each also serve as a barrier layer which inhibits formation of an impurity level due to the entry of the constituent elements of the insulating layers which are in contact with the stacked oxide film 160 into the oxide layer 162.

For example, when a silicon-containing insulating layer is used for the insulating layer which is in contact with the stacked oxide film 160, silicon in the insulating layer or carbon that might be mixed into the insulating layer can enter the oxide layer 161 or the oxide layer 163 to a depth of several nanometers from the interface. An impurity such as silicon, carbon, or the like entering the oxide semiconductor layer forms an impurity state. The impurity states serve as a donor and generates an electron, so that the oxide semiconductor layer may become n-type.

However, when the thicknesses of the oxide layer 161 and the oxide layer 163 are larger than several nanometers, the mixed impurity such as silicon or carbon does not reach the oxide layer 162, so that the influence of an impurity state is reduced.

Here, the concentration of silicon contained in the oxide layer 162 is set to be $3\times10^{18}$/cm$^3$ or lower, preferably $3\times10^{17}$/cm$^3$ or lower. In addition, the concentration of carbon in the oxide layer 162 is set to be $3\times10^{18}$/cm$^3$ or lower, preferably $3\times10^{17}$/cm$^3$ or lower. In particular, the oxide layer 162 serving as a carrier path is preferably sandwiched or surrounded by the oxide layer 161 and the oxide layer 163 in order to prevent entry of much silicon or carbon, which is a Group 14 element, to the oxide layer 162. That is, the concentrations of silicon and carbon contained in the oxide layer 162 are preferably lower than those in the oxide layer 161 and the oxide layer 163.

Note that the concentration of impurities in the oxide layer can be measured by secondary ion mass spectrometry (SIMS).

If hydrogen or moisture is contained in the oxide layer as an impurity, it can work as a donor and form an n-type region; therefore, in order to achieve a well-shaped structure, it is useful to provide a protective insulating layer (a silicon nitride layer or the like) for preventing entry of hydrogen or moisture from the outside, to the upper portion of the stacked oxide film 160.

Figure 15A:
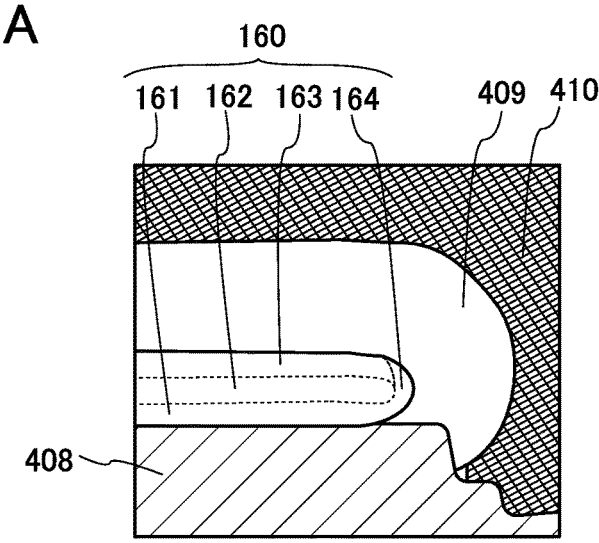
FIGS. 15A to 15C each illustrate an example of part of a cross-sectional structure of a stacked oxide film.
Figure 15B:
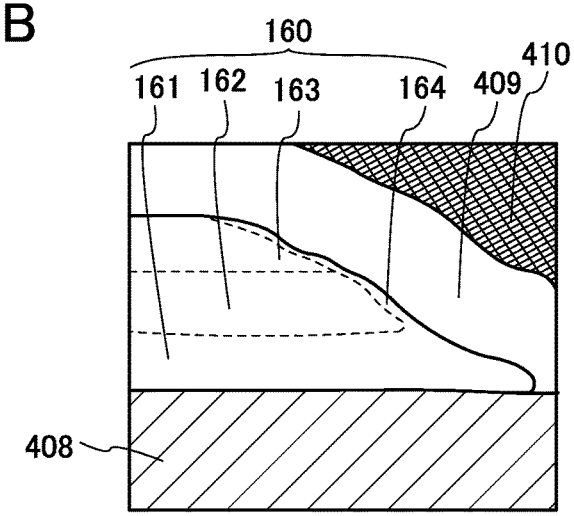
Figure 15C:
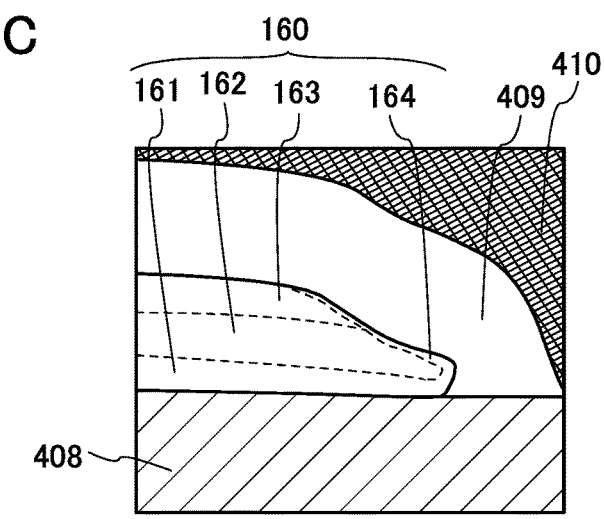

Furthermore, FIGS. 15A to 15C illustrate portions of cross-sectional structure examples of the stacked oxide film 160 in the channel width direction of the transistor. The stacked oxide film 160 includes the oxide layer 161 over the insulating film 408, the oxide layer 162 over the oxide layer 161, the oxide layer 163 over the oxide layer 162, and an oxide layer 164 that is in contact with the side surface of the oxide layer 161, the side surface of the oxide layer 162, and the side surface of the oxide layer 163. The oxide layer 162 is surrounded by the oxide layer 161, the oxide layer 163, and the oxide layer 164. In addition, the oxide layer 164 is in contact with the gate insulating film 409, and the gate electrode 410 is formed in contact with the gate insulating film 409.

The stacked oxide film 160 illustrated in FIG. 15A has a curved surface with one arbitrary curvature radius or a plurality of arbitrary curvature radii. In this case, at least a part of the surface of the oxide layer 164 in contact with the gate insulating film 409 is a curved surface. As illustrated in FIG. 15A, the gate electrode 410 may be in contact with the insulating film 408.

The oxide layer 164 includes, for example, a material that can be applied to the oxide layer 161. The oxide layer 164 is formed as follows: for example, when the oxide layer 161, the oxide layer 162, and the oxide layer 163 are etched by a dry etching method or the like, a reaction product of the oxide layer 161 is attached to the side surfaces of the oxide layer 162 and the oxide layer 163.

Note that the oxide layer 161, the oxide layer 163, and the oxide layer 164 cannot be strictly distinguished from each other in some cases. For that reason, the oxide layer 162 can be said to be surrounded by the oxide.

Alternatively, the stacked oxide film 160 may have a structure illustrated in FIG. 15B. The stacked oxide film 160 illustrated in FIG. 15B has an inclined (tapered angle) region at an end portion. By formation of the inclined (tapered angle) region at the end portion, the coverage with the gate insulating film 409 can be improved. Alternatively, a structure in which part of the tapered region is cut as illustrated in FIG. 15C may be employed.

As described above, the above-described transistor includes the stacked oxide film which includes the oxide semiconductor film and the oxide layers formed over and under and in contact with the oxide semiconductor film, and in the cross section of the stacked oxide film, the stacked oxide film has a curved surface or an inclined region. Because the cross-section of the stacked oxide film has a curved surface or an inclined region, the coverage of the stacked oxide film with a layer to be formed thereover can be improved. Accordingly, a film can be formed uniformly over the stacked oxide film, and thus, entry of an impurity element into the stacked oxide film from a region with low film density or a region without the film formed can be inhibited so that deterioration of electric characteristics of the transistor can be prevented. Therefore, a transistor having stable characteristics can be provided.

As described above, an oxide is provided to be in contact with an oxide semiconductor to form a stacked oxide film including the oxide semiconductor and the oxide, whereby it is possible to prevent an impurity such as hydrogen or moisture or an impurity contained in an insulating film in contact with the oxide semiconductor from entering the oxide semiconductor film and forming a carrier.

[4-3. Structure Example of Semiconductor Device Including Transistor]

A structure example of a semiconductor device including the above-described transistor is described.

Figure 16:
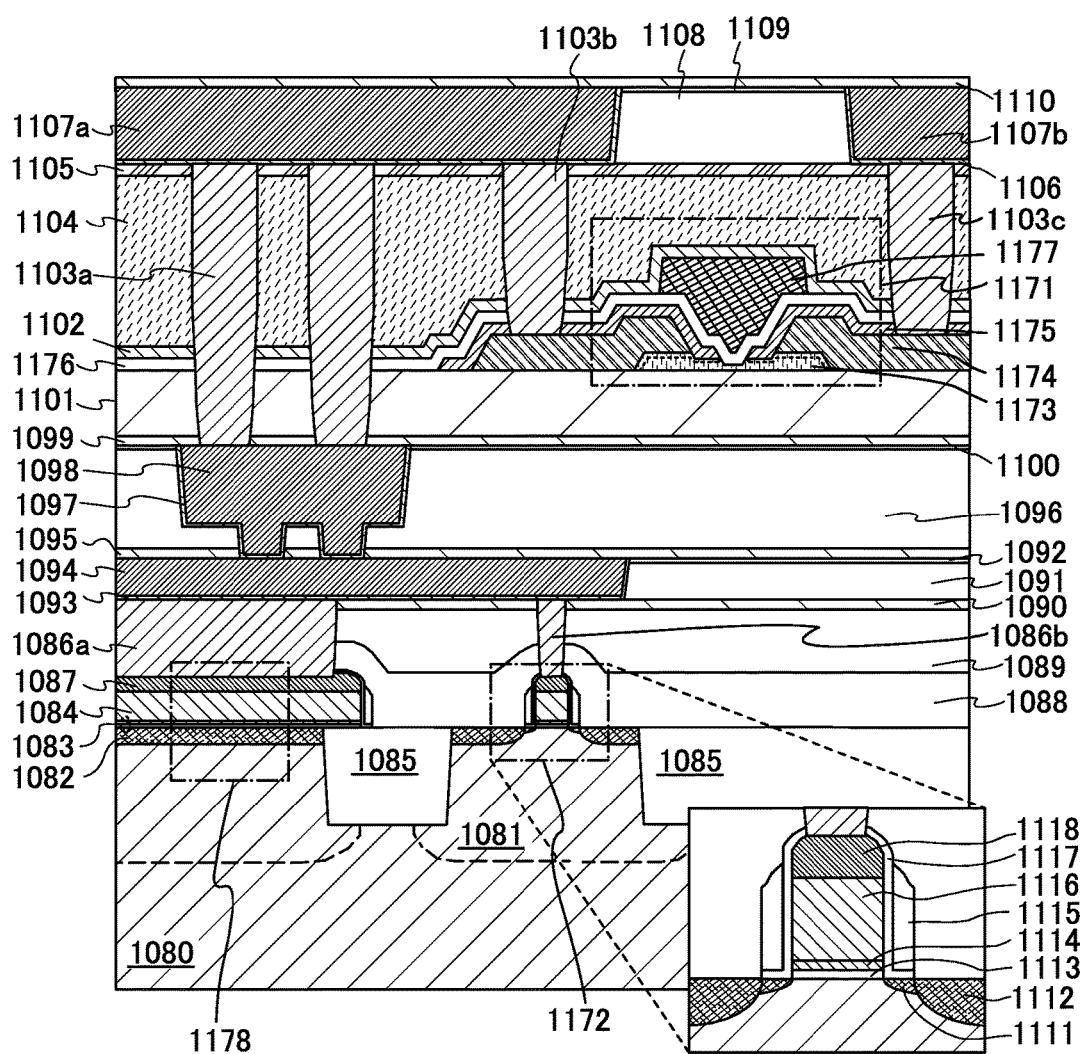
FIG. 16 illustrates an example of a cross-sectional structure of a semiconductor device.

FIG. 16 illustrates an example of a cross-sectional structure of a semiconductor device. The semiconductor device in FIG. 16 includes a transistor 1172, a transistor 1171 provided over the transistor 1172 with an insulating film or the like therebetween, and a capacitor 1178.

In this embodiment, a semiconductor device is described which has a structure where a semiconductor material is used for the transistor 1172 in a lower portion, an oxide film is used for the transistor 1171 in an upper portion, and a semiconductor substrate is used as the semiconductor material.

FIG. 16 illustrates one example of a cross-sectional structure of the semiconductor device in which a transistor including a semiconductor material is provided in a lower portion and a transistor including the oxide film in one embodiment of the present invention is provided in an upper portion. Here, different materials are used as the semiconductor material and the oxide film in one embodiment of the present invention. For example, the semiconductor material can be a semiconductor material other than an oxide or an oxide semiconductor. As the semiconductor material other than an oxide or an oxide semiconductor, for example, silicon, germanium, silicon germanium, silicon carbide, gallium arsenide, or the like can be used, and a single crystal semiconductor is preferably used. A transistor formed using a single crystal semiconductor can operate at high speed easily. On the other hand, the transistor including the oxide film can be used in a circuit utilizing a characteristic that is significantly low off-state current of about several yoctoamperes per micrometer (yA/µm) to several zeptoamperes per micrometer (zA/µm). Accordingly, the semiconductor device illustrated in FIG. 16 can be used to form a logic circuit with low power consumption, for example. Alternatively, an organic semiconductor material or the like may be used as the semiconductor material.

Although not illustrated, a silicon-on-insulator (SOI) substrate may be used instead of the semiconductor substrate.

The SOI substrate (also referred to as SOI wafer) includes a semiconductor substrate, a buried oxide film (also referred to as a buried oxide (BOX) layer) over the semiconductor substrate, and a semiconductor film (hereinafter referred to as an SOI layer) over the buried oxide film. As the SOI substrate, any of the following substrates can be used as appropriate: a SIMOX (Separation by IMplanted OXgen (a registered trademark of SUMCO TECHXIV Corporation) substrate in which a BOX layer and an SOI layer are formed by implanting oxygen ions to a predetermined depth of a silicon substrate and performing high-temperature treatment; an ELTRAN (Epitaxial Layer TRANsfer (a registered trademark of Canon Inc.) substrate formed using a porous silicon layer by anodization; a UNIBOND (a registered trademark of Soitec) substrate in which an SOI layer is formed by implanting hydrogen ions into a substrate (device wafer) provided with a thermal oxide film to form a weakened layer, bonding the substrate to another silicon substrate (handle wafer), and then separating the handle wafer from the weakened layer through heat treatment; and the like.

Note that the SOI substrate generally refers to a substrate in which an SOI layer made of a silicon thin film is provided over a silicon substrate with a BOX layer provided therebetween, but without limitation to silicon, another single crystal semiconductor material may be used. In addition, the SOI substrate includes, in its category, a substrate having a structure in which a semiconductor layer is provided over an insulating substrate such as a glass substrate with an insulating layer provided therebetween.

In the case of using the SOI substrate instead of the semiconductor substrate, the SOI layer is used for a channel region of the transistor in the lower portion. Compared with a transistor formed using a bulk silicon substrate, a transistor formed using an SOI substrate has many advantages such as small parasitic capacitance due to the presence of a BOX layer, low probability of soft errors caused by incidence of a rays or the like, no occurrence of latch-up caused by formation of a parasitic transistor, and easy element isolation.

The SOI layer includes a single crystal semiconductor such as single crystal silicon. Therefore, when the SOI layer is used for the transistor in the lower portion, the operation speed of the semiconductor device can be increased.

The transistor 1172 in FIG. 16 corresponds to the transistor 242 in FIG. 7 or the transistor 1072 in FIGS. 10A and 10B, for example. Either an n-channel transistor (NMOSFET) or a p-channel transistor (PMOSFET) can be used as the transistor 1172. In the example illustrated in FIG. 16, the transistor 1172 is electrically isolated from other elements by a shallow trench isolation (STI) region 1085. The use of the STI region 1085 can reduce the generation of a bird's beak in an element isolation region, which is caused in an LOCOS element isolation method, and can reduce the size of the element isolation region. On the other hand, in a semiconductor device which is not required to be structurally miniaturized or downsized, the STI region 1085 is not necessarily formed, and an element isolation means such as LOCOS can be used. Note that a well 1081 is formed within the STI region 1085 in order to control the threshold voltage of the transistor 1172.

The transistor 1172 in FIG. 16 includes a channel formation region provided in a substrate 1080, impurity regions 1112 (also referred to as a source region and a drain region) provided such that the channel formation region is sandwiched therebetween, gate insulating films 1113 and 1114 provided over the channel formation region, and gate electrodes 1116 and 1118 provided over the gate insulating films 1113 and 1114 so as to overlap with the channel formation region. A gate electrode can have, but is not limited to, a stacked structure of the gate electrode 1116 including a first material for increasing processing accuracy and the gate electrode 1118 including a second material for decreasing the resistance as a wiring; the material, the number of stacked layers, the shape, or the like can be adjusted as appropriate for required specifications. Note that a transistor whose source electrode and drain electrode are not illustrated in a drawing may also be referred to as a transistor for the sake of convenience.

Further, although not illustrated, contact plugs are connected to the impurity regions 1112 provided in the substrate 1080. Here, the contact plugs also function as a source electrode and a drain electrode of the transistor 1172 or the like. In addition, impurity regions 1111 which are different from the impurity regions 1112 are provided between the impurity regions 1112 and the channel formation region. The impurity regions 1111 function as LDD regions or extension regions for controlling the distribution of an electric field in the vicinity of the channel formation region, depending on the concentration of an impurity introduced thereto. A sidewall insulating film 1115 is provided at the side of the gate electrodes 1116 and 1118 with an insulating film 1117 provided therebetween. By using the insulating film 1117 and the sidewall insulating film 1115, the LDD regions or extension regions can be formed.

The transistor 1172 is covered with an interlayer insulating film 1088. The interlayer insulating film 1088 can function as a protective film and can prevent impurities from entering the channel formation region from the outside. In addition, when the interlayer insulating film 1088 is formed using a material such as silicon nitride by a CVD method, in the case where single crystal silicon is used for the channel formation region, hydrogenation can be performed by heat treatment. When an insulating film having tensile stress or compressive stress is used as the interlayer insulating film 1088, distortion can be caused in the semiconductor material in the channel formation region. By subjecting a silicon material in the channel formation region to tensile stress in the case of an n-channel transistor or subjecting a silicon material in the channel formation region to compressive stress in the case of a p-channel transistor, the mobility of the transistor can be improved.

Note that the transistor 1172 illustrated in FIG. 16 may have a fin-type structure (also referred to as a tri-gate structure or an Ω-gate structure). The fin-type structure refers to a structure in which part of a semiconductor substrate is processed into a plate-like projection and a gate electrode is provided so as to cross the longitudinal direction of the projection. The gate electrode covers the upper surface and the side surface of the projection with a gate insulating film provided therebetween. When the transistor 1172 has the fin-type structure, the channel width can be decreased so that the degree of integration of transistors can be increased. In addition, the transistor can allow more current to flow and can have higher control efficiency; thus, the off-state current and threshold voltage of the transistor can be lowered.

The capacitor 1178 is formed by a stacked layer of an impurity region 1082 which is provided in the substrate 1080, electrodes 1084 and 1087, and an insulating film 1083 which is provided therebetween and serves as a dielectric film. Here, the insulating film 1083 is formed using the same materials as the gate insulating films 1113 and 1114 of the transistor 1172, and the electrodes 1084 and 1087 are formed using the same materials as the gate electrodes 1116 and 1118 of the transistor 1172. The impurity region 1082 can be formed at the same timing as the impurity regions 1112 of the transistor 1172.

The transistor 1171 in FIG. 16 corresponds to the transistor 240 in FIG. 7 or the transistor 1071 in FIGS. 10A and 10B, for example. The transistor 1171 includes an oxide film 1173 over a base insulating film 1101, a pair of conductive layers 1174 in contact with the oxide film 1173, a conductive layer 1175 in contact with upper and side surfaces of the conductive layers 1174, and a conductive layer 1177 overlapping with the oxide film 1173 with an insulating film 1176 provided therebetween.

The transistor 1171 is electrically connected to a transistor including a semiconductor material such as the transistor 1172 in a lower layer, depending on a necessary circuit configuration. FIG. 16 illustrates, as one example, a structure in which a source or a drain of the transistor 1171 is electrically connected to the gate of the transistor 1172.

The conductive layers 1174 may function as source and drain electrodes of the transistor 1171. For the pair of conductive layers 1174, a conductive material which is easily bonded to oxygen can be used. For example, Al, Cr, Cu, Ta, Ti, Mo, or W can be used. In particular, W with a high melting point is preferably used, which allows subsequent process temperatures to be relatively high. Note that the conductive material which is easily bonded to oxygen includes, in its category, a material to which oxygen is easily diffused or transferred.

When the conductive material which is easily bonded to oxygen is in contact with the oxide layer, a phenomenon occurs in which oxygen included in the oxide layer is diffused or transferred into the conductive material which is easily bonded to oxygen. Since the formation process of the transistor involves some heat treatment steps, the above phenomenon causes generation of oxygen vacancies in regions of the oxide semiconductor layer, which are in contact with the source electrode layer and the drain electrode layer, and the regions are changed into n-type regions. Thus, the n-type regions can serve as a source and a drain of the transistor.

When a transistor having a short channel length is formed, the n-type region due to generation of oxygen vacancies might extend in the channel length direction of the transistor. In that case, electric characteristics of the transistor change; for example, the threshold voltage shifts or on/off of the transistor cannot be controlled with the gate voltage (i.e., the transistor is on). Accordingly, when a transistor with a short channel length is formed, it is not preferable that the conductive material which is easily bonded to oxygen be used for the source electrode and the drain electrode.

Thus, in one embodiment of the present invention, the source electrode layer and the drain electrode layer have stacked-layer structures, and the pair of conductive layers 1175, which determine the channel length, are formed using a conductive material which is not easily bonded to oxygen. As the conductive material, for example, a conductive nitride such as tantalum nitride or titanium nitride, or ruthenium is preferably used. Note that the conductive material which is not easily bonded to oxygen includes, in its category, a material to which oxygen is not easily diffused or transferred.

By the use of the above conductive material which is not easily bonded to oxygen for the pair of conductive layers 1175, generation of oxygen vacancies in the channel formation region of the oxide film 1173 can be suppressed, so that change of the channel to an n-type region can be suppressed. In this manner, even a transistor with a short channel length can have favorable electric characteristics.

In the case where the source electrode layer and the drain electrode layer are formed using only the above conductive material which is not easily bonded to oxygen, the contact resistance with the oxide film 1173 becomes too high; thus, it is preferable that the pair of conductive layers 1174 be formed over the oxide film 1173 and the conductive layer 1175 be formed so as to cover the conductive layers 1174.

The insulating film 1176 may function as a gate insulating film. The insulating film 1176 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 1176 may be a stacked layer including any of the above materials.

The conductive layer 1177 may function as a gate electrode. For the conductive layer 1177, a conductive film of Al, Ti, Cr, Co, Ni, Cu, Y, Zr, Mo, Ru, Ag, Ta, W, or the like can be used. The conductive layer 1177 may be a stacked layer including any of the above materials.

For an insulating film 1102, a material in which oxygen is hardly diffused or transferred may be used. Further, a material containing little hydrogen when formed into a film is preferably used for the insulating film 1102. The hydrogen content of the insulating film 1102 is preferably lower than $5 \times 10^{19}/cm^3$, further preferably lower than $5 \times 10^{18}/cm^3$. When the hydrogen content of the insulating film 1102 has the above value, an off-state current of the transistor can be low. For example, a silicon nitride film or a silicon nitride oxide film is preferably used as the insulating film 1102.

The transistor 1171 has a short channel length of more than or equal to 5 nm and less than 60 nm, preferably more than or equal to 10 nm and less than or equal to 40 nm. Since the oxide film is used for the channel formation region, the transistor 1171 exhibits no or quite little short-channel effect and shows favorable electric characteristics as a switching element.

Since the off-state current of the transistor 1171 is low, the use of the transistor enables stored data to be held for a long time. In other words, it is possible to obtain a memory device which does not require refresh operation or has an extremely low frequency of the refresh operation, which leads to a sufficient reduction in power consumption.

One of the source and the drain of the transistor 1171 is connected to a wiring 1107a which is formed above the transistor 1171, through a contact plug 1103b which penetrates the insulating film 1102, an interlayer insulating film 1104, and an interlayer insulating film 1105 provided over the transistor 1171.

Here, contact plugs (also referred to as connecting conductive portions, embedded plugs, or simply plugs) 1086a, 1086b, 1103a, 1103b, 1103c, and the like each have a columnar or wall shape. The contact plugs are each formed by filling an opening (via) provided in an interlayer insulating film with a conductive material. As the conductive material, a conductive material with high embeddability such as tungsten or polysilicon can be used. Although not illustrated, a side surface and a bottom surface of the material can be covered with a barrier film (a diffusion prevention film) of a titanium film, a titanium nitride film, a stacked-layer film of these films, or the like. In this case, the barrier film is regarded as part of the contact plug.

For example, the bottom surfaces of the contact plugs 1103b and 1103c are connected to the upper surface of the conductive layers 1174. However, the connection of the contact plugs 1103b and 1103c to the conductive layers 1174 is not limited to this connection structure. For example, the contact plugs 1103b and 1103c may penetrate the conductive layers 1174 and the bottom surfaces of the contact plugs 1103b and 1103c may be in contact with the upper surface of the base insulating film 1101. In this case, the connection of the contact plugs 1103b and 1103c to the conductive layers 1174 is made at the side surfaces of the contact plugs 1103b and 1103c. This allows the conductive layers 1174 and the contact plugs 1103b and 1103c to have better electrical contacts. Furthermore, the contact plugs 1103b and 1103c may penetrate into the base insulating film 1101.

Note that one contact plug is used for electrical connection between the conductive layer 1174 and the wiring 1107a or a wiring 1107b in FIG. 16. However, in order to decrease the contact resistance between the contact plug and the conductive layer 1174 or the wiring, a plurality of contact plugs arranged side by side may be used or a contact plug with a large diameter may be used.

Since the contact plugs are formed using a mask, the contact plugs can be formed in any desired position. Alternatively, when the contact plug is provided in contact with a sidewall insulating film 1119, element miniaturization can be achieved.

A wiring 1094, a wiring 1098, and the wirings 1107a and 1107b are embedded in an interlayer insulating film 1091, an interlayer insulating film 1096, and an interlayer insulating film 1108, respectively. For the wirings 1094, 1098, 1107a, and 1107b, it is preferable to use a low-resistance conductive material such as copper or aluminum. By using a low-resistance conductive material, RC delay of signals transmitted through the wirings 1094, 1098, 1107a, and 1107b can be reduced. In the case of using copper for the wirings 1094, 1098, 1107a, and 1107b, barrier films 1093, 1097, and 1106 are formed in order to prevent copper from diffusing into the channel formation regions. The barrier films can each be formed using a film of tantalum nitride, a stacked-layer film of tantalum nitride and tantalum, a film of titanium nitride, a stacked-layer film of titanium nitride and titanium, or the like for example, but are not limited to the films of these materials as long as their function of preventing diffusion of the wiring material and their adhesion to the wiring material, a base film, or the like are secured. The barrier films 1093, 1097, and 1106 may be formed as layers that are separate from the wirings 1094, 1098, 1107a, and 1107b, or may be formed in such a manner that a barrier film material contained in a wiring material is separated out by heat treatment to the inner walls of the openings provided in the interlayer insulating films 1091, 1096, and 1108.

For the interlayer insulating films 1091, 1096, and 1108, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wirings are embedded in the interlayer insulating films, the interlayer insulating films need to have high mechanical strength. As long as their mechanical strength can be secured, the interlayer insulating films can be made porous to have a lower dielectric constant. The interlayer insulating films 1091, 1096, and 1108 are formed by a sputtering method, a CVD method, a coating method including a spin coating method (also referred to as spin on glass (SOG)), or the like.

Interlayer insulating films 1092, 1100, and 1109 may be provided over the interlayer insulating films 1091, 1096, and 1108. The interlayer insulating films 1092, 1100, and 1109 function as etching stoppers when planarization treatment by CMP or the like is performed after the wiring material is embedded in the interlayer insulating films 1091, 1096, and 1108.

Barrier films 1095, 1099, and 1110 are provided over the wirings 1094, 1098, 1107a, and 1107b in order to prevent diffusion of the wiring material such as copper. The barrier films 1095, 1099, and 1110 may be formed not only over the wirings 1094, 1098, 1107a, and 1107b but also over the interlayer insulating films 1091, 1096, and 1108. The barrier films 1095, 1099, and 1110 can be formed using an insulating material such as silicon nitride, SiC, or SiBON. Note that in the case where the barrier films 1095, 1099, and 1110 have a large thickness, which causes an increase in capacitance between wirings, it is preferable to select a material having barrier properties and a low dielectric constant.

The wiring 1098 includes an upper wiring portion and a lower via hole portion. The lower via hole portion is connected to the wiring 1094 in a lower layer. The wiring 1098 having this structure can be formed by a so-called dual damascene method or the like. Wirings in upper and lower layers may be connected using a contact plug instead of the dual damascene method.

The wiring 1094 is provided over the transistor 1172 and the capacitor 1178. The electrodes 1084 and 1087 serving as an upper electrode of the capacitor are electrically connected to the wiring 1094 through the contact plug 1086a which penetrates the interlayer insulating film 1088 and interlayer insulating films 1089 and 1090. The gate electrode of the transistor 1172 is electrically connected to the wiring 1094 through the contact plug 1086b which penetrates the interlayer insulating films 1088, 1089, and 1090. On the other hand, the one of the source and the drain of the transistor 1171 formed using the oxide film for the channel is electrically connected to the wiring 1107a in an upper layer through the contact plug 1103b which penetrates the insulating film and the interlayer insulating films, and the wiring 1107a is electrically connected to the wiring 1098 through the contact plug 1103a which penetrates the insulating film, the interlayer insulating films, and the base insulating film 1101. The wiring 1098 is electrically connected to the wiring 1094 in a lower layer. Accordingly, the one of the source and the drain of the transistor 1171 is electrically connected to the upper electrode of the capacitor 1178 and the gate electrode of the transistor 1172.

Note that the electrical connection between wirings using a contact plug may be established using a plurality of contact plugs, like the connection between the wiring 1098 and the wiring 1107a illustrated in FIG. 16, or may be established using a wall-shaped contact plug, like the connection between the electrodes 1084 and 1087 and the wiring 1094.

The above electrical connections are mere examples, and elements may be connected using a wiring different from the above wirings. For example, in FIG. 16, two wiring layers are provided between the transistor 1171, the transistor 1172, and the capacitor 1178, but one wiring layer or three or more wiring layers may be provided. Alternatively, without wirings, elements may be directly and electrically connected to each other through a plurality of plugs connected vertically. Furthermore, in FIG. 16, the wirings 1094 and 1098 are formed by a damascene method (the wiring 1098 is formed by a so-called dual damascene method), but may be formed by another method.

Note that the capacitor 1178 may be omitted in the case where a capacitor is not needed. Furthermore, the capacitor 1178 may be separately provided above the transistor 1172 or above the transistor 1171.

Although not illustrated, a metal oxide film of aluminum oxide, aluminum oxynitride, gallium oxide, gallium oxynitride, yttrium oxide, yttrium oxynitride, hafnium oxide, hafnium oxynitride, or the like which has a blocking effect against oxygen, hydrogen, water, or the like is preferably provided between the base insulating film 1101 and the barrier film 1099 which functions as an impurity diffusion prevention film for the wiring 1098.

In FIG. 16, the transistor 1171 is provided to overlap with at least part of the transistor 1172. The source region or the drain region of the transistor 1171 is preferably provided to overlap with part of the oxide film. The transistor 1171 may be provided to overlap with the capacitor 1178. When such a planar layout is employed, the area occupied by the semiconductor device can be reduced; thus, the degree of integration can be increased.

Note that although FIG. 16 shows an example where the transistor 1171 and the capacitor 1178 are provided in different layers, one embodiment of the present invention is not limited to this structure. For example, the transistor 1171 and the capacitor 1178 may be provided in the same plane, which enables a data holding portion having the same structure to be stacked over a data holding portion. Accordingly, the degree of integration of the semiconductor device can be improved.

As described above, the transistor 1172 provided in a lower portion of the semiconductor device by using a semiconductor material is electrically connected to the transistor 1171 provided in an upper portion by using the oxide film in one embodiment of the present invention, through a plurality of contact plugs and a plurality of wirings. With the above-described structure in which the transistor including a semiconductor material and being capable of operating at high speed is combined with the transistor including the oxide film in one embodiment of the present invention and having significantly low off-state current, a semiconductor device including a logic circuit capable of operating at high speed with low power consumption can be manufactured.

In addition, since data can be held for a long time and data writing does not require high voltage as compared to the case of a flash memory, a semiconductor device including a memory circuit capable of operating at high speed with low power consumption can be manufactured.

Such a semiconductor device is not limited to the above structure and can be changed as desired unless it deviates from the spirit of the present invention. For example, in the above description, two wiring layers are provided between the transistor including a semiconductor material and the transistor including the oxide film in one embodiment of the present invention, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an interlayer insulating film as a wiring, but a wiring having a three-layer structure of a barrier film, a wiring material layer, and a barrier film (the films are stacked in this order), for example, may be obtained by patterning through a photolithography process.

In the case where a copper wiring is formed in a tier between the transistor 1172 including a semiconductor material and the transistor 1171 including the oxide film in one embodiment of the present invention, it is particularly necessary to take into consideration the influence of heat treatment performed in the process for manufacturing the transistor 1171 including the oxide film in one embodiment of the present invention. In other words, it is necessary to take care that the temperature of heat treatment performed in the process for manufacturing the transistor 1171 including the oxide film in one embodiment of the present invention is appropriate to the properties of the wiring material. This is because, in the case where high-temperature heat treatment is performed on a component of the transistor 1171 for example, thermal stress is caused in the copper wiring, leading to a problem such as stress migration.

Here, when a memory having the structure illustrated in FIG. 16 is manufactured and any of the transistors including an oxide film described above is used as the transistor 1171, charge accumulated in the node 1079 can be prevented from leaking through the transistor 1171 because the off-state current of the transistor is extremely small. Therefore, data can be held for a long period. Further, a voltage necessary for writing data does not need to be high as compared to the case of a flash memory; thus, power consumption can be made lower and operation speed can be made higher.

Note that the structure illustrated in FIG. 16 can be used in a unit or a device other than the MCU and the memory device.

<<5. Secondary Battery, Capacitor>>

As an example of a secondary battery, a nonaqueous secondary battery typified by a lithium-ion secondary battery is described.

[5-1. Positive Electrode]

Figure 17A:
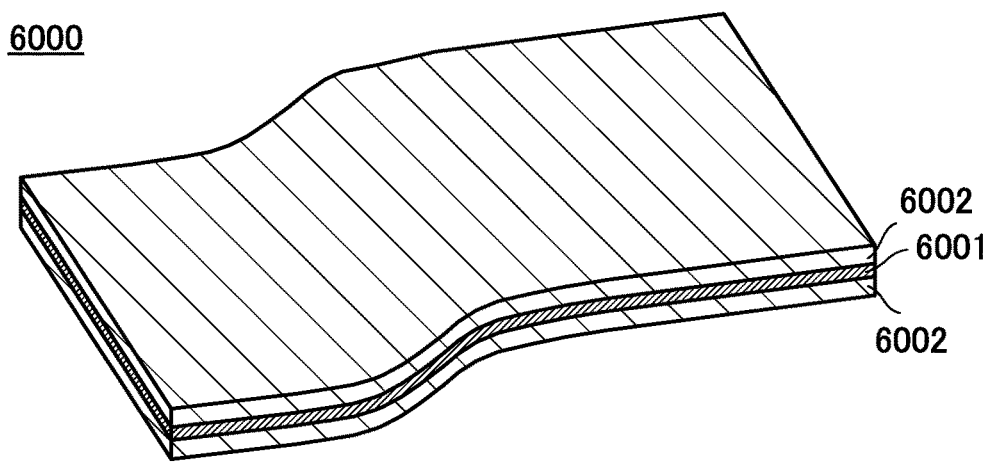
FIGS. 17A and 17B illustrate a positive electrode of a secondary battery.

First, a positive electrode of a secondary battery is described with reference to FIGS. 17A and 17B.

A positive electrode 6000 includes a positive electrode current collector 6001 and a positive electrode active material layer 6002 formed over the positive electrode current collector 6001 by a coating method, a CVD method, a sputtering method, or the like, for example. Although an example of providing the positive electrode active material layer 6002 on both surfaces of the positive electrode current collector 6001 with a sheet shape (or a strip-like shape) is illustrated in FIG. 17A, one embodiment of the present invention is not limited to this example. The positive electrode active material layer 6002 may be provided on one of the surfaces of the positive electrode current collector 6001. Further, although the positive electrode active material layer 6002 is provided entirely over the positive electrode current collector 6001 in FIG. 17A, one embodiment of the present invention is not limited thereto. The positive electrode active material layer 6002 may be provided over part of the positive electrode current collector 6001. For example, a structure may be employed in which the positive electrode active material layer 6002 is not provided in a portion where the positive electrode current collector 6001 is connected to a positive electrode tab.

The positive electrode current collector 6001 can be formed using a material that has high conductivity and is not alloyed with a carrier ion of lithium or the like, such as a metal typified by gold, platinum, aluminum, or titanium, or an alloy thereof (e.g., stainless steel). The positive electrode current collector 6001 can be formed using an aluminum alloy to which an element which improves heat resistance, such as silicon, titanium, neodymium, scandium, or molybdenum, is added. The positive electrode current collector 6001 can have a foil-like shape, a sheet-like shape, a plate-like shape, a net-like shape, a punching-metal shape, an expanded-metal shape, or the like, as appropriate. The positive electrode current collector 6001 preferably has a thickness of greater than or equal to 10 μm and less than or equal to 30 μm.

Figure 17B:
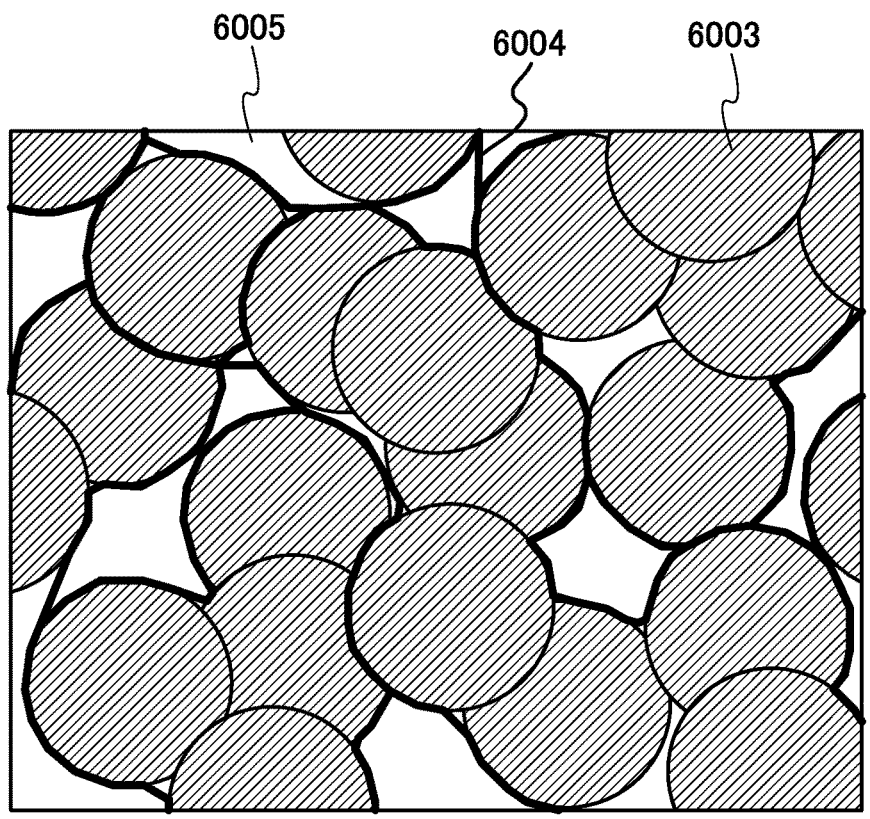

FIG. 17B is a schematic view illustrating the longitudinal cross-sectional view of the positive electrode active material layer 6002. The positive electrode active material layer 6002 includes particles of a positive electrode active material 6003, graphene 6004 as a conductive additive, and a binder 6005 (binding agent).

Examples of the conductive additive are acetylene black (AB) and graphite (black lead) particles in addition to graphene described later. Here, the positive electrode active material layer 6002 using the graphene 6004 is described as an example.

The positive electrode active material 6003 is in the form of particles made of secondary particles having average particle diameter or particle diameter distribution, which is obtained in such a way that material compounds are mixed at a predetermined ratio and baked and the resulting baked product is crushed, granulated, and classified by an appropriate means. Therefore, the positive electrode active material 6003 is schematically illustrated as spheres in FIG. 17B; however, the shape of the positive electrode active material 6003 is not limited to this shape.

As the positive electrode active material 6003, a material into and from which carrier ions such as lithium ions can be inserted and extracted is used.

For example, an olivine-type lithium-containing composite phosphate (general formula $LiMPO_4$ (M is one or more of Fe(II), Mn(II), Co(II), and Ni(II))) can be used. Typical examples of the general formula $LiMPO_4$ which can be used as the positive electrode active material are lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1).

Alternatively, a composite oxide such as a general formula $Li_{(2-j)}MSiO_4$ (M is one or more of Fe(II), Mn(II), Co(II), and Ni(II); 0≤j≤2) can be used. Typical examples of the general formula $Li_{(2-j)}MSiO_4$ which can be used as the positive electrode active material are compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ (k+l≤1, 0<k<1, and 0<l<1), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ (m+n+q≤1, 0<m<1, 0<n<1, and 0<q<1), and $Li_{(2-j)}Fe_rNi_sCo_tMn_uSiO_4$ (r+s+t+u≤1, 0<r<1, 0<s<1, 0<t<1, and 0<u<1).

Examples of a composite oxide with a layered rock-salt crystal structure which can be used as the composite oxide are lithium cobalt oxide ($LiCoO_2$); $LiNiO_2$; $LiMnO_2$; $Li_2MnO_3$; an NiCo-based composite oxide (a general formula thereof is $LiNi_xCo_{1-x}O_2$ (0<x<1)) such as $LiNi_{0.8}Co_{0.2}O_2$; an NiMn-based composite oxide (a general formula thereof is $LiNi_xMn_{1-x}O_2$ (0<x<1)) such as $LiNi_{0.5}Mn_{0.5}O_2$; and an NiMnCo-based lithium-containing composite oxide (also referred to as NMC, and a general formula thereof is $LiNi_xMn_yCo_{1-x-y}O_2$ (x>0, y>0, x+y<1)) such as $LiNi_{1/3}Mn_{1/3}Co_{1/3}O_2$.

Further alternatively, for the positive electrode active material 6003, any of various compounds other than the above, for example, an active material having a spinel crystal structure such as $LiMn_2O_4$ and an active material having an inverse spinel crystal structure such as $LiMVO_4$ can be used.

In the case where carrier ions are alkali metal ions other than lithium ions, alkaline-earth metal ions such as beryllium ions or magnesium ions, the positive electrode active material 6003 may contain, instead of lithium in the compound and the oxide, an alkali metal (e.g., sodium or potassium), an alkaline-earth metal (e.g., calcium, strontium, barium, beryllium, or magnesium).

Note that although not illustrated, a carbon layer may be provided on a surface of the positive electrode active material 6003. With a carbon layer, conductivity of an electrode can be increased. The positive electrode active material 6003 can be coated with the carbon layer by mixing a carbohydrate such as glucose at the time of baking the positive electrode active material.

In addition, the graphene 6004 which is added to the positive electrode active material layer 6002 as a conductive additive can be formed by performing reduction treatment on graphene oxide.

Here, graphene in this specification includes single-layer graphene and multilayer graphene including two to a hundred layers. Single-layer graphene refers to a sheet of one atomic layer of carbon molecules having π bonds. Graphene oxide refers to a compound formed by oxidation of such graphene. Note that when graphene oxide is reduced to form graphene, oxygen contained in graphene oxide is not entirely released and part of oxygen remains in graphene. When graphene contains oxygen, the ratio of oxygen measured by XPS in graphene is higher than or equal to 2 atomic % and lower than or equal to 20 atomic %, preferably higher than or equal to 3 atomic % and lower than or equal to 15 atomic %.

In the case where graphene is multilayer graphene and is formed by reducing graphene oxide here, the interlayer distance of graphene is greater than or equal to 0.34 nm and less than or equal to 0.5 nm, preferably greater than or equal to 0.38 nm and less than or equal to 0.42 nm, more preferably greater than or equal to 0.39 nm and less than or equal to 0.41 nm. Graphite generally includes single-layer graphene with an interlayer distance of 0.34 nm. On the other hand, graphene used for the secondary battery in one embodiment of the present invention has longer interlayer distance than that of graphite; therefore, carrier ions can be easily transferred between layers of multilayer graphene.

Graphene oxide can be formed by an oxidation method called a Hummers method, for example.

The Hummers method is as follows: a sulfuric acid solution of potassium permanganate, a hydrogen peroxide solution, and the like are mixed into graphite powder to cause oxidation reaction; thus, a dispersion liquid including graphite oxide is formed. Through the oxidation of carbon of graphite, functional groups such as an epoxy group, a carbonyl group, a carboxyl group, or a hydroxyl group are bonded in graphite oxide. Accordingly, the interlayer distance between a plurality of graphenes in graphite oxide is longer than the interlayer distance in graphite, so that graphite oxide can be easily separated into thin pieces by interlayer separation. Then, ultrasonic vibration is applied to the mixed solution containing graphite oxide, so that graphite oxide whose interlayer distance is long can be cleaved to separate graphene oxide and to form a dispersion liquid containing graphene oxide. A solvent is removed from the dispersion liquid containing graphene oxide, so that powdery graphene oxide can be obtained.

Note that the method for forming graphene oxide is not limited to the Hummers method using a sulfuric acid solution of potassium permanganate; for example, the Hummers method using nitric acid, potassium chlorate, nitric acid sodium, potassium permanganate, or the like or a method for forming graphene oxide other than the Hummers method may be employed as appropriate.

Graphite oxide may be separated into thin pieces by application of ultrasonic vibration, by irradiation with microwaves, radio waves, or thermal plasma, or by application of physical stress.

The formed graphene oxide includes an epoxy group, a carbonyl group, a carboxyl group, a hydroxyl group, or the like. In graphene oxide, oxygen in a functional group is negatively charged in a polar solvent typified by NMP (also referred to as N-methylpyrrolidone, 1-methyl-2-pyrrolidone, N-methyl-2-pyrrolidone, or the like); therefore, while interacting with NMP, the graphene oxide repels other graphene oxides and is hardly aggregated. Accordingly, in a polar solvent, graphene oxides can be easily dispersed uniformly.

The length of one side (also referred to as a flake size) of graphene oxide is preferably greater than or equal to 50 nm and less than or equal to 100 μm, more preferably greater than or equal to 800 nm and less than or equal to 20 μm.

As in the cross-sectional view of the positive electrode active material layer 6002 in FIG. 17B, the plurality of particles of the positive electrode active material 6003 are coated with the plurality of graphenes 6004. The sheet-like graphene 6004 is connected to the plurality of particles of the positive electrode active material 6003. In particular, since the graphenes 6004 are in the form of a sheet, surface contact can be made in such a way that part of surfaces of the particles of the positive electrode active material 6003 is wrapped with the graphenes 6004. Unlike a conductive additive in the form of particles, such as acetylene black, which makes point contact with a positive electrode active material, the graphenes 6004 are capable of surface contact with low contact resistance; accordingly, the electron conductivity of the particles of the positive electrode active material 6003 and the graphenes 6004 can be improved without an increase in the amount of conductive additives.

Further, surface contact is made between the plurality of graphenes 6004. This is because graphene oxides with extremely high dispersibility in a polar solvent are used for the formation of the graphenes 6004. A solvent is removed by volatilization from a dispersion medium including graphene oxides uniformly dispersed and graphene oxides are reduced to give graphenes; hence, the graphenes 6004 remaining in the positive electrode active material layer 6002 are partly overlapped with each other and dispersed such that surface contact is made, thereby forming a path for electron conduction.

Further, some pieces of the graphene 6004 are between the particles of the positive electrode active material 6003. Furthermore, the graphenes 6004 are extremely thin films (sheets) made of a single layer of carbon molecules or stacked layers thereof and hence are over and in contact with part of the surfaces of the particles of the positive electrode active material 6003 in such a way as to trace these surfaces. A portion of the graphenes 6004 which is not in contact with the positive electrode active material 6003 is warped between the particles of the positive electrode active material 6003 and crimped or stretched.

Consequently, the plurality of graphenes 6004 form a network for electron conduction in the positive electrode 6000. Thus, a path for electric conduction between the particles of the positive electrode active material 6003 is maintained. As described above, graphenes whose raw material is graphene oxide and which are formed by reduction performed after a paste is formed are employed as a conductive additive, so that the positive electrode active material layer 6002 with high electron conductivity can be formed.

The proportion of the positive electrode active material 6003 in the positive electrode active material layer 6002 can be increased because the added amount of conductive additives is not necessarily increased in order to increase contact points between the positive electrode active material 6003 and the graphenes 6004. Accordingly, the discharge capacity of the secondary battery can be increased.

The average particle diameter of primary particles of the particles of the positive electrode active material 6003 is preferably less than or equal to 500 nm, more preferably greater than or equal to 50 nm and less than or equal to 500 nm. To make surface contact with the plurality of particles of the positive electrode active material 6003, the graphenes 6004 have sides each having a length of greater than or equal to 50 nm and less than or equal to 100 µm, preferably greater than or equal to 800 nm and less than or equal to 20 µm.

As a binder (binding agent) included in the positive electrode active material layer 6002, polyvinylidene fluoride (PVDF) as a typical example, polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, nitrocellulose, or the like can be used.

The above positive electrode active material layer 6002 preferably includes the positive electrode active material 6003 at greater than or equal to 90 wt % and less than or equal to 94 wt %, the graphenes 6004 as a conductive additive at greater than or equal to 1 wt % and less than or equal to 5 wt %, and the binder at greater than or equal to 1 wt % and less than or equal to 5 wt % with respect to the total weight of the positive electrode active material layer 6002.

[5-2. Negative Electrode]

Figure 18A:
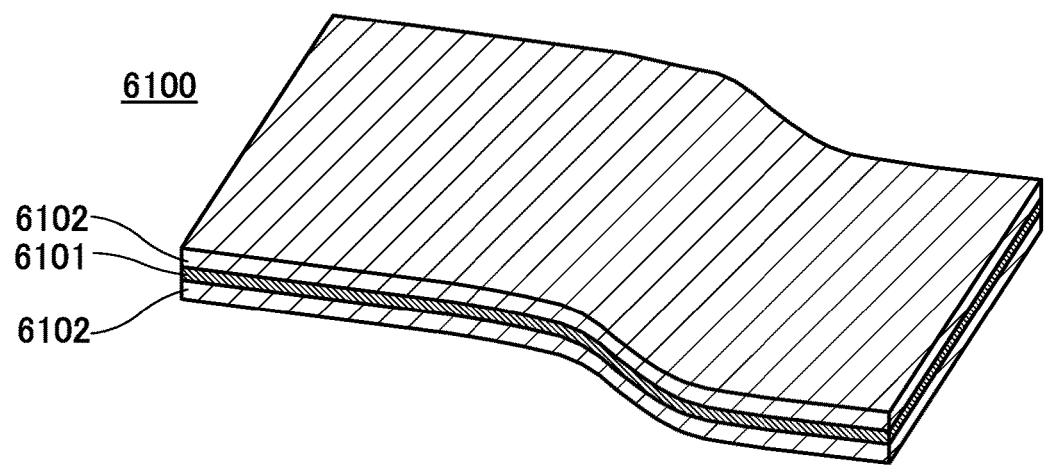
FIGS. 18A and 18B illustrate a negative electrode of a secondary battery.

Next, a negative electrode of a secondary battery is described with reference to FIGS. 18A and 18B.

A negative electrode 6100 includes a negative electrode current collector 6101 and a negative electrode active material layer 6102 formed over the negative electrode current collector 6101 by a coating method, a CVD method, a sputtering method, or the like, for example. Although an example of providing the negative electrode active material layer 6102 on both surfaces of the negative electrode current collector 6101 with a sheet shape (or a strip-like shape) is illustrated in FIG. 18A, one embodiment of the present invention is not limited to this example. The negative electrode active material layer 6102 may be provided on one of the surfaces of the negative electrode current collector 6101. Further, although the negative electrode active material layer 6102 is provided entirely over the negative electrode current collector 6101 in FIG. 18A, one embodiment of the present invention is not limited thereto. The negative electrode active material layer 6102 may be provided over part of the negative electrode current collector 6101. For example, a structure may be employed in which the negative electrode active material layer 6102 is not provided in a portion where the negative electrode current collector 6101 is connected to a negative electrode tab.

The negative electrode current collector 6101 can be formed using a material that has high conductivity and is not alloyed with a carrier ion of lithium or the like, such as a metal typified by gold, platinum, iron, copper, or titanium, or an alloy thereof (e.g., stainless steel). Alternatively, the negative electrode current collector 6101 may be formed using a metal element which forms silicide by reacting with silicon. Examples of the metal element which forms silicide by reacting with silicon include zirconium, titanium, hafnium, vanadium, niobium, tantalum, chromium, molybdenum, tungsten, cobalt, and nickel. The negative electrode current collector 6101 can have a foil-like shape, a plate-like shape, a net-like shape, a punching-metal shape, an expanded-metal shape, or the like, as appropriate. The negative electrode current collector 6101 preferably has a thickness of greater than or equal to 10 µm and less than or equal to 30 µm.

Figure 18B:
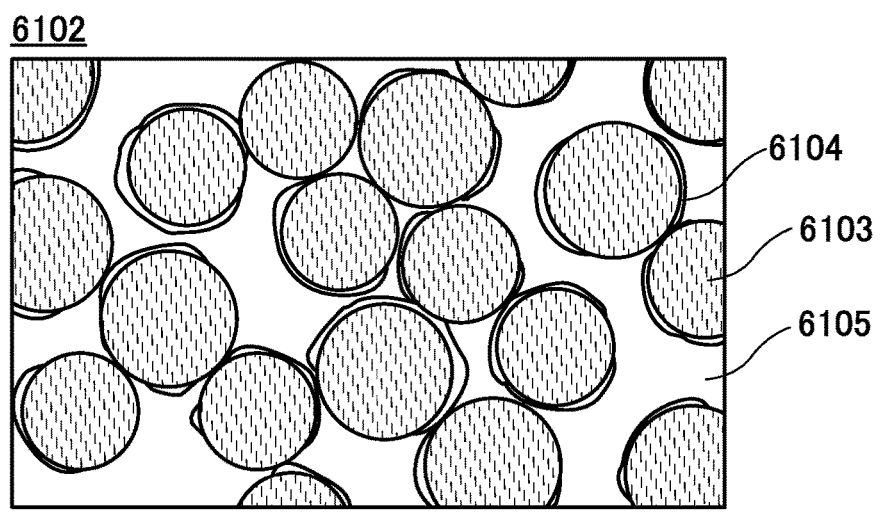

FIG. 18B is a schematic view of part of a cross-section of the negative electrode active material layer 6102. Although an example of the negative electrode active material layer 6102 including a negative electrode active material 6103 and a binder 6105 (binding agent) is shown here, one embodiment of the present invention is not limited to this example. It is sufficient that the negative electrode active material layer 6102 includes at least the negative electrode active material 6103.

There is no particular limitation on the material of the negative electrode active material 6103 as long as it is a material with which a metal can be dissolved/precipitated or a material into/from which metal ions can be inserted/extracted. Other than a lithium metal, graphite, which is a carbon material generally used in the field of power storage, can be used as the material of the negative electrode active material 6103. Examples of graphite include low crystalline carbon such as soft carbon and hard carbon and high crystalline carbon such as natural graphite, kish graphite, pyrolytic graphite, mesophase pitch based carbon fiber, meso-carbon microbeads (MCMB), mesophase pitches, and petroleum-based or coal-based coke.

As the negative electrode active material 6103, other than the above materials, an alloy-based material which enables charge-discharge reaction by alloying and dealloying reaction with carrier ions can be used. In the case where the carrier ions are lithium ions, for example, a material containing at least one of Mg, Ca, Al, Si, Ge, Sn, Pb, As, Sb, Bi, Ag, Au, Zn, Cd, Hg, In, and the like can be used as an alloy-based material. Such materials have higher capacity than graphite. In particular, silicon has a high theoretical capacity of 4200 mAh/g. For this reason, silicon is preferably used as the negative electrode active material 6103.

Although the negative electrode active material 6103 is illustrated as a particulate substance in FIG. 18B, the shape of the negative electrode active material 6103 is not limited thereto. The negative electrode active material 6103 can have a given shape such as a plate shape, a rod shape, a cylindrical shape, a powder shape, or a flake shape. Further, the negative electrode active material 6103 may have unevenness or fine unevenness on its surface, or may be porous.

The negative electrode active material layer 6102 may be formed by a coating method in the following manner: a conductive additive (not illustrated) or a binding agent is added to the negative electrode active material 6103 to form a negative electrode paste; and the negative electrode paste is applied onto the negative electrode current collector 6101 and dried.

Note that the negative electrode active material layer 6102 may be predoped with lithium. The negative electrode active material layer 6102 may be predoped in such a manner that a lithium layer is formed on a surface of the negative electrode active material layer 6102 by a sputtering method. Alternatively, lithium foil is provided on the surface of the negative electrode active material layer 6102, whereby the negative electrode active material layer 6102 can be pre-doped with lithium.

Further, graphene (not illustrated) is preferably formed on the surface of the negative electrode active material 6103. For example, in the case of using silicon as the negative electrode active material 6103, the volume of silicon is greatly changed due to occlusion and release of carrier ions in charge-discharge cycles. Thus, adhesion between the negative electrode current collector 6101 and the negative electrode active material layer 6102 is decreased, resulting in degradation of battery characteristics caused by charge and discharge. In view of this, graphene is preferably formed on the surface of the negative electrode active material 6103 containing silicon because even when the volume of silicon is changed in charge-discharge cycles, decrease in adhesion between the negative electrode current collector 6101 and the negative electrode active material layer 6102 can be regulated, which makes it possible to reduce degradation of battery characteristics.

Graphene formed on the surface of the negative electrode active material 6103 can be formed by reducing graphene oxide in a manner similar to that of the method for forming the positive electrode. As graphene oxide, the above graphene oxide can be used.

Further, a film 6104 of oxide or the like may be formed on the surface of the negative electrode active material 6103. A film formed by decomposition of an electrolyte solution or the like in charging cannot release electric charges used at the time of forming the coating film, and therefore forms irreversible capacity. In contrast, the film 6104 of oxide or the like provided on the surface of the negative electrode active material 6103 in advance can reduce or prevent generation of irreversible capacity.

As the film 6104 covering the negative electrode active material 6103, an oxide film of any one of niobium, titanium, vanadium, tantalum, tungsten, zirconium, molybdenum, hafnium, chromium, aluminum, and silicon or an oxide film containing any one of these elements and lithium can be used. The film 6104 is much denser than a conventional film formed on a surface of a negative electrode due to a decomposition product of an electrolyte solution.

For example, niobium oxide ($Nb_2O_5$) has a low electric conductivity of $10^{-9}$ S/cm$^2$ and a high insulating property. For this reason, a niobium oxide film inhibits electrochemical decomposition reaction between the negative electrode active material and the electrolyte solution. On the other hand, niobium oxide has a lithium diffusion coefficient of $10^{-9}$ cm$^2$/sec and high lithium ion conductivity. Therefore, niobium oxide can transmit lithium ions.

A sol-gel method can be used to coat the negative electrode active material 6103 with the film 6104, for example. The sol-gel method is a method for forming a thin film in such a manner that a solution of metal alkoxide, a metal salt, or the like is changed into a gel, which has lost its fluidity, by hydrolysis reaction and polycondensation reaction and the gel is baked. Since a thin film is formed from a liquid phase in the sol-gel method, raw materials can be mixed uniformly on the molecular scale. For this reason, by adding a negative electrode active material such as graphite to a raw material of the metal oxide film which is a solvent, the active material can be easily dispersed into the gel. In such a manner, the film 6104 can be formed on the surface of the negative electrode active material 6103.

The use of the film 6104 can prevent a decrease in capacity of the secondary battery.

[5-3. Electrolyte Solution]

As a solvent of an electrolyte solution used for a secondary battery, an aprotic organic solvent is preferable. For example, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

With the use of a gelled high-molecular material as the solvent of the electrolyte solution, safety against liquid leakage and the like is improved. Further, the secondary battery can be thinner and more lightweight. Typical examples of gelled high-molecular materials include a silicone gel, an acrylic gel, an acrylonitrile gel, polyethylene oxide, polypropylene oxide, and a fluorine-based polymer.

Alternatively, the use of one or more ionic liquids (room temperature molten salts) which are less likely to burn and volatilize as the solvent of the electrolyte solution can prevent the secondary battery from exploding or catching fire even when the secondary battery internally shorts out or the internal temperature increases due to overcharging or the like.

In the case of using lithium ions as carriers, for example, one of lithium salts such as $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)$ $(CF_3SO_2)$, and $LiN(C_2F_5SO_2)_2$ can be used as an electrolyte dissolved in the above solvent, or two or more of these lithium salts can be used in an appropriate combination in an appropriate ratio.

[5-4. Separator]

As a separator of the secondary battery, a porous insulator such as cellulose, polypropylene (PP), polyethylene (PE), polybutene, nylon, polyester, polysulfone, polyacrylonitrile, polyvinylidene fluoride, or tetrafluoroethylene can be used. Further, nonwoven fabric of a glass fiber or the like, or a diaphragm in which a glass fiber and a polymer fiber are mixed may be used.

[5-5. Nonaqueous Secondary Battery]

Next, structures of nonaqueous secondary batteries are described with reference to FIGS. 19A to 19C and FIGS. 20A and 20B.

[5-5-1. Coin-Type Secondary Battery]

Figure 19A:
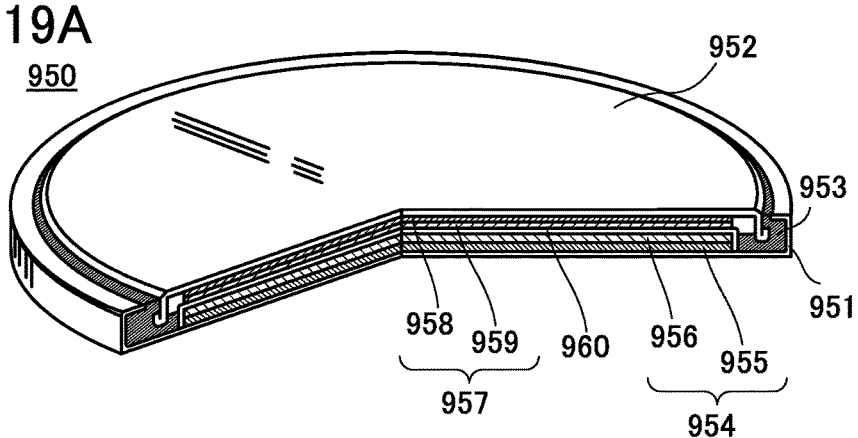
FIGS. 19A to 19C each illustrate a structure example of a secondary battery.

FIG. 19A is an external view of a coin-type (single-layer flat type) lithium-ion secondary battery, part of which illustrates a cross-sectional structure of part of the coin-type lithium-ion secondary battery.

In a coin-type secondary battery 950, a positive electrode can 951 serving also as a positive electrode terminal and a negative electrode can 952 serving also as a negative electrode terminal are insulated and sealed with a gasket 953 formed using polypropylene or the like. A positive electrode 954 includes a positive electrode current collector 955 and a positive electrode active material layer 956 provided in contact with the positive electrode current collector 955. A negative electrode 957 includes a negative electrode current collector 958 and a negative electrode active material layer 959 provided in contact with the negative electrode current collector 958. A separator 960 and an electrolyte solution (not illustrated) are provided between the positive electrode active material layer 956 and the negative electrode active material layer 959.

The negative electrode 957 includes the negative electrode current collector 958 and the negative electrode active material layer 959. The positive electrode 954 includes the positive electrode current collector 955 and the positive electrode active material layer 956.

For the positive electrode 954, the negative electrode 957, the separator 960, and the electrolyte solution, the above-described members can be used.

For the positive electrode can 951 and the negative electrode can 952, a corrosion-resistant metal such as nickel, aluminum, or titanium, an alloy of such a metal, or an alloy of such a metal and another metal (e.g., stainless steel) can be used. Alternatively, the positive electrode can 951 and the negative electrode can 952 are preferably coated with nickel, aluminum, or the like in order to prevent corrosion by the electrolyte solution, which occurs due to charge/discharge of the secondary battery. The positive electrode can 951 and the negative electrode can 952 are electrically connected to the positive electrode 954 and the negative electrode 957, respectively.

The negative electrode 957, the positive electrode 954, and the separator 960 are immersed in the electrolyte solution. Then, as illustrated in FIG. 19A, the positive electrode can 951, the positive electrode 954, the separator 960, the negative electrode 957, and the negative electrode can 952 are stacked in this order with the positive electrode can 951 positioned at the bottom, and the positive electrode can 951 and the negative electrode can 952 are subjected to pressure bonding with the gasket 953 positioned therebetween. In such a manner, the coin-type secondary battery 950 is manufactured.

[5-5-2. Laminated Secondary Battery]

Figure 19B:
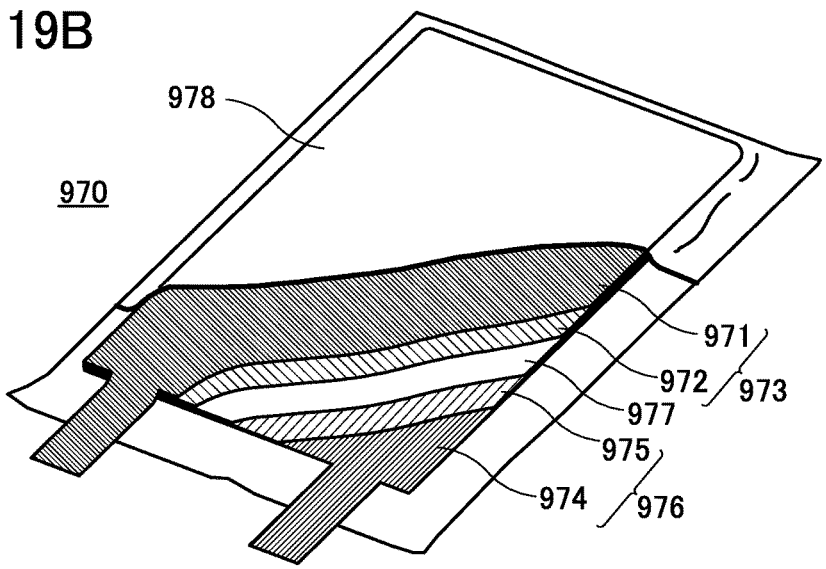

Next, an example of a laminated secondary battery is described with reference to FIG. 19B. In FIG. 19B, a structure inside the laminated secondary battery is partly exposed for convenience.

A laminated secondary battery 970 illustrated in FIG. 19B includes a positive electrode 973 including a positive electrode current collector 971 and a positive electrode active material layer 972, a negative electrode 976 including a negative electrode current collector 974 and a negative electrode active material layer 975, a separator 977, an electrolyte solution (not illustrated), and an exterior body 978. The separator 977 is provided between the positive electrode 973 and the negative electrode 976 in the exterior body 978. The exterior body 978 is filled with the electrolyte solution. Although one positive electrode 973, one negative electrode 976, and one separator 977 are used in FIG. 19B, the secondary battery may have a stacked-layer structure in which positive electrodes, negative electrodes, and separators are alternately stacked.

For the positive electrode, the negative electrode, the separator, and the electrolyte solution (an electrolyte and a solvent), the above-described members can be used.

In the laminated secondary battery 970 illustrated in FIG. 19B, the positive electrode current collector 971 and the negative electrode current collector 974 also serve as terminals (tabs) for electrical contact with the outside. For this reason, the positive electrode current collector 971 and the negative electrode current collector 974 are arranged so that part of the positive electrode current collector 971 and part of the negative electrode current collector 974 are exposed outside the exterior body 978.

As the exterior body 978 in the laminated secondary battery 970, for example, a laminate film having a three-layer structure in which a highly flexible metal thin film of aluminum, stainless steel, copper, nickel, or the like is provided over a film formed using a material such as polyethylene, polypropylene, polycarbonate, ionomer, or polyamide, and an insulating synthetic resin film of a polyamide-based resin, a polyester-based resin, or the like is provided as the outer surface of the exterior body over the metal thin film can be used. With such a three-layer structure, permeation of an electrolyte solution and a gas can be blocked and an insulating property and resistance to the electrolyte solution can be obtained.

[5-5-3. Cylindrical Secondary Battery]

Figure 20A:
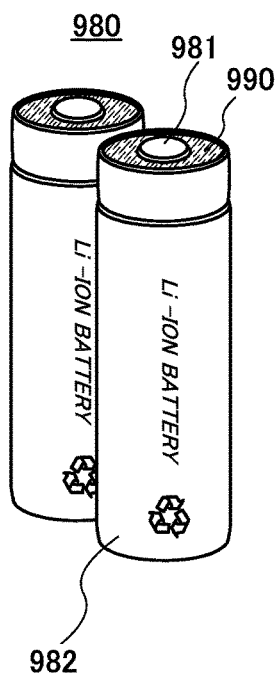
FIGS. 20A and 20B illustrate a structure example of a secondary battery.

Next, an example of a cylindrical secondary battery is described with reference to FIGS. 20A and 20B. As illustrated in FIG. 20A, a cylindrical secondary battery 980 includes a positive electrode cap (battery cap) 981 on the top surface and a battery can (outer can) 982 on the side surface and bottom surface. The positive electrode cap 981 and the battery can (outer can) 982 are insulated from each other by a gasket (insulating gasket) 990.

Figure 20B:
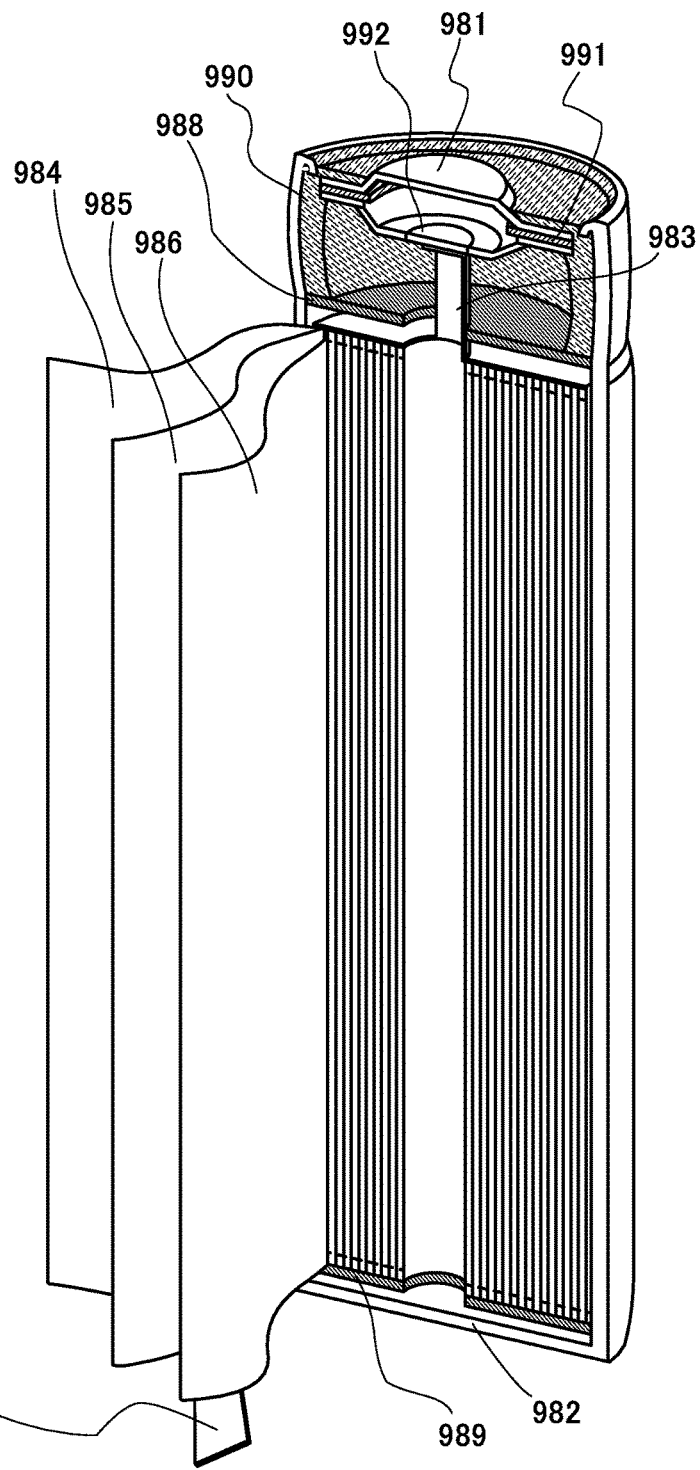

FIG. 20B is a diagram schematically illustrating a cross section of the cylindrical secondary battery. Inside the battery can 982 having a hollow cylindrical shape, a battery element in which a strip-like positive electrode 984 and a strip-like negative electrode 986 are wound with a separator 985 positioned therebetween is provided. Although not illustrated, the battery element is wound around a center pin as a center. One end of the battery can 982 is close and the other end thereof is open.

For the positive electrode 984, the negative electrode 986, and the separator 985, the above-described members can be used.

A corrosion-resistant metal such as nickel, aluminum, or titanium, an alloy of such a metal, or an alloy of such a metal and another metal (e.g., stainless steel) can be used for the battery can 982. Alternatively, battery can 982 is preferably coated with nickel, aluminum, or the like in order to prevent corrosion by an electrolyte solution, which occurs due to charge/discharge of the secondary battery. Inside the battery can 982, the battery element in which the positive electrode, the negative electrode, and the separator are wound is positioned between a pair of insulating plates 988 and 989 which face each other.

Further, an electrolyte solution (not illustrated) is injected inside the battery can 982 in which the battery element is provided. For the electrolyte solution, the above electrolyte and solvent can be used.

Since the positive electrode 984 and the negative electrode 986 of the cylindrical secondary battery are wound, active material layers are formed on both sides of current collectors. A positive electrode terminal (positive electrode current collecting lead) 983 is connected to the positive electrode 984, and a negative electrode terminal (negative electrode current collecting lead) 987 is connected to the negative electrode 986. Both the positive electrode terminal 983 and the negative electrode terminal 987 can be formed using a metal material such as aluminum. The positive electrode terminal 983 and the negative electrode terminal 987 are resistance-welded to a safety valve mechanism 992 and the bottom of the battery can 982, respectively. The safety valve mechanism 992 is electrically connected to the positive electrode cap 981 through a positive temperature coefficient (PTC) element 991. The safety valve mechanism 992 cuts off electrical connection between the positive electrode cap 981 and the positive electrode 984 when the internal pressure of the battery increases and exceeds a predetermined threshold value. The PTC element 991 is a heat sensitive resistor whose resistance increases as temperature rises, and controls the amount of current by increase in resistance to prevent abnormal heat generation. Barium titanate ($BaTiO_3$)-based semiconductor ceramic or the like can be used for the PTC element.

[5.5.4. Rectangular Secondary Battery]

Figure 19C:
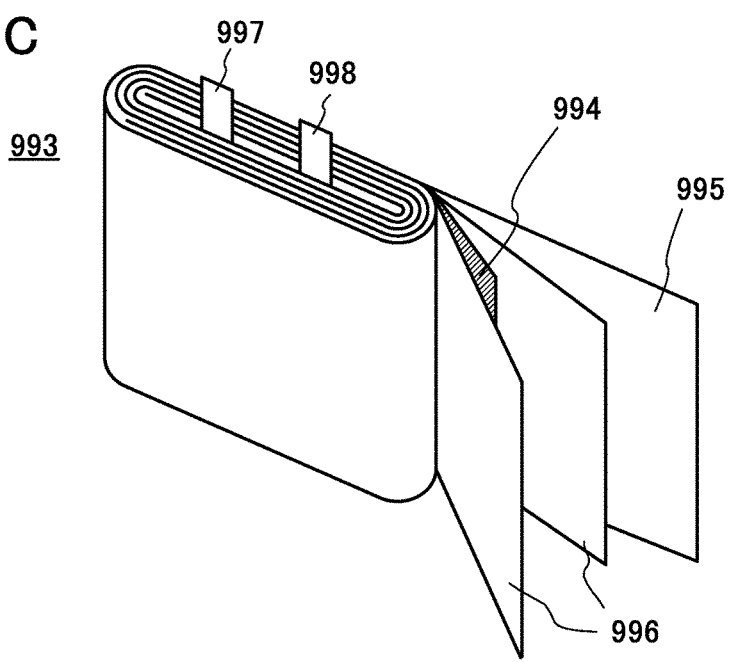

Next, an example of a rectangular secondary battery is described with reference to FIG. 19C. A wound body 933 illustrated in FIG. 19C includes a negative electrode 994, a positive electrode 995, and a separator 996. The wound body 933 is obtained by winding a sheet of a stack in which the negative electrode 994 overlaps with the positive electrode 995 with the separator 996 provided therebetween. The wound body 933 is covered with a rectangular sealed can or the like; thus, a rectangular secondary battery is manufactured. Note that the number of stacks each including the negative electrode 994, the positive electrode 995, and the separator 996 may be determined as appropriate depending on capacity and an element volume which are required.

As in the case of the cylindrical secondary battery, the negative electrode 994 is connected to a negative electrode tab (not illustrated) through one of a terminal 997 and a terminal 998, and the positive electrode 995 is connected to a positive electrode tab (not illustrated) through the other of the terminal 997 and the terminal 998. Other surrounding structures such as a safety valve mechanism are similar to those of the cylindrical secondary battery.

As described above, the coin-type secondary battery, the laminated secondary battery, the cylindrical secondary battery, and the rectangular secondary battery are given as examples of the secondary battery; however, any of secondary batteries with a variety of shapes can be used. Further, a structure in which a plurality of positive electrodes, a plurality of negative electrodes, and a plurality of separators are stacked or wound may be employed.

[5-6. Lithium-Ion Capacitor]

Next, a lithium-ion capacitor is described.

The lithium-ion capacitor is a hybrid capacitor which combines a positive electrode of an electric double layer capacitor (EDLC) and a negative electrode of a lithium-ion secondary battery using a carbon material, and also an asymmetric capacitor in which the principles of power storage are different between the positive electrode and the negative electrode. The positive electrode forms an electric double layer and enables charge and discharge by a physical action, whereas the negative electrode enables charge and discharge by a chemical action of lithium. With the use of a negative electrode in which lithium is occluded in advance as the carbon material or the like that is a negative electrode active material, the lithium-ion capacitor can have energy density dramatically higher than that of a conventional electric double layer capacitor including a negative electrode using active carbon.

In a lithium-ion capacitor, instead of a positive electrode active material layer in a lithium-ion secondary battery, a material that can reversibly adsorb at least one of lithium ions and anions is used. Examples of such a material are active carbon, a conductive high molecule, and a polyacenic semiconductor (PAS).

The lithium-ion capacitor has high efficiency of charge and discharge, capability of rapidly performing charge and discharge, and a long life even when it is repeatedly used.

Such a lithium-ion capacitor can be used instead of the secondary battery of one embodiment of the present invention. Thus, generation of irreversible capacity is suppressed, so that a power storage device having improved cycle performance can be manufactured.

<<6. Power Storage Device>>

Next, a power storage device including an electric circuit such as a semiconductor integrated circuit (IC) is described.

FIGS. 21A to 21D illustrate a structure example of a power storage device in which the above-described rectangular secondary battery is provided with an electric circuit and the like. In a power storage device 6600 illustrated in FIGS. 21A and 21B, a wound body 6601 provided with the above-described third electrode is stored inside a battery can 6604. The wound body 6601 includes a terminal 6602 and a terminal 6603, and is impregnated with an electrolyte solution inside the battery can 6604. It is preferable that the terminal 6603 be in contact with the battery can 6604, and the terminal 6602 be insulated from the battery can 6604 with use of an insulating member or the like. A metal material such as aluminum or a resin material can be used for the battery can 6604.

Figure 21A:
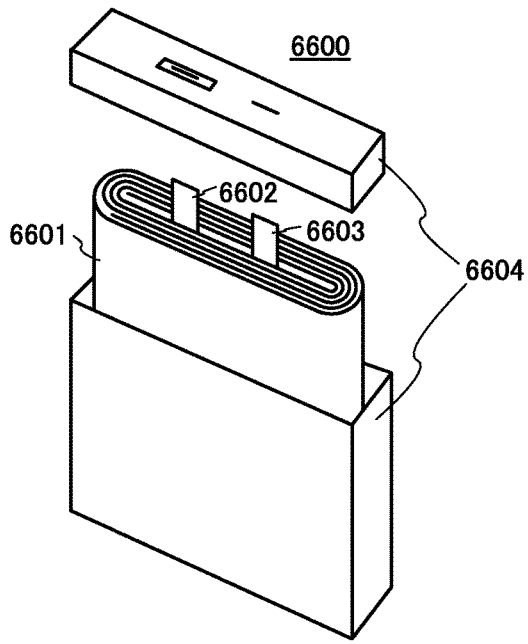
FIGS. 21A to 21D illustrate a structure example of a power storage device.
Figure 21B:
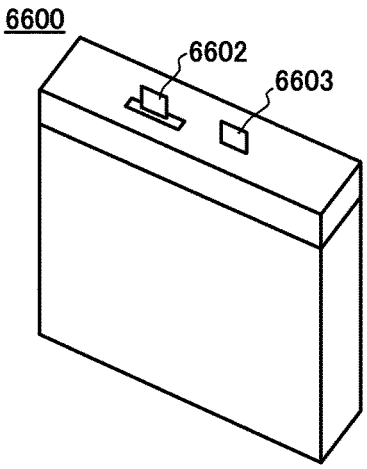
Figure 21C:
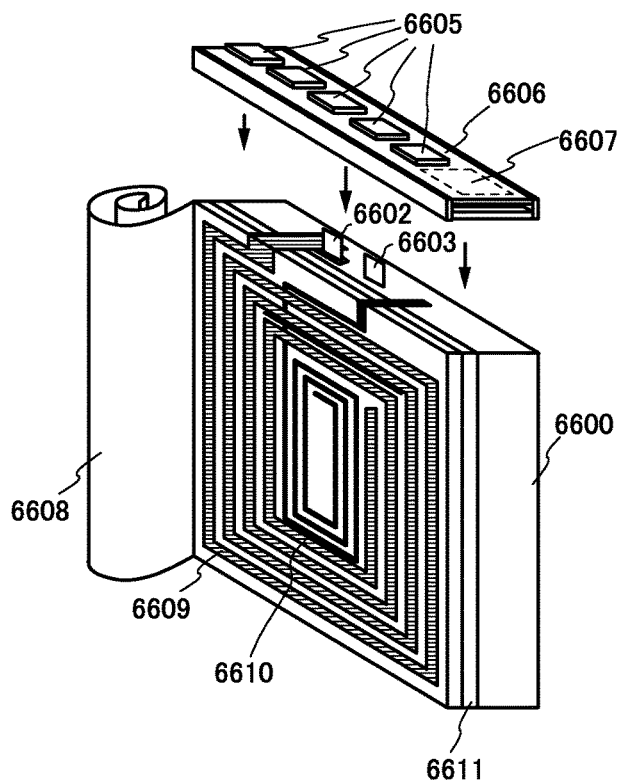
Figure 21D:
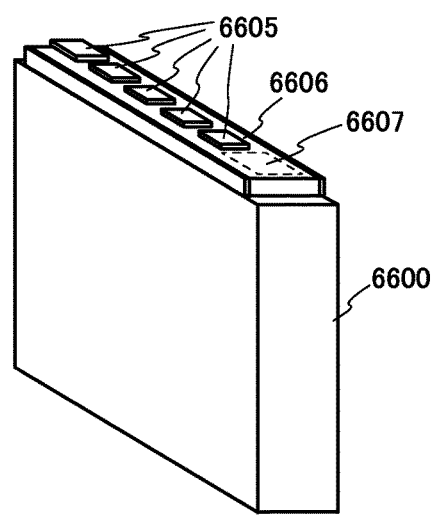

Further, as illustrated in FIG. 21B, the power storage device 6600 can be provided with an electric circuit and the like. FIGS. 21C and 21D illustrate an example of providing the power storage device 6600 with a circuit board 6606 in which an electric circuit and the like are provided, an antenna 6609, an antenna 6610, and a label 6608.

The circuit board 6606 includes an electric circuit 6607, terminals 6605, and the like. As the circuit board 6606, a printed circuit board (PCB) can be used, for example. When the printed circuit board is used as the circuit board 6606, electronic components such as a resistor, a capacitor, a coil (an inductor), and a semiconductor integrated circuit (IC) are mounted over the printed circuit board and connected, whereby the electric circuit 6607 can be formed. As well as the above-described electronic components, a variety of components, for example, a temperature sensing element such as a thermistor, a fuse, a filter, a crystal oscillator, and an electromagnetic compatibility (EMC) component can be mounted.

Here, the above-described semiconductor device can be used as the semiconductor integrated circuit (IC). Thus, power consumption of the electric circuit 6607 can be greatly reduced.

The electric circuit 6607 including these electronic components can function as a monitoring circuit for preventing overcharge or overdischarge of the power storage device 6600, a protection circuit against overcurrent, or the like. Further, as the electric circuit 6607, the MCU 105, the memory 106, or the like can be provided.

The terminals 6605 included in the circuit board 6606 are connected to the terminal 6602, the terminal 6603, and the electric circuit 6607. Although the number of the terminals 6605 is five in FIGS. 21C and 21D, the number is not limited thereto, and may be a given number. With use of the terminals 6605, the power storage device 6600 can be charged and discharged, and further, a signal can be sent and received to/from an electric device including the power storage device 6600.

The antenna 6609 and the antenna 6610 can be used for transmitting and receiving electric power and a signal to/from the outside of the power storage device, for example. One or both of the antenna 6609 and the antenna 6610 are electrically connected to the communication unit 107 to allow the electric circuit 6607 to control the transmission and reception of electric power and a signal to/from the outside. Alternatively, one or both of the antenna 6609 and the antenna 6610 are electrically connected to the terminal 6605 to allow a control circuit of the electric device including the power storage device 6600 to control the transmission and reception of electric power and a signal to/from the outside.

Note that although FIGS. 21C and 21D illustrate an example of the power storage device 6600 provided with two kinds of antenna, a variety of antennas may be provided or a structure where an antenna is not provided may be employed.

In FIGS. 21C and 21D, the antenna 6609 and the antenna 6610 each have a coil shape; however, without limitation thereto, a linear antenna or a flat plate antenna may be used, for example. Further, a planar antenna, an aperture antenna, a traveling-wave antenna, an EH antenna, a magnetic-field antenna, or a dielectric antenna may be used.

Note that an electromagnetic induction method, a magnetic resonance method, an electric wave method, or the like can be used for transmitting and receiving electric power wirelessly (also referred to as contactless power transmission, non-contact power transmission, wireless power supply, or the like).

The line width of the antenna 6609 is preferably larger than that of the antenna 6610. This makes it possible to increase the amount of electric power received by the antenna 6609.

In addition, a layer 6611 is provided between the antennas 6609 and 6610 and the power storage device 6600. The layer 6611 has a function of preventing shielding of an electric field or a magnetic field due to the wound body 6601, for example. In this case, a magnetic substance can be used for the layer 6611, for example. Alternatively, the layer 6611 may be a shielding layer.

Note that the antenna 6609 and the antenna 6610 can be used for a purpose which is different from the purpose of transmitting and receiving electric power or a signal to/from the outside. For example, when the electric device including the power storage device 6600 does not include an antenna, the antenna 6609 and the antenna 6610 enable wireless communication with the electric device.

<<7. Electric Device>>

The power storage device of one embodiment of the present invention can be used for power sources of a variety of electric devices.

[7-1. Definition of Electric Device]

Here, "electric devices" refer to all general industrial products including portions which operate by electric power. Electric devices are not limited to consumer products such as home electric products and also include products for various uses such as business use, industrial use, and military use in their category.

[7-2. Example of Electric Device]

Examples of electric devices each using the power storage device of one embodiment of the present invention are as follows: display devices of televisions, monitors, and the like, lighting devices, desktop personal computers, laptop personal computers, word processors, image reproduction devices which reproduce still images or moving images stored in recording media such as digital versatile discs (DVDs), portable or stationary music reproduction devices such as compact disc (CD) players and digital audio players, portable or stationary radio receivers, recording reproduction devices such as tape recorders and IC recorders (voice recorders), headphone stereos, stereos, remote controls, clocks such as table clocks and wall clocks, cordless phone handsets, transceivers, mobile phones, car phones, portable or stationary game machines, pedometers, calculators, portable information terminals, electronic notebooks, e-book readers, electronic translators, audio input devices such as microphones, cameras such as still cameras and video cameras, toys, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashers, dish dryers, clothes dryers, futon dryers, electric refrigerators, electric freezers, electric refrigerator-freezers, freezers for preserving DNA, flashlights, electric power tools, smoke detectors, and a health equipment and a medical equipment such as hearing aids, cardiac pacemakers, portable X-ray equipments, radiation counters, electric massagers, and dialyzers. The examples also include industrial equipment such as guide lights, traffic lights, meters such as gas meters and water meters, belt conveyors, elevators, escalators, automatic vending machines, automatic ticket machines, cash dispensers (CDs), automated teller machines (ATMs), digital signage, industrial robots, radio relay stations, mobile phone base stations, power storage systems, and power storage devices for leveling the amount of power supply and smart grid. In addition, moving objects (transporters) driven by an electric motor using electric power from a power storage device are also included in the category of the electric devices. Examples of the moving objects are electric vehicles (EV), hybrid electric vehicles (HEVs) which include both an internal-combustion engine and a motor, plug-in hybrid electric vehicles (PHEVs), tracked vehicles in which caterpillar tracks are substituted for wheels of these vehicles, agricultural machines, motorized bicycles including motor-assisted bicycles, motorcycles, electric wheelchairs, electric carts, boats or ships, submarines, aircrafts such as fixed-wing aircraft and rotary-wing aircraft, rockets, artificial satellites, space probes, planetary probes, and spacecrafts.

In the electric devices, the power storage device of one embodiment of the present invention can be used as a main power source for supplying enough electric power for almost the whole power consumption. Alternatively, in the above electric devices, the power storage device of one embodiment of the present invention can be used as an uninterruptible power source which can supply power to the electric devices when the supply of power from the main power source or a commercial power source is stopped. Still alternatively, in the electric devices, the power storage device of one embodiment of the present invention can be used as an auxiliary power source for supplying electric power to the electric devices at the same time as the power supply from the main power source or a commercial power source.

[7-3. Example of Electric Power Network]

The electric devices may each include a power storage device or may be connected wirelessly or with a wiring to one or more power storage devices and a control device controlling power systems of these devices to form a network (electric power network). By controlling the electric power network with the control device, efficiency in the use of electric power in the whole network can be improved.

Figure 22A:
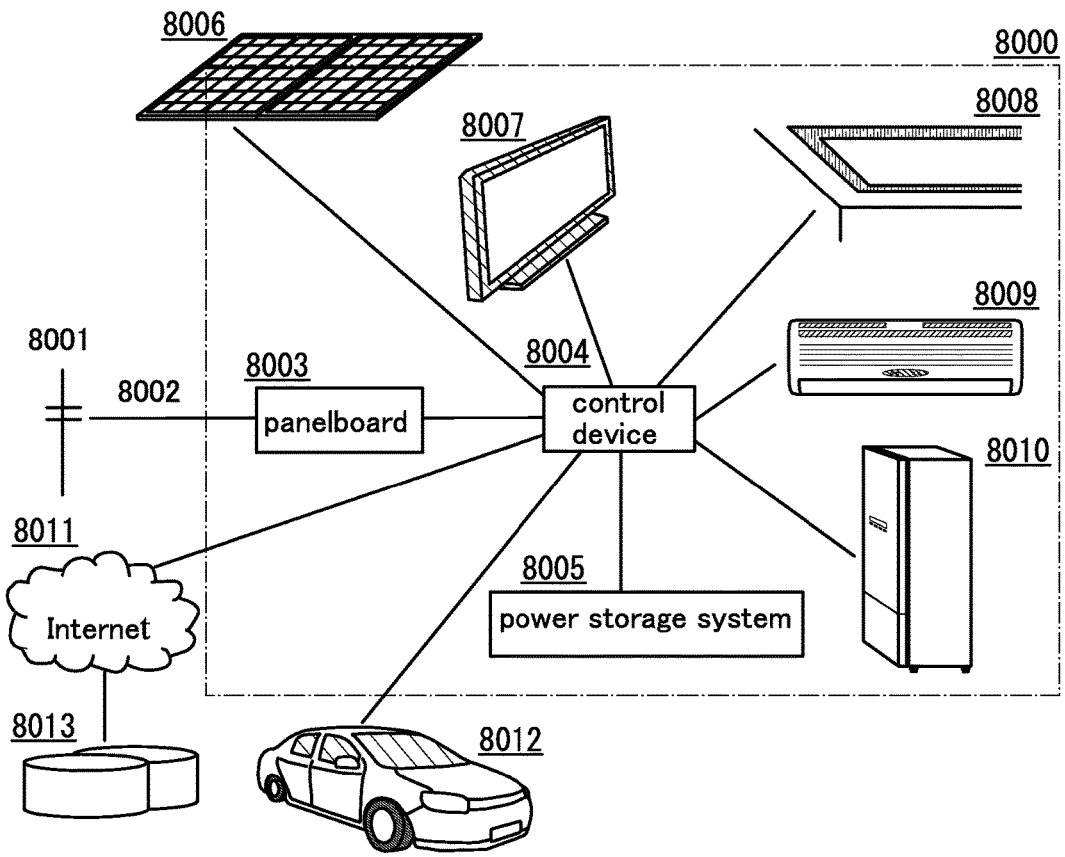
FIGS. 22A to 22C illustrate a structure example of HEMS.

FIG. 22A illustrates a structural example of a home energy management system (ITEMS) in which a plurality of home appliances, a control device, a power storage device, and the like are connected in a house. Such a system makes it possible to check easily the power consumption of the whole house. In addition, the plurality of home appliances can be operated with a remote control. In the case of automatically controlling the home appliances with a sensor or the control device, power can be saved.

A panelboard 8003 set in a house 8000 is connected to an electric power system 8001 through a service wire 8002. The panelboard 8003 supplies AC power, which is electric power supplied from a commercial power source through the service wire 8002, to each of the plurality of home appliances. A control device 8004 is connected to the panelboard 8003 and also connected to the plurality of home appliances, a power storage system 8005, a solar power generation system 8006, and the like. Further, the control device 8004 can also be connected to an electric vehicle 8012 which is parked outside the house 8000 or the like and operates independently from the panelboard 8003.

The control device 8004 connects the panelboard 8003 to the plurality of home appliances to form a network, and controls the operation of the plurality of home appliances connected to the network.

In addition, the control device 8004 is connected to Internet 8011 and thus can be connected to a management server 8013 through the Internet 8011. The management server 8013 receives data on status of use of electric power by users and therefore can create a database and can provide the users with a variety of services based on the database. Further, as needed, the management server 8013 can provide the users with data on electric power charge for a corresponding time zone, for example. On the basis of the data, the control device 8004 can set an optimized usage pattern in the house 8000.

Examples of the plurality of home appliances are a display device 8007, a lighting device 8008, an air-conditioning system 8009, and an electric refrigerator 8010 which are illustrated in FIG. 22A. However, it is needless to say that the plurality of home appliances are not limited to these examples, and refer to a variety of electric devices which can be set inside a house, such as the above-described electric devices.

In a display portion of the display device 8007, a semiconductor display device such as a liquid crystal display device, a light-emitting device including a light-emitting element, e.g., an organic electroluminescent (EL) element, in each pixel, an electrophoretic display device, a digital micromirror device (DMD), a plasma display panel (PDP), or a field emission display (FED) is provided, for example. A display device functioning as a display device for displaying information, such as a display device for TV broadcast reception, a personal computer, advertisement, or the like, is included in the category of the display device 8007.

The lighting device 8008 includes an artificial light source which generates light artificially by utilizing electric power in its category. Examples of the artificial light source are an incandescent lamp, a discharge lamp such as a fluorescent lamp, and a light-emitting element such as a light-emitting diode (LED) and an organic EL element. Although being provided on a ceiling in FIG. 22A, the lighting device 8008 may be installation lighting provided on a wall, a floor, a window, or the like or desktop lighting.

The air-conditioning system 8009 has a function of adjusting an indoor environment such as temperature, humidity, and air cleanliness. FIG. 22A illustrates an air conditioner as an example. The air conditioner includes an indoor unit in which a compressor, an evaporator, and the like are integrated and an outdoor unit (not illustrated) in which a condenser is incorporated, or an integral unit thereof.

The electric refrigerator 8010 is an electric device for the storage of food and the like at low temperature and includes a freezer for freezing at 0° C. or lower. A refrigerant in a pipe which is compressed by a compressor absorbs heat when vaporized, and thus inside of the electric refrigerator 8010 is cooled.

The plurality of home appliances may each include a power storage device or may use electric power supplied from the power storage system 8005 or the commercial power source without including the power storage device. By using a power storage device as an uninterruptible power source, the plurality of home appliances each including the power storage device can be used even when electric power cannot be supplied from the commercial power source due to power failure or the like.

In the vicinity of a terminal for power supply in each of the above-described home appliances, an electric power sensor such as a current sensor can be provided. Data obtained with the electric power sensor is send to the control device 8004, which makes it possible for the users to check the used amount of electric power of the whole house. In addition, on the basis of the data, the control device 8004 can determine the distribution of electric power supplied to the plurality of home appliances, resulting in the efficient or economical use of electric power in the house 8000.

In a time zone when the usage rate of electric power which can be supplied from the commercial power source is low, the power storage system 8005 can be charged with electric power from the commercial power source. Further, with the use of the solar power generation system 8006, the power storage system 8005 can be charged during the daytime. Note that an object to be charged is not limited to the power storage system 8005, and a power storage device included in the electric vehicle 8012 and the power storage devices included in the plurality of home appliances which are connected to the control device 8004 may each be the object to be charged.

Electric power stored in a variety of power storage devices in such a manner is efficiently distributed by the control device 8004, resulting in the efficient or economical use of electric power in the house 8000.

As an example of controlling an electric power network, the example of controlling an electric power network on a house scale is described above; however, the scale of the electric power network is not limited thereto. An electric power network on an urban scale or a national scale (also referred to as a smart grid) can be created by a combination of a control device such as a smart meter and a communication network. Further, a microgrid which is on a scale of a factory or an office and includes an energy supply source and a plant consuming electric power as units can be constructed.

[7-4. Example of Electric Device (Example of Electric Vehicle)]

Next, as an example of the electric devices, a moving object is described with reference to FIGS. 22B and 22C.

The power storage device of one embodiment of the present invention can be used as a power storage device for controlling the moving object.

Figure 22B:
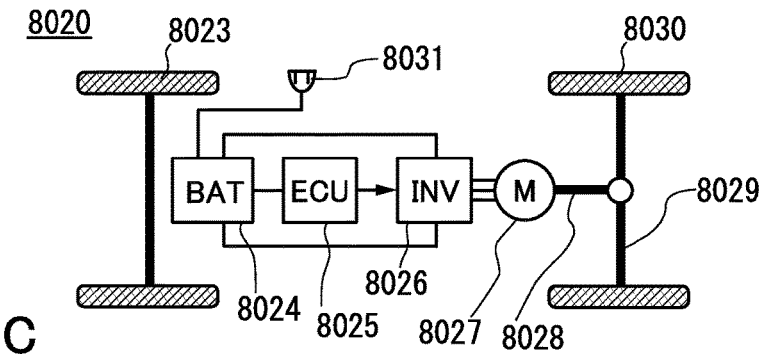
Figure 22C:
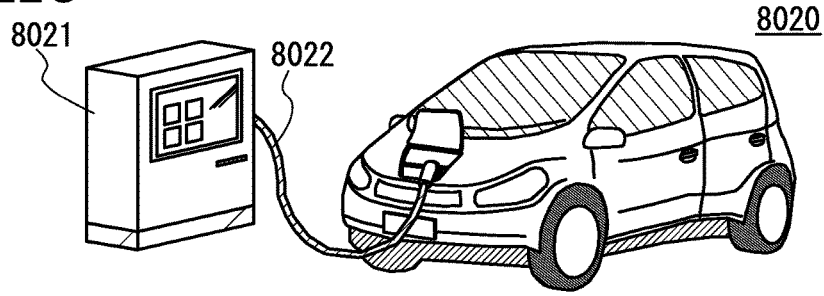

FIG. 22B illustrates an example of a structure inside an electric vehicle. An electric vehicle 8020 includes a power storage device 8024 that can be charged and discharged. Output of electric power of the power storage device 8024 is adjusted by an electronic control unit (ECU) 8025 so that the electric power is supplied to a drive motor unit 8027 through an inverter unit 8026. The inverter unit 8026 can convert DC power input from the power storage device 8024 into three phase AC power, can adjust the voltage, current, and frequency of the converted AC power, and can output the AC power to the drive motor unit 8027.

Thus, when a driver presses an accelerator pedal (not illustrated), the drive motor unit 8027 works, so that torque generated in the drive motor unit 8027 is transferred to rear wheels (drive wheels) 8030 through an output shaft 8028 and a drive shaft 8029. Front wheels 8023 are operated following the rear wheels 8030, whereby the electric vehicle 8020 can be driven.

Sensors such as a voltage sensor, a current sensor, and a temperature sensor are provided in each of the units to monitor physical values of each part of the electric vehicle 8020, as appropriate.

The electronic control unit 8025 is a processing device including a memory such as a RAM or a ROM, and a CPU, which are not illustrated. The electronic control unit 8025 outputs a control signal to the inverter unit 8026, the drive motor unit 8027, or the power storage device 8024 on the basis of operational information of the electric vehicle 8020 (e.g., acceleration, deceleration, or a stop), temperature information of a driving environment or each unit, control information, or input data on the state of charge (SOC) of the power storage device or the like. Various data and programs are stored in the memory.

As the drive motor unit 8027, a DC motor can be used instead of the AC motor, or a combination of either of these motors and an internal-combustion engine can be used.

Note that it is needless to say that one embodiment of the present invention is not limited to the moving object described above as long as the power storage device of one embodiment of the present invention is included.

The power storage device 8024 included in the electric vehicle 8020 can be charged by being supplied with electric power through an external charging facility by a plug-in system, a contactless power supply system, or the like. FIG. 22C illustrates the state where the power storage device 8024 included in the electric vehicle 8020 is charged with the use of a ground-based charging apparatus 8021 through a cable 8022. In charging, a given method such as CHAdeMO (registered trademark) may be referred to for a charging method, the standard of a connector, or the like as appropriate. The charging apparatus 8021 may be a charging station provided in a commerce facility or a power source in a house. For example, with the use of a plug-in technique in which a connecting plug 8031 illustrated in FIG. 22B and connected to the power storage device 8024 is electrically connected to the charging apparatus 8021, the power storage device 8024 included in the electric vehicle 8020 can be charged by being supplied with electric power from the outside. The power storage device 8024 can be charged by converting external power into DC constant voltage having a predetermined voltage level through a converter such as an AC-DC converter.

Further, although not illustrated, a power receiving device may be included in the moving object to charge the power storage device by supplying electric power from an aboveground power transmitting device in a non-contact manner. In the case of the contactless power supply system, by fitting the power transmitting device in a road or an exterior wall, charging can be performed not only when the electric vehicle is stopped but also when driven. In addition, the contactless power supply system may be utilized to perform transmission/reception between moving objects. Furthermore, a solar cell may be provided in an exterior of the moving object to charge the power storage device 8024 when the electric vehicle is stopped or driven. For power supply in such a contactless manner, an electromagnetic induction method or a magnetic resonance method can be used.

Note that in the case where the moving object is an electric railway vehicle, a power storage device included therein can be charged by being supplied with electric power from an overhead cable or a conductor rail.

With the use of the power storage device of one embodiment of the present invention as the power storage device 8024, the power storage device 8024 can have favorable cycle characteristics and improved convenience. When the power storage device 8024 itself can be more compact and more lightweight as a result of improved characteristics of the power storage device 8024, the electric vehicle can be lightweight and fuel efficiency can be increased. Further, the power storage device 8024 included in the moving object has relatively large capacity; therefore, the power storage device 8024 can be used as an electric power supply source for indoor use, for example. In such a case, the use of a commercial power source can be avoided at peak time of electric power demand.

[7-5. Example of Electric Device (Example of Portable Information Terminal)]

As another example of the electric devices, a portable information terminal is described with reference to FIGS. 23A to 23C.

Figure 23A:
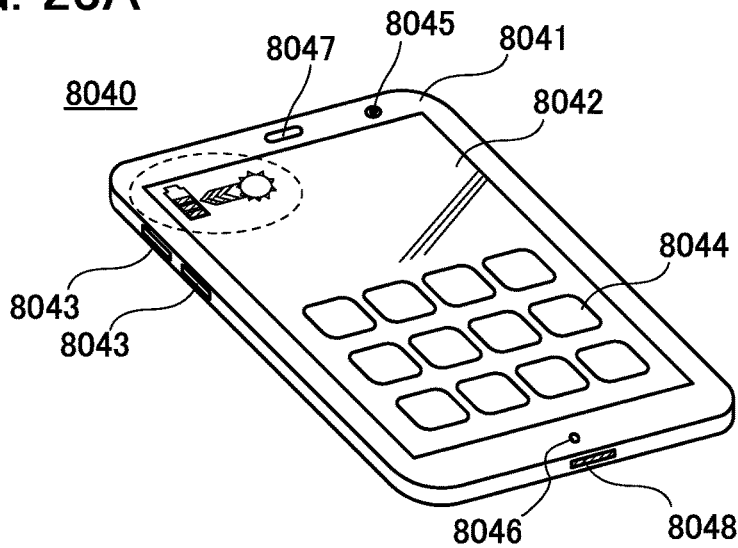
FIGS. 23A to 23C illustrate an example of an electric device.

FIG. 23A is a perspective view illustrating a front surface and a side surface of a portable information terminal 8040. The portable information terminal 8040 is capable of executing a variety of applications such as mobile phone calls, e-mailing, viewing and editing texts, music reproduction, Internet communication, and a computer game. In the portable information terminal 8040, a housing 8041 includes a display portion 8042, a camera 8045, a microphone 8046, and a speaker 8047 on its front surface, a button 8043 for operation on its left side, and a connection terminal 8048 on its bottom surface.

A display module or a display panel is used for the display portion 8042. Examples of the display module or the display panel are a light-emitting device in which each pixel includes a light-emitting element typified by an organic light-emitting element (OLED); a liquid crystal display device; an electronic paper performing a display in an electrophoretic mode, an electronic liquid powder mode, or the like; a digital micromirror device (DMD); a plasma display panel (PDP); a field emission display (FED); a surface conduction electron-emitter display (SED); a light-emitting diode (LED) display; a carbon nanotube display; a nanocrystal display; and a quantum dot display.

The portable information terminal 8040 illustrated in FIG. 23A is an example of providing one display portion 8042 in the housing 8041; however, one embodiment of the present invention is not limited to this example. The display portion 8042 may be provided on a rear surface of the portable information terminal 8040. Further, the portable information terminal 8040 may be a foldable portable information terminal in which two or more display portions are provided.

A touch panel with which data can be input by an instruction means such as a finger or a stylus is provided as an input means on the display portion 8042. Thus, icons 8044 displayed on the display portion 8042 can be easily operated by the instruction means. Since the touch panel is provided, a region for a keyboard on the portable information terminal 8040 is not needed and thus the display portion can be provided in a large region. Further, since data can be input with a finger or a stylus, a user-friendly interface can be obtained. Although the touch panel may be any of various types such as a resistive type, a capacitive type, an infrared ray type, an electromagnetic induction type, and a surface acoustic wave type, the resistive type or the capacitive type is particularly preferable because the display portion 8042 of one embodiment of the present invention is curved. Furthermore, such a touch panel may be what is called an in-cell touch panel, in which a touch panel is integrated with the display module or the display panel.

The touch panel may also function as an image sensor. In this case, for example, an image of a palm print, a fingerprint, or the like is taken with the display portion 8042 touched with the palm or the finger, whereby personal authentication can be performed. Furthermore, with the use of backlight or a sensing light source emitting near-infrared light for the display portion 8042, an image of a finger vein, a palm vein, or the like can also be taken.

Further, instead of the touch panel, a keyboard may be provided in the display portion 8042. Furthermore, both the touch panel and the keyboard may be provided.

The button 8043 for operation can have various functions in accordance with the intended use. For example, the button 8043 may be used as a home button so that a home screen is displayed on the display portion 8042 by pressing the button 8043. Further, the portable information terminal 8040 may be configured such that main power source thereof is turned off by pressing the button 8043 for a predetermined time. A structure may also be employed in which a press of the button 8043 brings the portable information terminal 8040 which is in a sleep mode out of the sleep mode. Besides, the button can be used as a switch for starting a variety of functions, for example, depending on the length of time for pressing or by pressing the button at the same time as another button.

Further, the button 8043 may be used as a volume control button or a mute button to have a function of adjusting the volume of the speaker 8047 for outputting sound, for example. The speaker 8047 outputs various kinds of sound, examples of which are sound set for predetermined processing such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047 for outputting sound.

As described above, the button 8043 can have various functions. Although the number of the button 8043 is two in the portable information terminal 8040 in FIG. 23A, it is needless to say that the number, arrangement, position, or the like of the buttons is not limited to this example and can be designed as appropriate.

The microphone 8046 can be used for sound input and recording. Images obtained with the use of the camera 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera 8045, a sensor provided in the portable information terminal 8040, or the like. Alternatively, with the use of the microphone 8046, the portable information terminal 8040 can be operated by recognition of user's voice (also referred to as voice input). By introducing a natural user interface (NUI) technique which enables data to be input to an electric device by natural behavior of a human, the operational performance of the portable information terminal 8040 can be further improved.

The connection terminal 8048 is a terminal for inputting a signal at the time of communication with an external device or inputting electric power at the time of power supply. For example, the connection terminal 8048 can be used for connecting an external memory drive to the portable information terminal 8040. Examples of the external memory drive are storage medium drives such as an external hard disk drive (HDD), a flash memory drive, a digital versatile disk (DVD) drive, a DVD-recordable (DVD-R) drive, a DVD-rewritable (DVD-RW) drive, a compact disc (CD) drive, a compact disc recordable (CD-R) drive, a compact disc rewritable (CD-RW) drive, a magneto-optical (MO) disc drive, a floppy disk drive (FDD), and other nonvolatile solid state drive (SSD) devices. Although the portable information terminal 8040 has the touch panel on the display portion 8042, a keyboard may be provided on the housing 8041 instead of the touch panel or may be externally added.

Although the number of the connection terminal 8048 is one in the portable information terminal 8040 in FIG. 23A, it is needless to say that the number, arrangement, position, or the like of the connection terminals is not limited to this example and can be designed as appropriate.

Figure 23B:
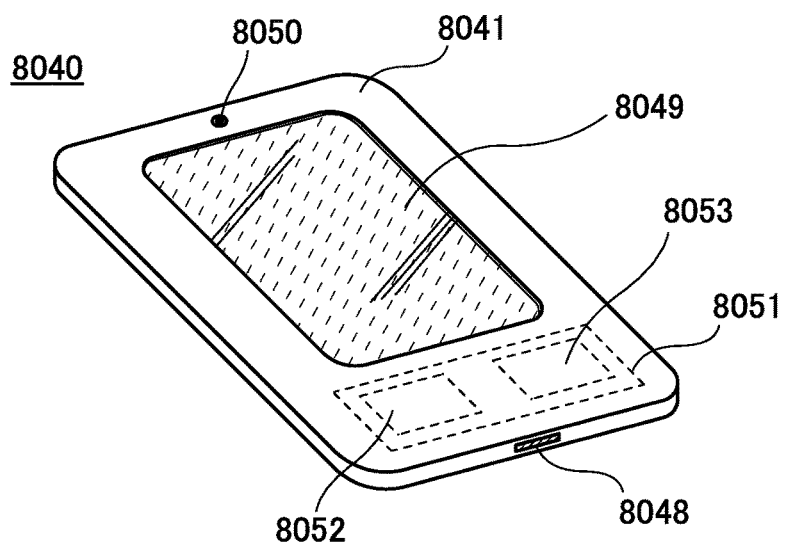

FIG. 23B is a perspective view illustrating the rear surface and the side surface of the portable information terminal 8040. In the portable information terminal 8040, the housing 8041 includes a solar cell 8049 and a camera 8050 on its rear surface; the portable information terminal 8040 further includes a charge and discharge control circuit 8051, a power storage device 8052, a DC-DC converter 8053, and the like. FIG. 23B illustrates an example where the charge and discharge control circuit 8051 includes the power storage device 8052 and the DC-DC converter 8053. The power storage device of one embodiment of the present invention is used as the power storage device 8052.

The solar cell 8049 attached on the rear surface of the portable information terminal 8040 can supply power to the display portion, the touch panel, a video signal processor, and the like. Note that the solar cell 8049 can be provided on one or both surfaces of the housing 8041. By including the solar cell 8049 in the portable information terminal 8040, the power storage device 8052 in the portable information terminal 8040 can be charged even in a place where an electric power supply unit is not provided, such as outdoors.

As the solar cell 8049, it is possible to use any of the followings: a silicon-based solar cell including a single layer or a stacked layer of single crystal silicon, polycrystalline silicon, microcrystalline silicon, or amorphous silicon; an InGaAs-based, GaAs-based, CIS-based, $Cu_2ZnSnS_4$-based, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of a structure and operation of the charge and discharge control circuit 8051 illustrated in FIG. 23B is described with reference to a block diagram in FIG. 23C.

Figure 23C:
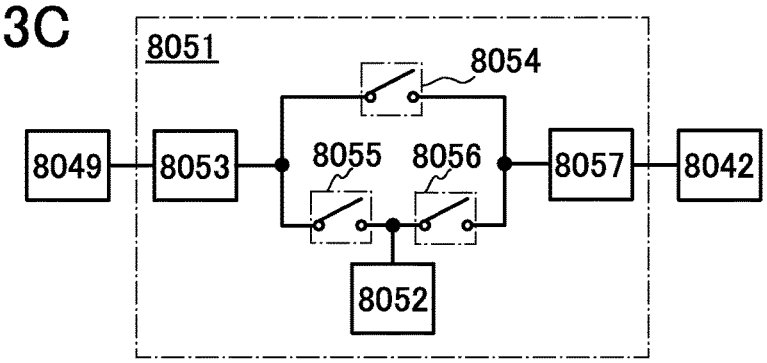

FIG. 23C illustrates the solar cell 8049, the power storage device 8052, the DC-DC converter 8053, a converter 8057, a switch 8054, a switch 8055, a switch 8056, and the display portion 8042. The power storage device 8052, the DC-DC converter 8053, the converter 8057, and the switches 8054 to 8056 correspond to the charge and discharge control circuit 8051 in FIG. 23B.

The voltage of electric power generated by the solar cell 8049 with the use of external light is raised or lowered by the DC-DC converter 8053 to be at a level needed for charging the power storage device 8052. When electric power from the solar cell 8049 is used for the operation of the display portion 8042, the switch 8054 is turned on and the voltage of the electric power is raised or lowered by the converter 8057 to a voltage needed for operating the display portion 8042. In addition, when display on the display portion 8042 is not performed, the switch 8054 is turned off and the switch 8055 is turned on so that the power storage device 8052 may be charged.

Although the solar cell 8049 is described as an example of a power generation means, the power generation means is not particularly limited thereto, and the power storage device 8052 may be charged by another power generation means such as a piezoelectric element or a thermoelectric conversion element (Peltier element). The charging method of the power storage device 8052 in the portable information terminal 8040 is not limited thereto, and the connection terminal 8048 may be connected to a power source to perform charge, for example. The power storage device 8052 may be charged by a non-contact power transmission module performing charge by transmitting and receiving power wirelessly, or any of the above charging methods may be used in combination.

Here, the state of charge (SOC) of the power storage device 8052 is displayed on the upper left corner (in the dashed frame in FIG. 23A) of the display portion 8042. Thus, the user can check the state of charge of the power storage device 8052 and can accordingly select a power saving mode of the portable information terminal 8040. When the user selects the power saving mode, for example, the button 8043 or the icons 8044 can be operated to switch the mode of the components of the portable information terminal 8040, e.g., the display module or the display panel, an arithmetic unit such as CPU, and a memory, to the power saving mode. Specifically, in each of the components, the use frequency of a given function is decreased to stop the use. Further, the portable information terminal 8040 can be configured to be automatically switched to the power saving mode depending on the state of charge. Furthermore, by providing a sensor such as an optical sensor in the portable information terminal 8040, the amount of external light at the time of using the portable information terminal 8040 is sensed to optimize display luminance, which makes it possible to regulate the power consumption of the power storage device 8052.

In addition, when charging with use of the solar cell 8049 or the like is performed, an image or the like showing that the charging is performed with the solar cell may be displayed on the upper left corner (in the dashed frame) of the display portion 8042 as illustrated in FIG. 23A.

It is needless to say that one embodiment of the present invention is not limited to the electric device illustrated in FIGS. 23A to 23C as long as the power storage device of one embodiment of the present invention is included.

[7-6. Structure Example of Electric Device (Power Storage System)]

A power storage system will be described as an example of an electric device with reference to FIGS. 24A and 24B. A power storage system 8100 to be described here can be used at home as the power storage system 8005 described above. Here, the power storage system 8100 is described as a home-use power storage system as an example; however, it is not limited thereto and can also be used for business use or other uses.

Figure 24A:
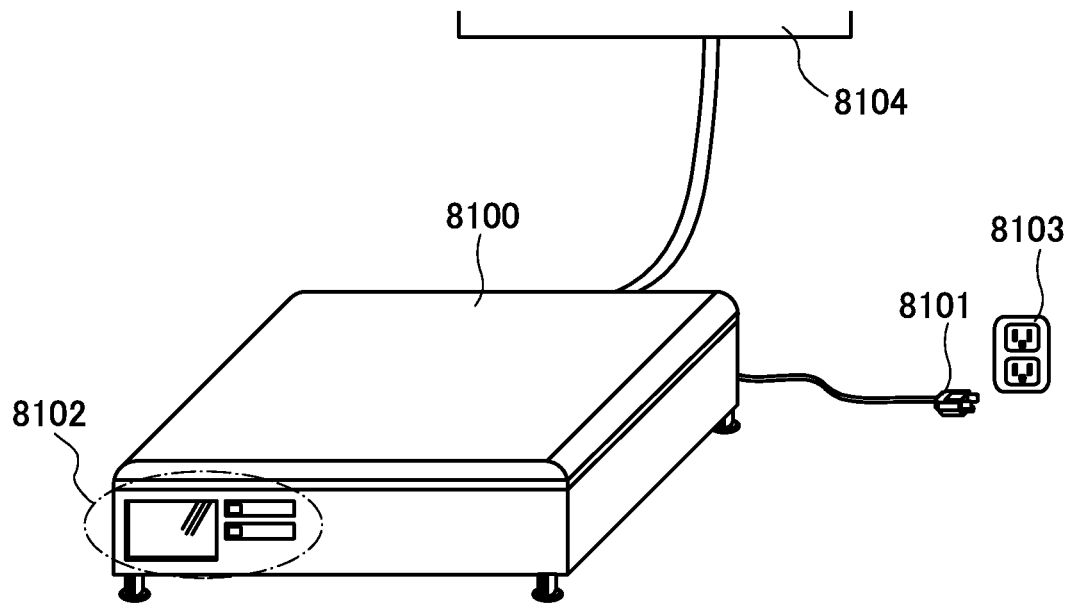
FIGS. 24A and 24B illustrate an example of an electric device.

As illustrated in FIG. 24A, the power storage system 8100 includes a plug 8101 for being electrically connected to a system power supply 8103. Further, the power storage system 8100 is electrically connected to a panelboard 8104 installed in home.

The power storage system 8100 may further include a display panel 8102 for displaying an operation state or the like, for example. The display panel may have a touch screen. In addition, the power storage system 8100 may include a switch for turning on and off a main power source, a switch that operates the power storage system, and the like as well as the display panel.

Although not illustrated, an operation switch that operates the power storage system 8100 may be provided separately from the power storage system 8100; for example, the operation switch may be provided on a wall in a room. Alternatively, the power storage system 8100 may be connected to a personal computer, a server, or the like provided in home, in order to be operated indirectly. Still alternatively, the power storage system 8100 may be remotely operated using the Internet, an information terminal such as a smartphone, or the like. In such cases, a mechanism that performs wired or wireless communication between the power storage system 8100 and other devices is provided in the power storage system 8100.

Figure 24B:
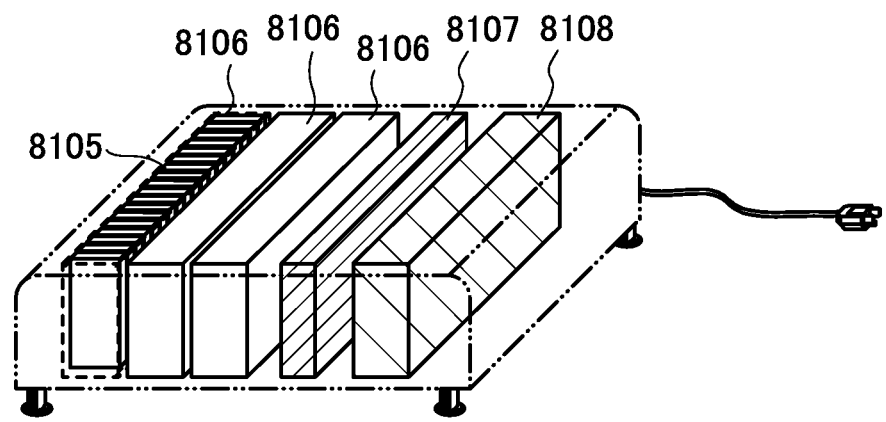

FIG. 24B is a schematic view illustrating the inside of the power storage system 8100. The power storage system 8100 includes a plurality of power storage device groups 8106, a battery management unit (BMU) 8107, and a power conditioning system (PCS) 8108.

In the power storage device group 8106, the plurality of power storage devices 8105 described above are connected to each other. Power from the system power supply 8103 can be stored in the power storage device group 8106. The plurality of power storage device groups 8106 are each electrically connected to the BMU 8107.

The BMU 8107 has functions of monitoring and controlling states of the plurality of power storage devices 8105 in the power storage device group 8106 and protecting the power storage devices 8105. Specifically, the BMU 8107 collects data of cell voltages and cell temperatures of the plurality of power storage devices 8105 in the power storage device group 8106, monitors overcharge and overdischarge, monitors overcurrent, controls a cell balancer, manages the deterioration condition of a battery, calculates the remaining battery level (the state of charge (SOC)), controls a cooling fan of a driving power storage device, or controls detection of failure, for example. Note that the power storage devices 8105 may have some of or all the functions, or the power storage device groups may have the functions. The BMU 8107 is electrically connected to the PCS 8108.

Here, as an electronic circuit included in the BMU 8107, an electronic circuit including the oxide semiconductor transistor described above is preferably provided. In this case, power consumption of the BMU 8107 can be significantly reduced.

The PCS 8108 is electrically connected to the system power supply 8103 which is an AC power source and performs DC-AC conversion. For example, the PCS 8108 includes an inverter, a system interconnection protective device that detects irregularity of the system power supply 8103 and terminates its operation, and the like. In storing power in the power storage system 8100, for example, AC power from the system power supply 8103 is converted into DC power and transmitted to the BMU 8107. In deriving power from the power storage system 8100, power stored in the power storage device group 8106 is converted into AC power and supplied to an indoor load, for example. Note that the power may be supplied from the power storage system 8100 to the load through the panelboard 8104 as illustrated in FIG. 24A or may be directly supplied from the power storage system 8100 through wired or wireless transmission.

Note that a power source for charging the power storage system 8100 is not limited to the system power supply 8103 described above; for example, power may be supplied from a solar power generating system installed outside or a power storage system mounted on an electric vehicle.

EXPLANATION OF REFERENCE

100: power storage device, 101: secondary battery, 102: terminal, 103: terminal, 104: sensor, 105: MCU, 106: memory, 107: communication unit, 160: stacked oxide film, 161: oxide layer, 162: oxide layer, 163: oxide layer, 164: oxide layer, 201: current curve, 202: voltage curve, 211: charge mode, 212: constant-current charge mode, 213: constant-current charge mode, 214: additional charge mode, 221: discharge mode, 222: rapid discharge mode, 231: standby mode, 233: nonvolatile memory unit, 240: transistor, 241: capacitor, 242: transistor, 243: transistor, 244: transistor, 245: selector, 246: inverter, 247: capacitor, 248: flip-flop, 400: substrate, 401: gate electrode, 402: gate insulating film, 403: n-type region, 404: oxide film, 406: insulating film, 408: insulating film, 409: gate insulating film, 410: gate electrode, 421: transistor, 422: transistor, 423: transistor, 701: unit, 702: unit, 703: unit, 704: unit, 705: circuit, 710: CPU, 711: bus bridge, 712: memory, 713: memory interface, 715: clock generation circuit, 720: controller, 721: interrupt controller, 722: I/O interface, 730: power gate unit, 731: switch circuit, 732: switch circuit, 740: clock generation circuit, 741: crystal oscillation circuit, 742: oscillation unit, 743: quartz crystal unit, 745: timer circuit, 746: I/O interface, 750: I/O port, 751: comparator, 752: I/O interface, 761: bus line, 762: bus line, 763: bus line, 764: data bus line, 770: connection terminal, 771: connection terminal, 772: connection terminal, 773: connection terminal, 774: connection terminal, 775: connection terminal, 776: connection terminal, 780: register, 783: register, 784: register, 785: register, 786: register, 787: register, 950: secondary battery, 951: positive electrode can, 952: negative electrode can, 953: gasket, 954: positive electrode, 955: positive electrode current collector, 956: positive electrode active material layer, 957: negative electrode, 958: negative electrode current collector, 959: negative electrode active material layer, 960: separator, 970: secondary battery, 971: positive electrode current collector, 972: positive electrode active material layer, 973: positive electrode, 974: negative electrode current collector, 975: negative electrode active material layer, 976: negative electrode, 977: separator, 978: exterior body, 980: secondary battery, 981: positive electrode cap, 982: battery can, 983: positive electrode terminal, 984: positive electrode, 985: separator, 986: negative electrode, 987: negative electrode terminal, 988: insulating plate, 989: insulating plate, 991: PTC element, 992: safety valve mechanism, 993: wound body, 994: negative electrode, 995: positive electrode, 996: separator, 997: terminal, 998: terminal, 1050: memory cell, 1051: bit line, 1052: word line, 1053: capacitor line, 1054: sense amplifier, 1055: transistor, 1056: capacitor, 1071: transistor, 1072: transistor, 1073: capacitor, 1074: source line, 1075: source line, 1076: word line, 1077: drain line, 1078: capacitor line, 1079: node, 1080: substrate, 1081: well, 1082: impurity region, 1083: insulating film, 1084: electrode, 1085: STI region, 1087: electrode, 1088: interlayer insulating film, 1089: interlayer insulating film, 1090: interlayer insulating film, 1091: interlayer insulating film, 1092: interlayer insulating film, 1093: barrier film, 1094: wiring, 1095: barrier film, 1096: interlayer insulating film, 1097: barrier film, 1098: wiring, 1099: barrier film, 1100: interlayer insulating film, 1101: base insulating film, 1102: insulating film, 1104: interlayer insulating film, 1105: interlayer insulating film, 1106: barrier film, 1108: interlayer insulating film, 1109: interlayer insulating film, 1110: barrier film, 1111: impurity region, 1112: impurity region, 1113: gate insulating film, 1114: gate insulating film, 1115: sidewall insulating film, 1116: gate electrode, 1117: insulating film, 1118: gate electrode, 1119: sidewall insulating film, 1171: transistor, 1172: transistor, 1173: oxide film, 1174: conductive layer, 1175: conductive layer, 1176: insulating film, 1177: conductive layer, 1178: capacitor, 1196: register, 3004: logic circuit, 6000: positive electrode, 6001: positive electrode current collector, 6002: positive electrode active material layer, 6003: positive electrode active material, 6004: graphene, 6005: binder, 6100: negative electrode, 6101: negative electrode current collector, 6102: negative electrode active material layer, 6103: negative electrode active material, 6104: film, 6105: binder, 6600: power storage device, 6601: wound body, 6602: terminal, 6603: terminal, 6604: battery can, 6605: terminal, 6606: circuit board, 6607: electric circuit, 6608: label, 6609: antenna, 6610: antenna, 6611: layer, 8000: house, 8001: electric power system, 8002: service wire, 8003: panelboard, 8004: control device, 8005: power storage system, 8006: solar power generation system, 8007: display device, 8008: lighting device, 8009: air-conditioning system, 8010: electric refrigerator, 8011: Internet, 8012: electric vehicle, 8013: management server, 8020: electric vehicle, 8021: charging apparatus, 8022: cable, 8023: front wheel, 8024: power storage device, 8025: electronic control unit, 8026: inverter unit, 8027: drive motor unit, 8028: output shaft, 8029: drive shaft, 8031: connecting plug, 8040: portable information terminal, 8041: housing, 8042: display portion, 8043: button, 8044: icon, 8045: camera, 8046: microphone, 8047: speaker, 8048: connection terminal, 8049: solar cell, 8050: camera, 8051: charge and discharge control circuit, 8052: power storage device, 8053: DC-DC converter, 8054: switch, 8055: switch, 8056: switch, 8057: converter, 8100: power storage system, 8101: plug, 8102: display panel, 8103: system power supply, 8104: panelboard, 8105: power storage device, 8106: power storage device group, 8107: BMU, 8108: PCS, 104*a*: temperature sensor, 104*b*: coulomb counter, 104*c*: voltmeter, 104*d*: ammeter, 106*a*: memory region, 106*b*: memory region, 106*c*: memory region, 1086*a*: contact plug, 1086*b*: contact plug, 1103*a*: contact plug, 1103*b*: contact plug, 1103*c*: contact plug, 1107*a*: wiring, 1107*b*: wiring, 3400*a*: memory cell array, 3400*n*: memory cell array, 405*a*: source electrode, and 405*b*: drain electrode.

This application is based on Japanese Patent Application serial no. 2012-288513 filed with Japan Patent Office on Dec. 28, 2012, the entire contents of which are hereby incorporated by reference.

The invention claimed is:

1. A power storage system comprising:
a secondary battery;
a sensors;
a micro controller unit; and
a memory,
wherein the memory comprises a first memory region and a second memory region,
wherein the secondary battery is configured to operate in a first operation mode and a second operation mode,
wherein the sensors are configured to obtain information of the secondary battery,
wherein the micro controller unit is configured to determine whether the secondary battery is in the first operation mode or the second operation mode in accordance with the information, and in the case where the secondary battery is in the first operation mode, the micro controller unit stores the information in the first memory region, and in the case where the secondary battery is in the second operation mode, the micro controller unit stores the information in the second memory region,
wherein the first operation mode is a charge mode including a constant-current charge mode and a constant-voltage charge mode,
wherein the second operation mode is a discharge mode including a rapid discharge mode,
wherein a remaining battery power, a voltage, a current, and a temperature at a start time of each the constant-current charge mode, the constant-voltage charge mode, and the rapid discharge mode and an ending time of the corresponding mode are stored in the first memory region,
wherein a time period from the start to end of each the constant-current charge mode, the constant-voltage charge mode, and the rapid discharge mode is stored in the first memory region, and
wherein maximum value of current flowing during the rapid discharge mode is stored in the second memory region.

2. The power storage system according to claim 1, wherein the micro controller unit includes an oxide semiconductor.

3. The power storage system according to claim 1, wherein the sensors are a temperature sensor, a voltmeter, an ammeter, or a coulomb counter.

4. The power storage system according to claim 1, further comprising a communication unit connected to the micro controller unit.

5. A power storage system comprising:
a secondary battery;
sensors;
a micro controller unit; and
a memory including a transistor,
wherein the memory comprises a first memory region and a second memory region,
wherein the secondary battery is configured to operate in a first operation mode and a second operation mode,
wherein the sensors are configured to obtain information of the secondary battery,
wherein the micro controller unit is configured to determine whether the secondary battery is in the first operation mode or the second operation mode in accordance with the information, and in the case where the secondary battery is in the first operation mode, the micro controller unit stores the information in the first memory region, and in the case where the secondary battery is in the second operation mode, the micro controller unit stores the information in the second memory region, and
wherein the transistor comprises an oxide semiconductor film including a channel formation region,
wherein the first operation mode is a charge mode including a constant-current charge mode and a constant-voltage charge mode,
wherein the second operation mode is a discharge mode including a rapid discharge mode,
wherein a remaining battery power, a voltage, a current, and a temperature at a start time of each the constant-current charge mode, the constant-voltage charge mode, and the rapid discharge mode and an ending time of the corresponding mode are stored in the first memory region,
wherein a time period from the start to end of each the constant-current charge mode, the constant-voltage charge mode, and the rapid discharge mode is stored in the first memory region, and
wherein maximum value of current flowing during the rapid discharge mode is stored in the second memory region.

6. The power storage system according to claim 5, wherein the micro controller unit includes an oxide semiconductor.

7. The power storage system according to claim 5, wherein the sensors are a temperature sensor, a voltmeter, an ammeter, and a coulomb counter.

8. The power storage system according to claim 5, further comprising a communication unit connected to the micro controller unit.

* * * * *

UNITED STATES PATENT AND TRADEMARK OFFICE
CERTIFICATE OF CORRECTION

PATENT NO. : 9,614,258 B2
APPLICATION NO. : 14/107347
DATED : April 4, 2017
INVENTOR(S) : Minoru Takahashi et al.

It is certified that error appears in the above-identified patent and that said Letters Patent is hereby corrected as shown below:

In the Specification

Column 9, Line 17, "100 us or less" should read --100 µs or less--

Column 29, Lines 52, "peak of 20" should read --peak of 2θ--

Column 29, Lines 54, "peak of 20 at around 31°." should read --peak of 2θ at around 31°.--

Column 29, Lines 54, "peak of 20 at around 36°'" should read --peak of 2θ at around 36°--

Column 29, Line 57, "peak of 20 appear" should read --peak of 2θ at appear--

Column 29, Lines 57-58, "peak of 20 do not appear" should read --peak of 2θ do not appear--

Column 32, Line 1, "or HO and has" should read --or Hf) and has--

Column 32, Line 10, "or HO," should read --or Hf),--

Column 32, Line 42, "Min the above" should read --M in the above--

Column 46, Line 55, "Li$_{(2-f)}$MSiO$_4$" should read --Li$_{(2-j)}$MSiO$_4$--

Column 46, Line 62, "0<l<1)," should read --0<l<1),--

Column 59, Line 7, "system (ITEMS)" should read --system (HEMS)--

Signed and Sealed this
Eighth Day of August, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,614,258 B2

In the Claims

Column 69, Line 8, Claim 1, "a sensors;" should read --sensors;--